US012213324B2

United States Patent
Takashima

(10) Patent No.: US 12,213,324 B2
(45) Date of Patent: Jan. 28, 2025

(54) NONVOLATILE SEMICONDUCTOR MEMORY DEVICE WITH A PLURALITY OF MEMORY CELLS ARRANGED IN A THREE-DIMENSIONAL DIRECTION

(71) Applicant: Kioxia Corporation, Tokyo (JP)

(72) Inventor: Daisaburo Takashima, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 412 days.

(21) Appl. No.: 17/690,387

(22) Filed: Mar. 9, 2022

(65) Prior Publication Data

US 2022/0399400 A1 Dec. 15, 2022

(30) Foreign Application Priority Data

Jun. 10, 2021 (JP) ................................ 2021-097506

(51) Int. Cl.
*G11C 13/00* (2006.01)
*H10B 61/00* (2023.01)
*H10B 63/00* (2023.01)

(52) U.S. Cl.
CPC ............ *H10B 63/34* (2023.02); *H10B 61/22* (2023.02); *H10B 63/845* (2023.02); *G11C 2213/71* (2013.01)

(58) Field of Classification Search
CPC .. H10B 63/34; H10B 63/845; G11C 13/0004; G11C 13/004; G11C 2213/71
See application file for complete search history.

(56) References Cited

U.S. PATENT DOCUMENTS

| 5,894,447 | A | 4/1999 | Takashima |
| 9,601,370 | B2 * | 3/2017 | Kato ................. H01L 21/76816 |
| 10,573,397 | B1 * | 2/2020 | Sehgal ................ G11C 11/5628 |
| 2010/0038703 | A1 * | 2/2010 | Fukuzumi ................ G11C 8/14 257/326 |

(Continued)

FOREIGN PATENT DOCUMENTS

TW 201635295 A * 10/2016 ......... G11C 13/0002

OTHER PUBLICATIONS

Lue, et al., "3D AND: a 3D Stackable Flash Memory Architecture to Realize High-Density and Fast-Read 3D NOR Flash and Storage-Class Memory", 2020 IEEE International Electron Devices Meeting (IEDM), Conference Paper, pp. 115-118, Dec. 2020.

(Continued)

Primary Examiner — Ida M Soward
(74) Attorney, Agent, or Firm — Holtz, Holtz & Volek PC

(57) ABSTRACT

In a nonvolatile semiconductor memory device, in a cell block, a local bit line is connected to a bit line via a select transistor. The local bit line extends in a third direction. A local source line is connected to a source line and extends in the third direction. A plurality of memory cells are connected in parallel between the local source line and the local bit line. Each of the memory cells includes a cell transistor and a resistance change element. The cell transistor has a gate connected to a corresponding one of the word lines and one end connected to one of the local bit line or the local source line. The resistance change element is connected between the other end of the cell transistor and the other one of the local bit line or the local source line.

20 Claims, 51 Drawing Sheets

(56) References Cited

U.S. PATENT DOCUMENTS

| | | | | |
|---|---|---|---|---|
| 2014/0097484 | A1* | 4/2014 | Seol ..................... | H10B 43/10 |
| | | | | 257/324 |
| 2014/0217518 | A1* | 8/2014 | Shih ..................... | H10B 43/50 |
| | | | | 438/618 |
| 2014/0246646 | A1* | 9/2014 | Sasago .................. | H10B 63/20 |
| | | | | 438/238 |
| 2017/0077120 | A1* | 3/2017 | Sawabe ............. | H01L 21/76805 |
| 2019/0057898 | A1* | 2/2019 | Shim ..................... | H10B 43/35 |
| 2019/0067311 | A1* | 2/2019 | Yoshimizu ............. | H10B 41/30 |
| 2019/0333928 | A1* | 10/2019 | Nagashima ............. | G11C 11/40 |
| 2020/0098784 | A1* | 3/2020 | Nagashima ....... | H01L 21/76877 |
| 2020/0098827 | A1* | 3/2020 | Murooka ............. | H10B 63/845 |
| 2020/0403035 | A1 | 12/2020 | Ogiwara et al. | |
| 2021/0057028 | A1* | 2/2021 | Hosomura ............... | G11C 8/14 |
| 2021/0217473 | A1* | 7/2021 | Cho ........................ | G06N 3/04 |
| 2021/0399049 | A1 | 12/2021 | Izuka et al. | |
| 2022/0028452 | A1 | 1/2022 | Ogiwara et al. | |

OTHER PUBLICATIONS

Nitayama, et al., "Bit Cost Scalable (BiCS) Technology for Future Ultra High Density Storage Memories", pp. 60-61, Symposium on VLSI Technology Digest of Technical Papers, 2013.
Tanaka, et al., "Bit Cost Scalable Technology with Punch and Plug Process for Ultra High Density Flash Memory,", pp. 14-15, IEEE VLSI Technology, 2007.
U.S. Appl. No. 17/495,103, First Named Inventor: Ryu Ogiwara; Title: "Memory Device"; Filed: Oct. 6, 2021.
U.S. Appl. No. 17/495,747, First Named Inventor: Ryu Ogiwara; Title: "Memory Device"; Filed: Oct. 6, 2021.

* cited by examiner

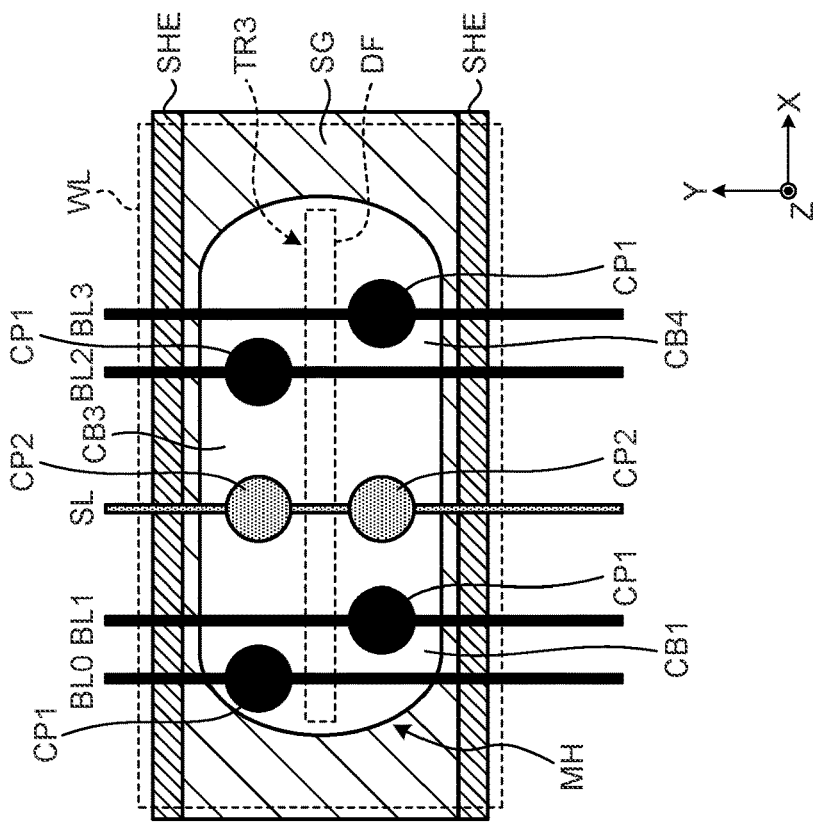
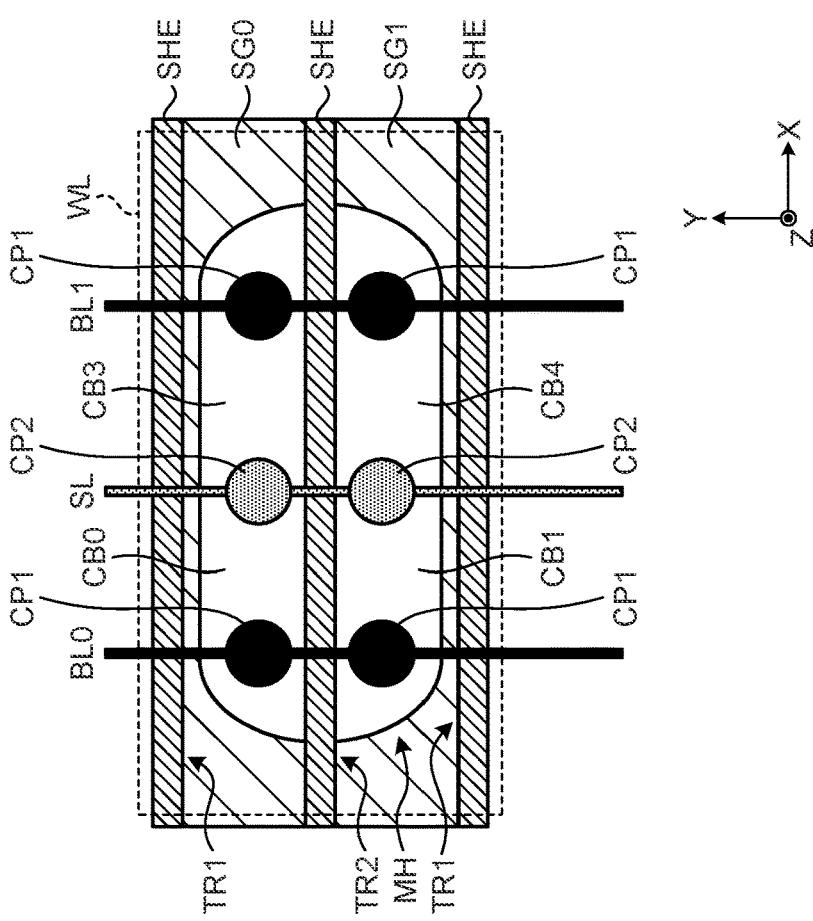
FIG.35A
FIG.35B

NONVOLATILE SEMICONDUCTOR MEMORY DEVICE WITH A PLURALITY OF MEMORY CELLS ARRANGED IN A THREE-DIMENSIONAL DIRECTION

CROSS-REFERENCE TO RELATED APPLICATIONS

This application is based upon and claims the benefit of priority from Japanese Patent Application No. 2021-097506, filed on Jun. 10, 2021; the entire contents of which are incorporated herein by reference.

FIELD

Embodiments described herein relate generally to a nonvolatile semiconductor memory device.

BACKGROUND

In a nonvolatile semiconductor memory device having a memory cell including a resistance change element, the resistance change element is brought into a high resistance state or a low resistance state by passing a current through the resistance change element. At this time, it is desirable to optimize the current flowing through the resistance change element.

BRIEF DESCRIPTION OF THE DRAWINGS

FIGS. 35A and 35B are plan views illustrating a configuration of the cell block in the 12th embodiment;

DETAILED DESCRIPTION

Figure 1:
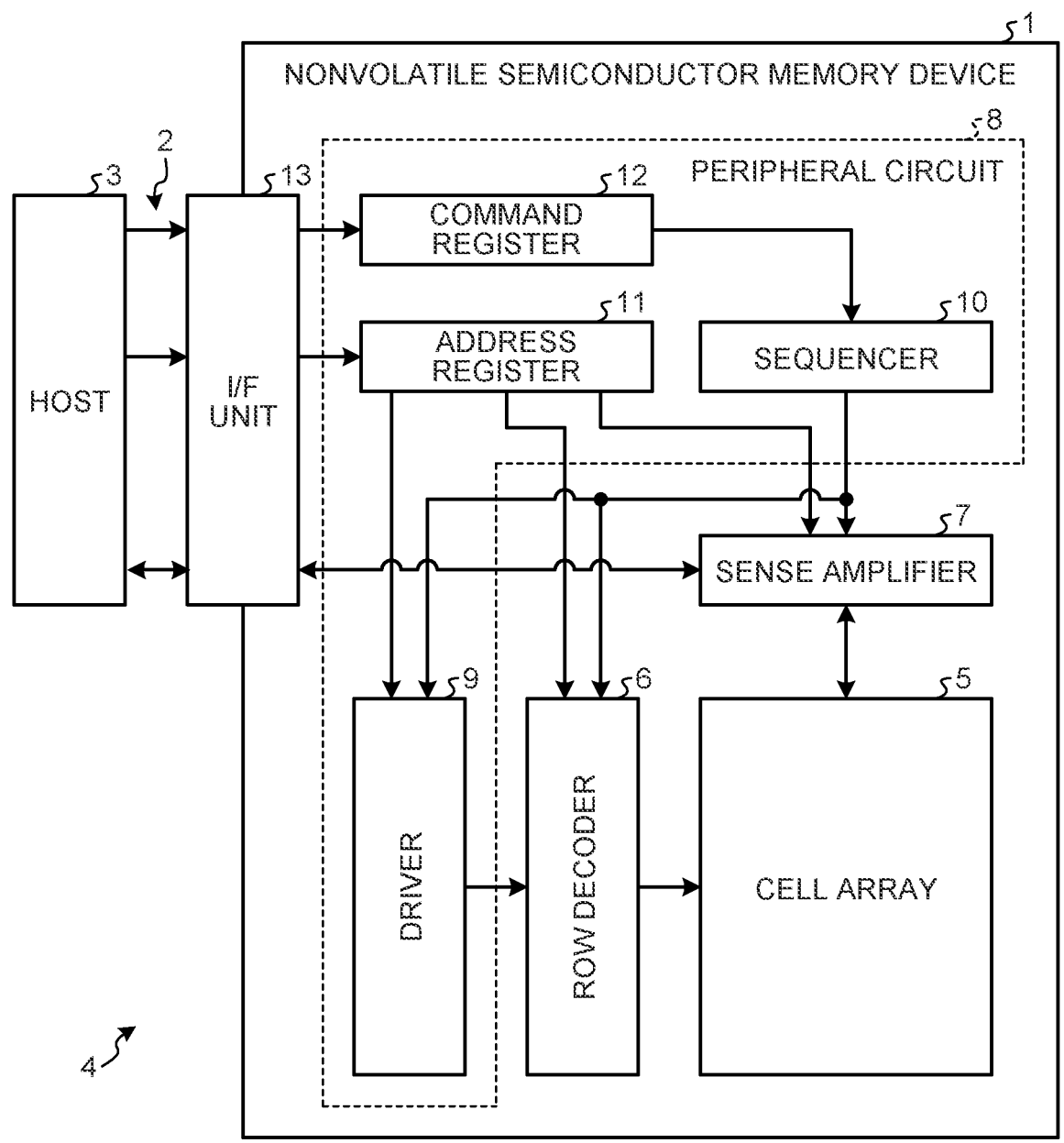
FIG. 1 is a diagram illustrating a schematic configuration of a nonvolatile semiconductor memory device according to a first embodiment.

In general, according to one embodiment, there is provided a nonvolatile semiconductor memory device including a plurality of word lines, a bit line, a source line and a cell array. Each word line extends in a first direction and a second direction. The word lines are stacked in a third direction. The first to third directions crossing one another. The bit line extends in the first direction. The source line extends in the first direction. The cell array includes a plurality of cell blocks arranged in the first direction. Each cell block is connected to the bit line and the source line. The cell block includes a select transistor, a local bit line, a local source line and a plurality of memory cells. The local bit line is connected to the bit line via the select transistor. The local bit line extends in the third direction. The local source line is connected to the source line and extends in the third direction. The plurality of memory cells are connected in parallel between the local source line and the local bit line. Each of the memory cells includes a cell transistor and a resistance change element. The cell transistor has a gate connected to a corresponding one of the word lines and one end connected to one of the local bit line or the local source line. The resistance change element is connected between the other end of the cell transistor and the other one of the local bit line or the local source line.

Exemplary embodiments of a nonvolatile semiconductor memory device will be explained below in detail with reference to the accompanying drawings. The present invention is not limited to the following embodiments.

First Embodiment

A nonvolatile semiconductor memory device according to a first embodiment will be described. The nonvolatile semiconductor memory device is, for example, a nonvolatile semiconductor memory in which a plurality of memory cells is arranged in a three-dimensional direction.

The semiconductor memories are used in various places from a main memory of a large computer to a personal computer, a home appliance, a mobile terminal, and the like. As a type of the semiconductor memory, a volatile dynamic random access memory (DRAM), a staticRAM (SRAM), a nonvolatile mask read only memory (MROM), a flash electrically erasable programmable ROM (EEPROM) such as a NAND type flash memory and a NOR type flash memory, and the like are on the market. Although the DRAM is a volatile memory, the DRAM is excellent in terms of low cost property (cell area is less than ¼ compared to the SRAM) and high speed property (faster than the flash EEPROM), and has a large market in the personal computer market and the mobile terminal market.

On the other hand, the market for nonvolatile flash EEPROMs that are rewritable and can be turned off is becoming very large in mobile terminals, various memory cards, solid state drives (SSDs), and the like. In the three-dimensional flash memory, after control gates (word lines) are stacked, memory holes MH are collectively formed to embed a film material or the like to be a memory cell, in a manner that cost can be reduced, and the three-dimensional flash memory has become the mainstream of the current market. However, the number of rewrites (W/E number) is only about 10 raised to the power of 4 to 3, the writing time is required to be about microseconds and milliseconds, and a high voltage of 12 V to 22 V is required, and there is room for improvement in terms of miniaturization and performance.

On the other hand, ferroelectric RAM (FeRAM), magnetoresistive RAM (MRAM), phase change memory (PCM), resistive RAM (ReRAM), and the like are actively developed as new memories. Among them, the MRAM, the PCM, and the ReRAM are resistance change type memories that change the resistance of the information storage element of the memory cell and store the resistance state as information. The phase change memory (PCM) and the resistance change memory (ReRAM) are likely to be alternatives to the NOR type flash and the NAND type flash because the resistance value changes from two digits to five digits, multi-value conversion is possible, the write current and the read current can be reduced by reducing the storage element size, and high integration is achieved. In addition, in the magnetoresistive memory (MRAM), the resistance change rate is smaller (for example, about 200%) than that of the phase change memory (PCM) and the resistance change memory (ReRAM), but if the problem of the diamagnetic field is solved, there is a possibility that the magnetoresistive memory can be an alternative to the NOR type flash and the NAND type flash.

Resistance change type memories such as PCM, ReRAM, and MRAM are three-dimensionally stacked, and have a potential capable of reducing the cost more than the NAND type flash. However, a method of three-dimensionally stacking these is a method of disposing memory cells between intersections of orthogonal word lines and bit lines, and during writing, a current is applied between terminals (voltage is applied), and resistance of a storage element is increased (reset operation) and decreased (set operation) to store information. Since there is half-select in which half voltage is applied other than the select cell, there are many cases where a self-rectifying function is provided in the storage element, or a rectifier and a bidirectional rectifier are connected in series to the storage element. However, since the word lines and the bit lines are stacked one by one, there is a possibility that the cost is high even if the word lines and the bit lines are made three-dimensional.

That is, although the three-dimensional flash memory is low in cost due to collective hole machining, the three-dimensional flash memory may be poor in writing/reading performance and the number of times of fatigue. On the other hand, in a resistance change type memory having high performance, for example, a phase change memory, the word line and the bit line are alternately formed, in a manner that the manufacturing cost tends to be high.

In order to solve this problem, the following configurations (1) to (11) can be adopted in the nonvolatile semiconductor memory device.

(1) The nonvolatile semiconductor memory device includes a cell array. The cell array includes an arrangement of a plurality of cell blocks. One end of each of the plurality of cell blocks is connected to a bit line. The cell block includes a plurality of memory cells and a select transistor. The plurality of memory cells is connected in parallel between the local source line and the local bit line corresponding to the plurality of word lines. The select transistor is connected between the local bit line and the bit line. The memory cell includes a cell transistor and a resistance change element. A gate of the cell transistor is connected to a word line. The resistance change element is connected in series to the cell transistor between the local source line and the local bit line. The plurality of word lines includes a plurality of conductive films. The plurality of conductive films is stacked apart from each other. The cell block includes a columnar structure. The columnar structure penetrates the plurality of conductive films in the stacking direction.

(2) In the nonvolatile semiconductor memory device of (1), the columnar structure includes a gate insulating film, a semiconductor film, a local bit line column, a local source line column, and a resistance change film. The gate insulating film extends in the stacking direction and penetrates the plurality of conductive films. The semiconductor film extends in the stacking direction on inner side of the gate insulating film and penetrates the plurality of conductive films. The local bit line column extends in the stacking direction on inner side of the semiconductor film, penetrates the plurality of conductive films, and functions as a local bit line. The local source line column extends in the stacking direction on inner side of the semiconductor film, penetrates the plurality of conductive films, and functions as a local source line. The resistance change film penetrates the plurality of conductive films on inner side of the semiconductor film and on outer side of the local bit line column or the local source line column, and functions as a resistance change element.

(3) In the nonvolatile semiconductor memory device of (2), the columnar structure includes a plurality of local bit line columns.

(4) In the nonvolatile semiconductor memory device of (2), the columnar structure includes a plurality of local bit line columns and a plurality of local source line columns.

(5) In the nonvolatile semiconductor memory device of (1), the cell block further includes a second select transistor. The second select transistor is connected between the local source line and the source line.

(6) In the nonvolatile semiconductor memory device of (1), one end of the resistance change element is connected to the local bit line, and the other end is connected to the drain of the cell transistor.

(7) In the nonvolatile semiconductor memory device of (6), the memory cell further includes a second resistance change element. One end of the second resistance change element is connected to the source of the cell transistor, and the other end is connected to the local source line.

(8) In the nonvolatile semiconductor memory device of (2), the columnar structure includes a plurality of resistance change films. The plurality of resistance change films is separated from each other in the stacking direction corresponding to the plurality of word lines. The plurality of resistance change films functions as resistance change elements of the plurality of memory cells.

(9) In the nonvolatile semiconductor memory device of (2), the resistance change film is formed of a phase change material, a superlattice film material, a magnetic material, or a resistance change material. The phase change material includes a chalcogenide-based material. The superlattice film material includes a stacked structure of GeTe or SbTe. The magnetic material includes MgO sandwiched between a free layer and a PIN layer. The resistance change material includes at least one selected from the group consisting of $NiO_x$, $WO_x$, $TaO_x$, $TiO_x$, $HfO_x$, $ZnO_x$, TiON, Ag—GeSe, Cu—GeSe, $FeO_x$, $GeO_x$, and STO.

(10) In the nonvolatile semiconductor memory device of (2), the columnar structure includes further includes a thermal barrier film. The thermal barrier film penetrates the plurality of conductive films on inner side of the semiconductor film and on outer side of the local bit line column.

(11) In the nonvolatile semiconductor memory device of (10), the thermal barrier film includes at least one selected from the group consisting of TiN, TaN, TiOx, C, and CN.

According to the nonvolatile semiconductor memory device capable of adopting the configurations (1) to (11), the following effects (A) to (I) can be realized.

(A) First, a memory cell is configured by series connection of a cell transistor connected to a word line and a two-terminal resistance change storage element, and a plurality of memory cells is connected in parallel, one of the memory cells is connected to a common local bit line and the other of the memory cells is connected to a common local source line, and the local bit line is connected to a bit line via a cell block select transistor, in a manner that a resistance change type nonvolatile memory including a cell block as a whole is obtained. As a result, by turning on the cell block select transistor to select a cell block and turning on the cell transistor connected to the selected word line in the select cell block, voltage application and current application to the selected resistance change element can be selectively performed, and random reading and random writing can be performed. Furthermore, the number of series and transistors between the bit line and the source line can be reduced to only two, and even if the ON resistance of the transistor is high, a current capable of performing the set/reset operation can flow through the resistance change element. Furthermore, since a plurality of word lines is stacked on a semiconductor substrate to form a cell block, a memory hole MH is formed by opening a plurality of stacked sacrificial layers once to several times, and the cell block is embedded in each memory hole MH, in a manner that a very low-cost memory can be realized. A transistor formed by embedding a semiconductor film in the memory hole MH is usually a polysilicon channel and has mobility much lower than that of a bulk transistor, but since the number of series transistors of a cell block at the time of access is as small as two, a set/reset drive operation can be sufficiently performed.

(B) Second, when a gate oxide film is formed on the outer periphery of the sidewall of the memory hole MH and a semiconductor film is formed on inner side of the gate oxide film, and a local bit line column and a local source line column in which a resistance change film is formed on the side surface are disposed on inner side of the semiconductor channel, and a part of the resistance change film and a part of the semiconductor film are in contact with each other, and a part of the local bit line column and a part of the semiconductor film are in contact with each other, a memory cell in which a resistance change element and a cell transistor are connected in series can be realized.

(C) Third, one local bit line column and one local source line column may be disposed in each memory hole MH to form one cell block. The cost per bit may be reduced by disposing two local bit line columns and one local source line column and sharing the local source line column to form two cell blocks. Furthermore, the number of stacked word lines may be increased to reduce the cost per bit. In the three-dimensional flash or the like, when the number of stacked word lines is increased, the number of series cell transistors increases, and there is a possibility that a writing failure occurs or a reading speed is reduced. However, in the present embodiment, since the memory cells are connected in parallel, if the local source line column and the local bit line column includes low resistance wiring such as W wiring, the number of stacked word lines can be dramatically increased to reduce the cost.

(D) Fourth, a plurality of local bit line columns and a plurality of local source line columns are disposed side by side in the memory hole MH having a linear shape in plan view or in a quadruple array in the large memory hole MH, in a manner that a plurality of cell blocks can be filled.

(E) Fifth, it is also possible to configure a cell block by connecting the local source line to the common source line via the cell block select transistor, and it is possible to simplify the connection structure to the source line common line and the bit line in the process step.

(F) Sixth, if the local source line column and the local bit line column are formed in the same process, a resistance change element can be formed between the cell transistor and the local bit line or between the cell transistor and the local source line. Since the same cell current flows, there is no problem if the two are simultaneously changed to the high resistance state and the low resistance state and operated. Furthermore, in the case of an element that is likely to change from the high resistance state to the low resistance state, even if the resistance of one is reduced, the reliability of the data holding characteristic is significantly improved if the other can hold the high resistance state.

(G) Seventh, it is more desirable that the resistance change film in the memory hole MH has a structure separated for each word line layer stacked in the direction perpendicular to the semiconductor substrate. When the resistance change film is present between the memory cells adjacent in the stacking direction and the memory cell is in the low resistance state, there is no problem as long as the resistance change element in contact with the selected semiconductor channel in the ON state is in the sufficiently high resistance state. However, when the resistance change element is in the insufficient high resistance state, a disturbance current (leakage current) flows. According to the configuration in which the resistance change film is separated for each word line layer, the disturbance current can be suppressed, and the writing budget and the reading budget of the memory cell can be improved.

(H) Eighth, the resistance change film may be a phase change material containing a chalcogenide-based material (for example, Ge, Sb, Te, or a compound of them) or the like, a superlattice film material containing a stacked structure of GeTe and SbTe, a magnetic material in which a tunnel oxide film such as MgO is sandwiched between a free layer and a PIN layer, or a resistance change material using a metal oxide such as NiOx, WOx, TaOx, TiOx, HfOx, ZnOx, TiON, Ag—GeSe, Cu—GeSe, FeOx, GeOx, and STO.

(I) Ninth, a thermal barrier film such as TiN, TaN, TiOx, C, or CN may be inserted between the resistance change film and the semiconductor film, or between the resistance change film and the local bit line column, in a manner that diffusion of atoms can be prevented, and the contact resistance can be lowered. Since all of the phase change material, the magnetic material, and the metal oxide material are operated at a raised temperature or are easily switched at a high temperature, heat dissipation due to heat generation can be suppressed with a material having a high thermal resistance sandwiched between, and the temperature can be raised at a lower current.

Specifically, a nonvolatile semiconductor memory device 1 according to the present embodiment may be configured as illustrated in FIG. 1. FIG. 1 is a diagram illustrating a schematic configuration of the nonvolatile semiconductor memory device 1. The nonvolatile semiconductor memory device 1 can be connected to a host 3 via a communication medium 2. The nonvolatile semiconductor memory device 1 is, for example, a resistance change type memory. The communication medium 2 is, for example, a synchronous parallel communication line. The host 3 is, for example, a controller or a CPU. The configuration including the nonvolatile semiconductor memory device 1, the communication medium 2, and the host 3 may be configured as a memory system 4. The memory system may be a memory card such as an SD card, a storage system such as an SSD, or an eMMC device. The host 3 may be a controller or a CPU.

The nonvolatile semiconductor memory device 1 includes a cell array 5, a row decoder 6, a sense amplifier 7, a peripheral circuit 8, and an interface unit (I/F unit) 13. The peripheral circuit 8 includes a driver 9, a sequencer 10, an address register 11, and a command register 12. In the cell array 5, a plurality of memory cells is arranged. The plurality of memory cells is accessible using a plurality of word lines and a plurality of bit lines. Each of the plurality of word lines is associated with a row address. Each of the plurality of bit lines is associated with a column address. The command register 12 holds a command included in a host request received from the host 3 via the I/F unit 13. The address register 11 holds an address included in a host request received from the host 3 via the I/F unit 13.

The sequencer 10 executes a command held in the command register 12 and controls a write operation or a read operation of data with respect to the cell array 5. Under the control of the sequencer 10, the row decoder 6 can decode the address held in the address register 11 and select the word line corresponding to the decoded row address. Under the control of the sequencer 10, the driver 9 generates a voltage for selecting a word line and supplies the voltage to the row decoder 6. Under the control of the sequencer 10, the sense amplifier 6 can decode the address held in the address register 11 and select the bit line corresponding to the decoded column address.

When considering three-dimensionally arranging a plurality of memory cells in the cell array 5, a chain connection type memory can be mentioned as a configuration applicable to a resistance change type memory, for example, a phase change memory (PCM). In the chain connection type memory, a plurality of memory cells is connected in series in a chain shape to form a string. Each memory cell is configured by parallel connection of a resistance change element and a cell transistor. By turning off the cell transistor in the select memory cell and turning on the cell transistor in the non-select memory cell, a voltage can be selectively applied to the resistance change element of the select memory cell. This structure can be realized by a structure similar to a three-dimensional flash memory.

For example, a gate oxide film, a semiconductor film, a resistance change film, and a core insulating film can be sequentially deposited and formed on the side surface inside the memory hole, but the semiconductor film is deposited by a polycrystalline semiconductor at the time of manufacturing, and a cell current flows in the axial direction with respect to the cylindrical semiconductor film at the time of operation. That is, in the chain connection type memory, the channel regions of the plurality of cell transistors in the string are connected in series, and the current path through the semiconductor film becomes long during the access operation to the resistance change element (resistance change film). For this reason, the cell current amount may be insufficient with respect to the current amount required for read/write of the resistance change element due to the influence of a grain boundary or the like in the semiconductor film.

Figure 2:
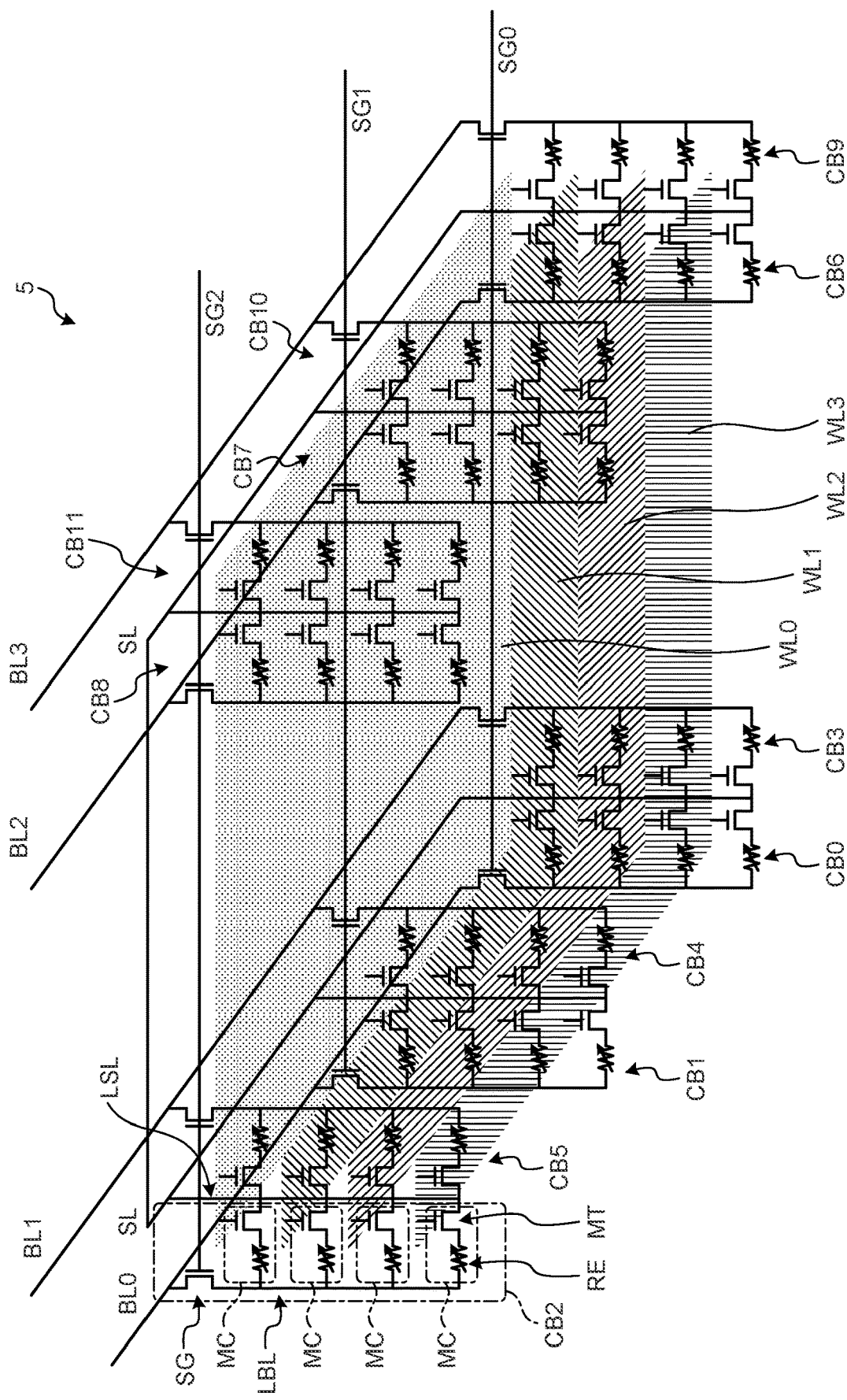
FIG. 2 is a circuit diagram illustrating a configuration of a cell array in the first embodiment.

Therefore, as a countermeasure, a ladder connection type memory is adopted instead of the chain connection type memory. In the ladder connection type memory, a plurality of cell blocks CB0 to CB11 as illustrated in FIG. 2 is two-dimensionally arranged to form the cell array 5. FIG. 2 is a circuit diagram illustrating a configuration of the cell array 5. The cell block CB is configured in a manner that a plurality of memory cells MC is connected in parallel in a ladder shape between a local bit line LBL and a local source line LSL. Each memory cell MC is configured by series connection of a resistance change element RE and a cell transistor MT. The local bit line LBL is connected to a bit line BL via a select transistor SG. The local source line LSL is connected to a source line SL.

At the time of an access operation to the resistance change element (resistance change film) RE, the select transistor SG of the select cell block CB is turned on, and the select transistor SG of the non-select cell block CB is kept off. In the select cell block CB, the cell transistor MT of the select memory cell MC is turned on, and the cell transistor MT of the non-select memory cell MC is kept off. When a voltage is applied to the bit line BL and the source line SL, a cell current may flow in the path of the bit line BL→the local bit line LBL→the resistance change element RE of the select memory cell MC→the cell transistor MT of the select memory cell MC the local source line LSL→the source line SL.

That is, in the ladder connection type memory, corresponding to the parallel connection of the channel regions of the plurality of cell transistors MT in the cell block CB, the current path through the semiconductor film can be shortened during the access operation to the resistance change element (resistance change film) RE. Therefore, even if the current decreases due to the influence of a grain boundary or the like in the semiconductor film, the cell current amount can be secured to the extent that the write operation (set/reset operation) and the read operation (detection of the set/reset state) of the resistance change element RE can be performed.

Figure 3:
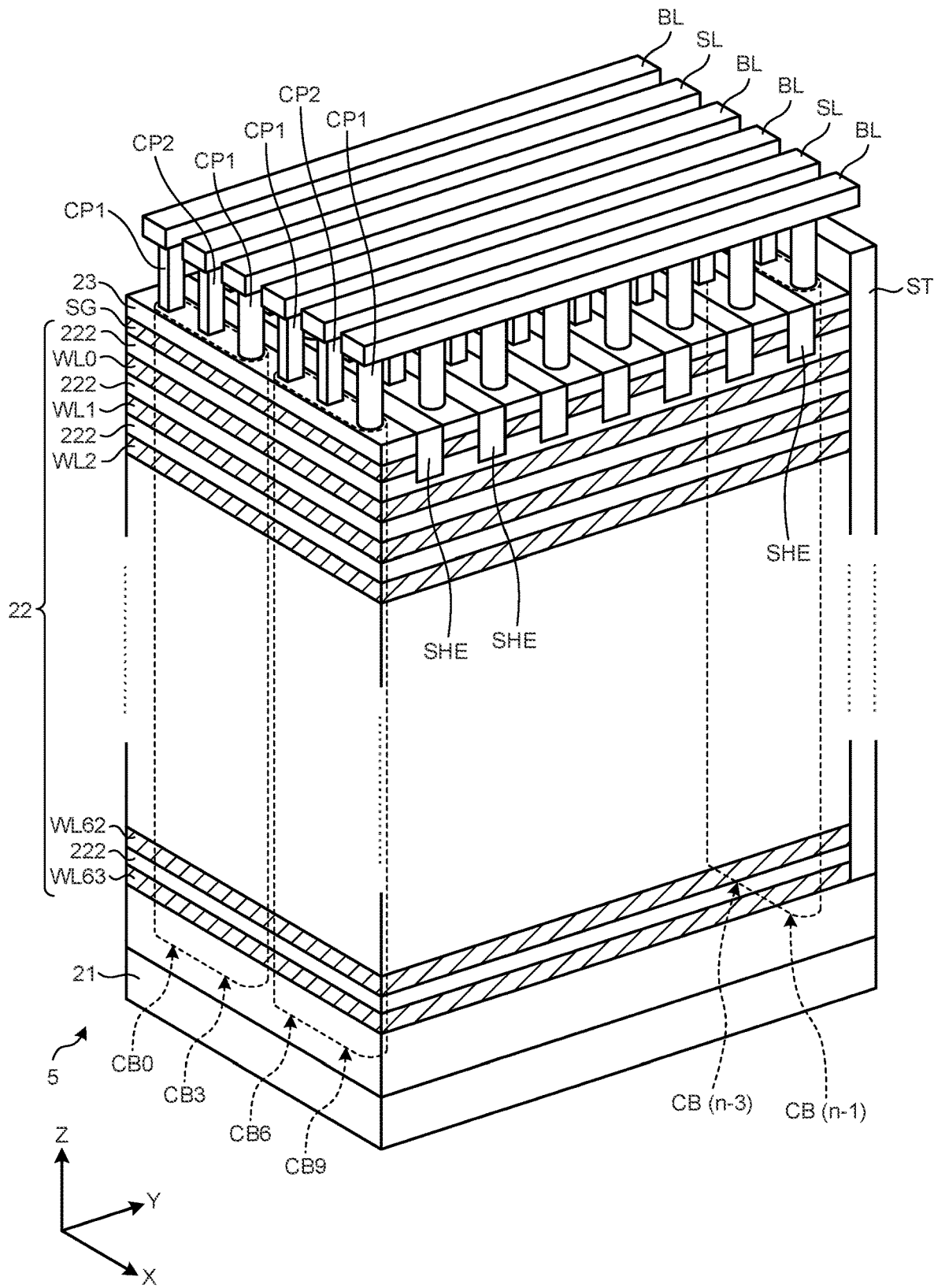
FIG. 3 is a perspective view illustrating a configuration of the cell array in the first embodiment.

The circuit illustrated in FIG. 2 may be realized by the configuration illustrated in FIG. 3. FIG. 3 is a perspective view illustrating a configuration of the cell array 5. In FIG. 3, an extending direction of the bit line BL is a Y direction, a stacking direction of the memory cells MC is a Z direction, and a direction perpendicular to the Y direction and the Z direction is an X direction. As illustrated in FIG. 3, in the cell array 5, the columnar cell blocks CB are two-dimensionally arranged in the XY direction on the +Z side of a substrate 21, and a stacked body 22 is penetrated by the columnar cell blocks CB in the Z direction to form a three-dimensional arrangement of memory cells MC.

A plurality of stacked bodies including the stacked body 22 may be disposed on the +Z side of the substrate 21. The plurality of stacked bodies may be disposed at positions shifted from each other in the Y direction with a separation portion ST therebetween. In the separation portion ST, at least a surface in contact with the stacked body 22 is formed of an insulating material, and the stacked body 22 is electrically separated from other stacked bodies. The separation portion ST has a substantially fin shape extending along the XZ direction.

In the stacked body 22, word lines WL and insulating layers 222 are alternately and repeatedly stacked in the Z direction. The word line WL is formed of a plate-shaped conductive film extending in the XY direction. Hereinafter, the word line WL is also referred to as a conductive film WL. In the stacked body 22, the plurality of conductive films WL0 to WL63 is disposed apart from each other in the Z direction. Each conductive film WL may be formed of a material containing a conductive material (for example, a metal such as tungsten) as a main component. Each insulating layer 222 may be formed of a material containing an insulator (for example, silicon oxide) as a main component.

A cell block select line SG is stacked on the uppermost insulating layer 222 of the stacked body 22 in the Z direction. The cell block select line SG is formed of a plate-shaped conductive film extending in the XY direction. Hereinafter, the cell block select line SG is also referred to as a conductive film SG. The conductive film SG may be formed of a material containing a conductive material (for example, a metal such as tungsten) as a main component. The conductive film SG is divided in the Y direction by a division film SHE. The division film SHE is provided above (on the +Z side of) the conductive film WL, extends in the XZ direction, and reaches the uppermost insulating layer 222 of the stacked body 22. The division film SHE may be formed of an insulator (for example, silicon oxide). As a result, each cell block select line SG is electrically insulated from each other.

Each cell block CB extends in the Z direction and penetrates the stacked body 22 in the Z direction. The cell block CB includes a columnar structure penetrating the plurality of conductive films WL0 to WL63 in the Z direction. The plurality of cell blocks CB0 to CB (n−1) may be two-dimensionally arranged in the XY direction. Each cell block CB includes a semiconductor film CH extending in the Z direction and functioning as a semiconductor channel. The semiconductor film CH penetrates the stacked body 22 in the Z direction and functions as a semiconductor channel. The memory cell MC is formed at a position where the semiconductor film CH intersects the conductive film WL, and a cell block select transistor SG is formed at a position where the semiconductor film CH intersects the conductive film SG.

An interlayer insulating film 23 is disposed on the conductive film SG (+Z side). The interlayer insulating film 23 may be formed of a material containing an insulator (for example, silicon oxide) as a main component.

The plurality of bit lines BL and the plurality of source lines SL are disposed on the +Z side of the interlayer insulating film 23. The plurality of bit lines BL is arranged in the X direction. Each of the plurality of source lines SL is arranged in the X direction to be located alternately between the plurality of bit lines BL. Each of the bit line BL and the source line SL includes a linear conductive film extending in the Y direction. Each of the bit line BL and the source line SL may be formed of a material containing a conductive material (for example, a metal such as tungsten, copper, or aluminum) as a main component.

A contact plug CP1 may be disposed between the bit line BL and the semiconductor film CH. In this case, the contact plug CP1 can be in contact with the bit line BL at the upper end and in contact with the semiconductor film CH at the lower end to electrically connect the bit line BL and the semiconductor film CH. The contact plug CP1 may be formed of a material containing a conductive material (for example, a metal such as tungsten) as a main component.

A contact plug CP2 may be disposed between the source line SL and the local source line LSL. In this case, the contact plug CP2 can be in contact with the source line SL at the upper end and in contact with the local source line LSL at the lower end to electrically connect the source line SL and the local source line LSL. The contact plug CP2 may be formed of a material containing a conductive material (for example, a metal such as tungsten) as a main component.

A set of two cell blocks CB adjacent to each other in the X direction forms a pair alternately. For example, the cell block CB0 and the cell block CB3 form a pair, the cell block CB3 and the cell block CB6 do not form a pair, and the cell block CB6 and the cell block CB9 form a pair.

Figure 4:
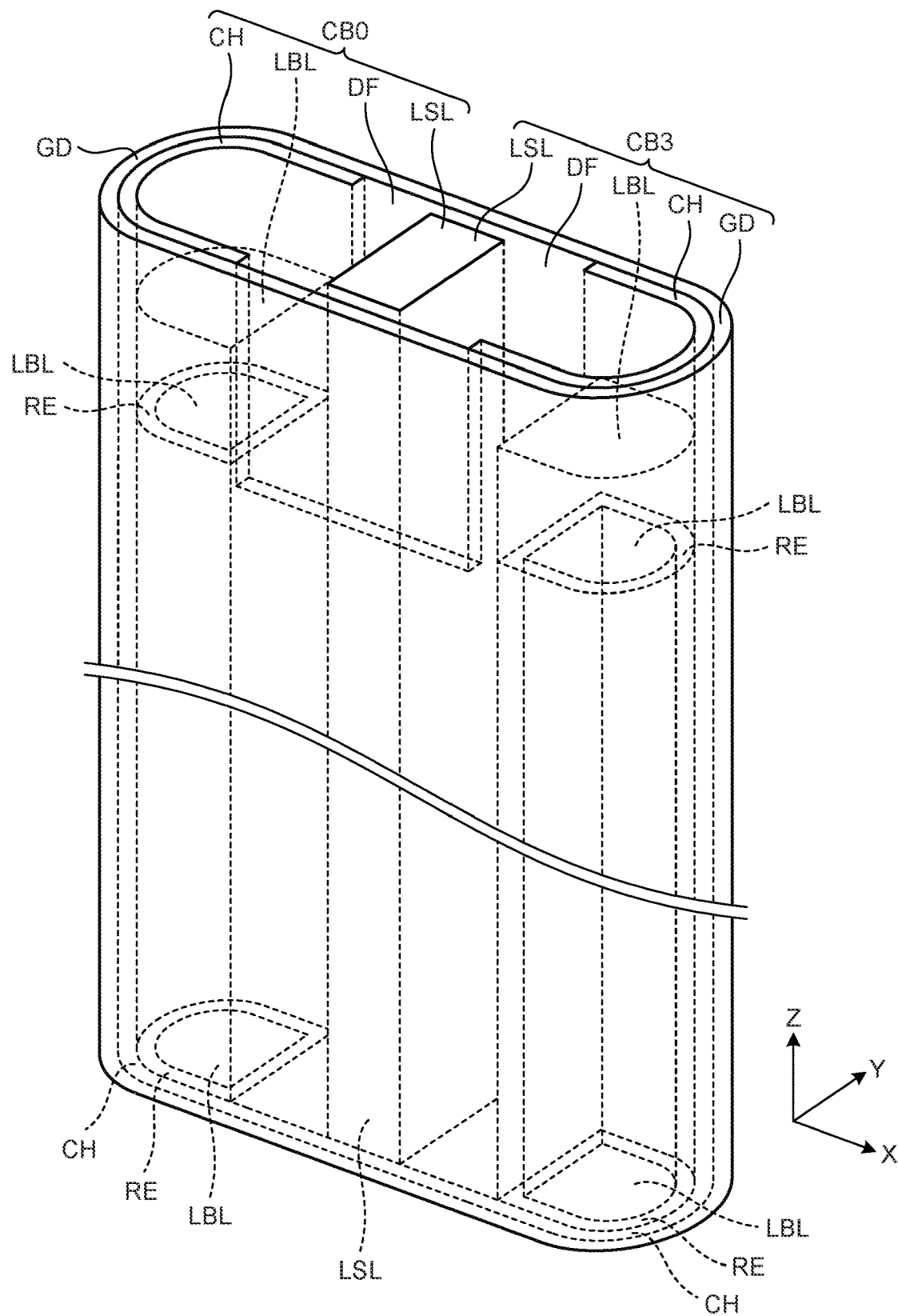
FIG. 4 is a perspective view illustrating a configuration of a cell block in the first embodiment.
Figure 5:
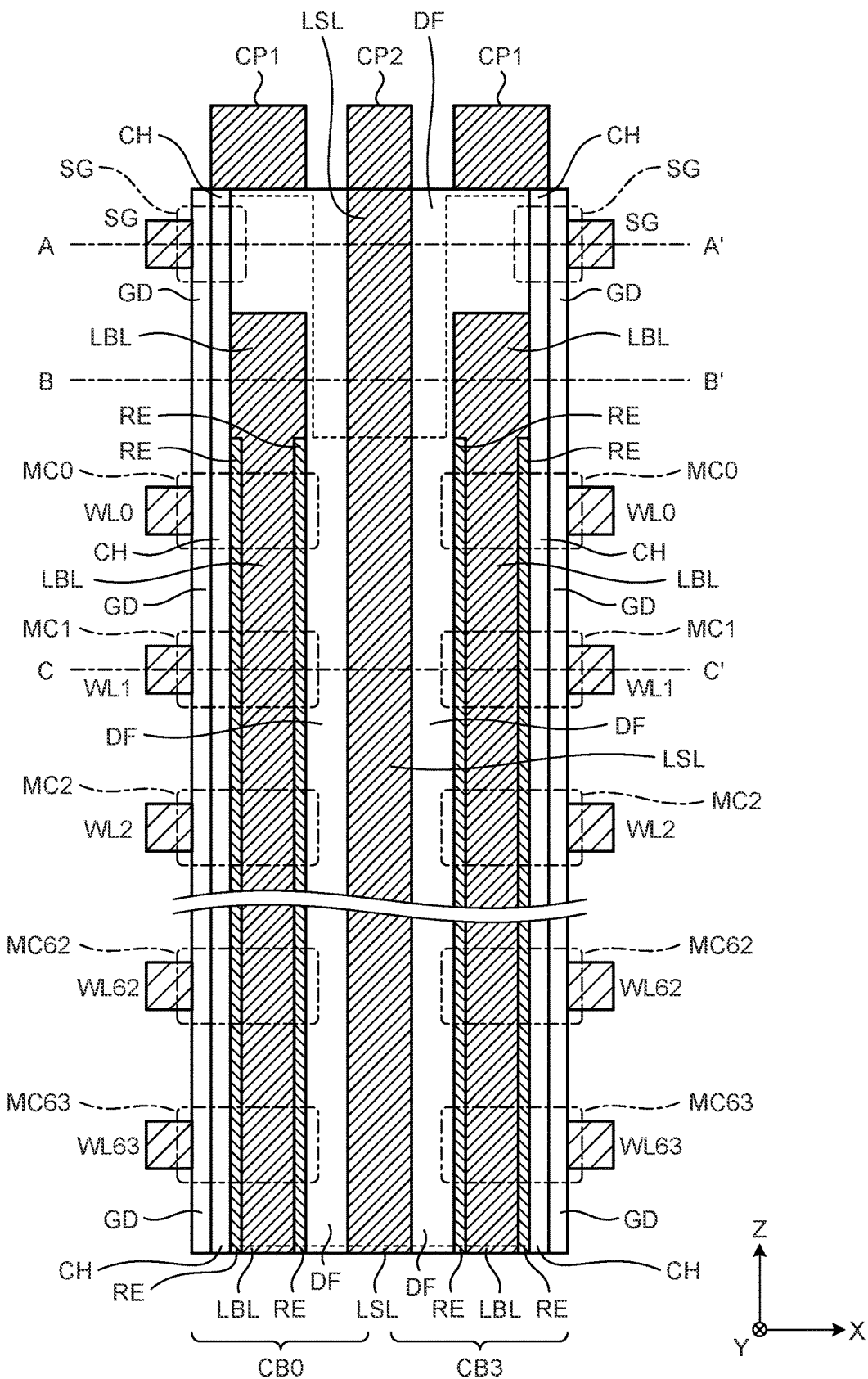
FIG. 5 is a vertical cross-sectional view illustrating a configuration of the cell block in the first embodiment.
Figure 6A:
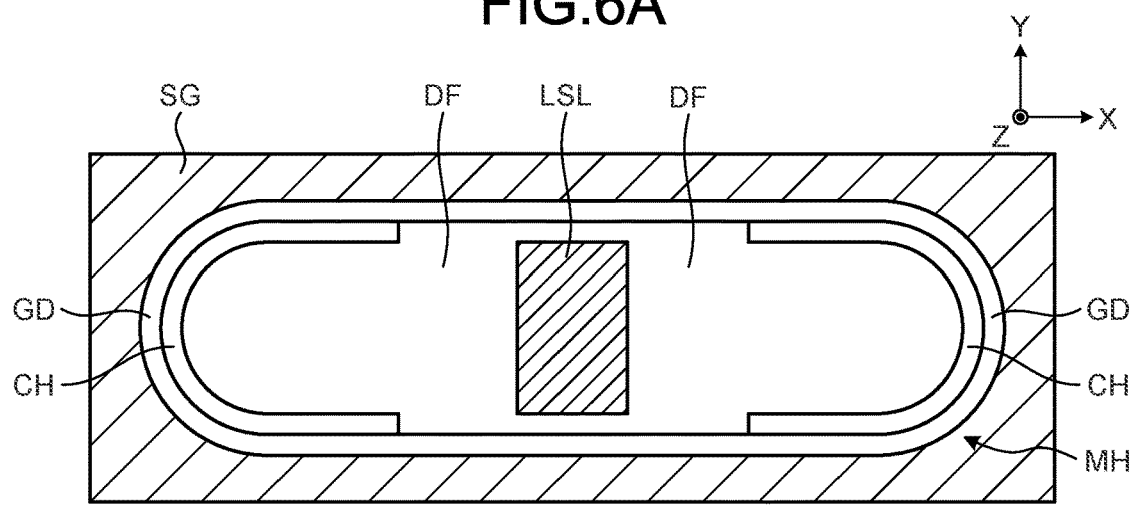
FIGS. 6A to 6C are planar cross-sectional views illustrating a configuration of the cell block in the first embodiment.
Figure 6B:
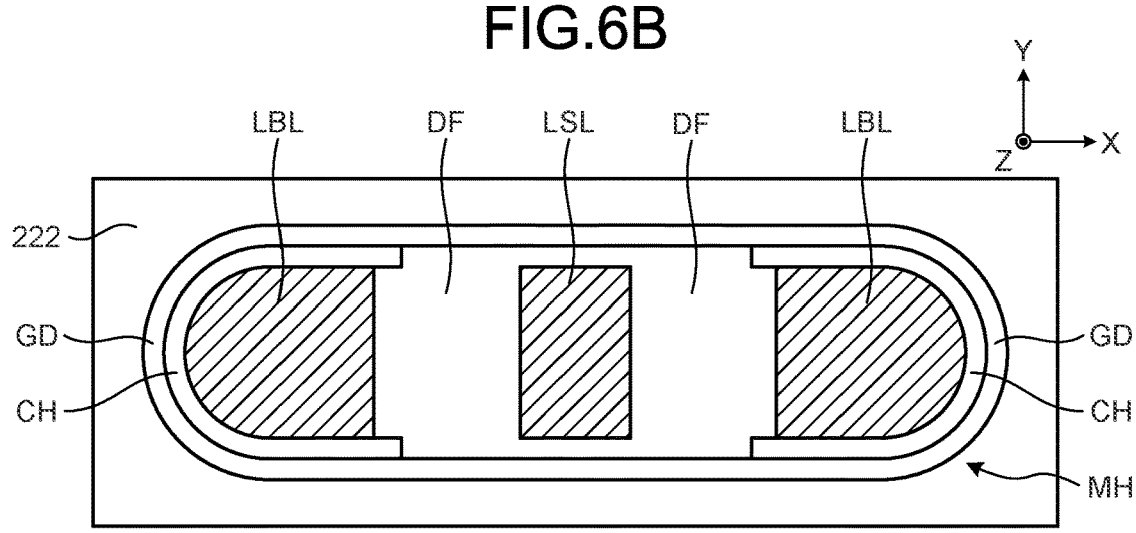
Figure 6C:
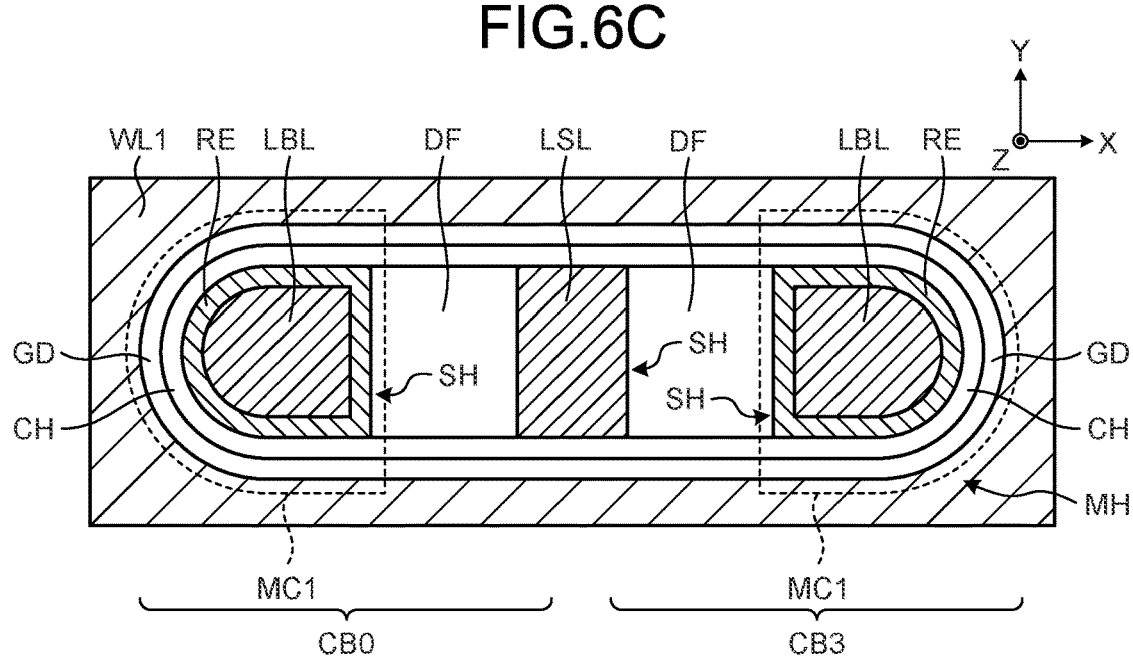

A set of two cell blocks CB adjacent in the X direction is configured as illustrated in FIGS. 4 to 6C, for example. FIG. 4 is a perspective view illustrating a configuration of the cell block CB, and exemplifies a configuration of a set of two cell blocks CB0 and CB3. FIG. 5 is a vertical cross-sectional view illustrating a configuration of the cell block CB, and illustrates an XZ cross section passing through the central axis of the cell block CB. In FIG. 5, illustration of an insulating layer between the word line WL and the word line WL is omitted for simplification. FIGS. 6A to 6C are planar cross-sectional views illustrating a configuration of the cell block CB. FIG. 6A illustrates an XY cross section of FIG. 5 taken along line A-A', FIG. 6B illustrates an XY cross section of FIG. 5 taken along line B-B', and FIG. 6C illustrates an XY cross section of FIG. 5 taken along line C-C'.

The cell block CB0 and the cell block CB3 in the set includes a columnar structures as illustrated in FIGS. 4 to 6C, respectively. The columnar structure has an XY planar shape with the X direction as a longitudinal direction, and has a three-dimensional shape extending in the Z direction in a columnar shape with the XY cross-sectional shape. The columnar structure of the cell block CB0 and the columnar structure of the cell block CB3 are coupled in the X direction, and the set of the cell block CB0 and the cell block CB3 has a substantially elliptical columnar shape.

The columnar structure of each cell block includes a gate insulating film GD, the semiconductor film CH, a local bit line column LBL, a local source line column LSL, and a resistance change film RE. The local source line column LSL is shared by the set of the cell block CB0 and the cell block CB3, but other configurations in the columnar structure are provided in the cell block CB0 and the cell block CB3, respectively.

The gate insulating film GD extends in the Z direction and penetrates the plurality of conductive films WL0 to WL63. The gate insulating film GD has a substantially elliptical cylindrical shape. The semiconductor film CH extends in the Z direction on inner side of the gate insulating film GD and penetrates the plurality of conductive films WL0 to WL63. The semiconductor film CH has a substantially elliptical cylindrical shape, and its outer surface is in contact with the inner surface of the gate insulating film GD. The local bit line column LBL extends in the Z direction on inner side of the semiconductor film CH and penetrates the plurality of conductive films WL0 to WL63. The local bit line column LBL has a substantially semicircular columnar shape. The local source line column LSL extends in the Z direction on inner side of the semiconductor film CH and penetrates the plurality of conductive films WL0 to WL63. The local source line column LSL has a substantially prismatic shape. The resistance change film RE penetrates the plurality of conductive films WL0 to WL63 on inner side of the semiconductor film CH and on outer side of the local bit line column LBL. The resistance change film RE includes a portion in contact with the semiconductor film CH and a portion in contact with the local bit line column LBL. That is, the resistance change film RE has a substantially semi-cylindrical shape, its outer surface is in contact with the inner surface of the semiconductor film CH, and its inner surface is in contact with the outer surface of the local bit line column LBL.

These cell blocks CB may be manufactured by the following manufacturing process. The insulating layer 222 and a sacrificial layer SF are alternately stacked a plurality of times on the +Z side of the semiconductor substrate 21 (see FIG. 3) to form a stacked body. The insulating layer 222 is formed of, for example, a material containing silicon oxide as a main component, and the sacrificial layer SF is formed of, for example, a material containing silicon nitride as a main component. In order to form the cell block CB, a plurality of memory holes MH each penetrating the stacked body in the Z direction is formed, and a set of two cell blocks CB is embedded in each memory hole MH. After that, the sacrificial layer SF is removed, and the conductive film WL is embedded in the gap formed by the removal, and a very low-cost memory can be realized.

As illustrated in FIGS. 4, 5, and 6A to 6C, for embedding the set of two cell blocks CB, a gate oxide film GD is deposited on the outer periphery of the sidewall of the memory hole MH that is horizontally long in the XY plan view, the semiconductor film CH is deposited on inner side of the gate oxide film GD, and then the on inner side of is filled with the insulating film DF, and then three subholes SH at the center and right and left in the drawing are formed using lithography. Tungsten or the like is used to fill the low-resistance local source line column LSL in the subhole SH at the center in the drawing. As illustrated in FIGS. 6A and 6B, the semiconductor film CH is not in contact at the Z position of the cell block select line SG and the Z position between the cell block select line SG and the conductive film WL, but the semiconductor film CH is in contact at the Z position corresponding to the conductive film WL as illustrated in FIG. 6C. In the left and right subholes SH in the drawing, the resistance change film RE is deposited on inner side of the semiconductor film CH to be in contact with the semiconductor film CH, but at the Z position of the cell block select line SG and the Z position between the cell block select line SG and the conductive film WL, the resistance change film RE is removed as illustrated in FIGS. 6A and 6B. Also with respect to the semiconductor film CH, a portion up to the Z position in the vicinity of the center in the X direction and immediately above the conductive film WL is removed. The local bit line column LBL having a low resistance such as tungsten is filled further on inner side, but the local bit line column LBL is removed at the Z position of the cell block select line SG as illustrated in FIG. 6A.

As a result, at the Z position of the cell block select line SG, the cell block select transistor SG that can be controlled by the cell block select line SG can be formed, and connection switches of bit lines BL0 and BL1 and local bit lines LBL0 and LBL1 can be formed. In addition, since the local bit line LBL is electrically connected to the semiconductor film CH at the Z position between the cell block select line SG and the conductive film WL, the local bit line LBL is electrically connected to the bit lines BL0 and BL1 when the cell block select transistor SG is in the ON state. In addition, at the Z position corresponding to the conductive film WL, the local bit line column LBL is connected to the local source line column LSL via the resistance change film RE and the semiconductor film CH, in a manner that the memory cell MC may be formed. For example, when the resistance change film RE is formed of a phase change material such as a chalcogenide-based material (Ge, Sb, or Te), the memory cell MC can be configured as a PCM memory cell.

Figure 7:
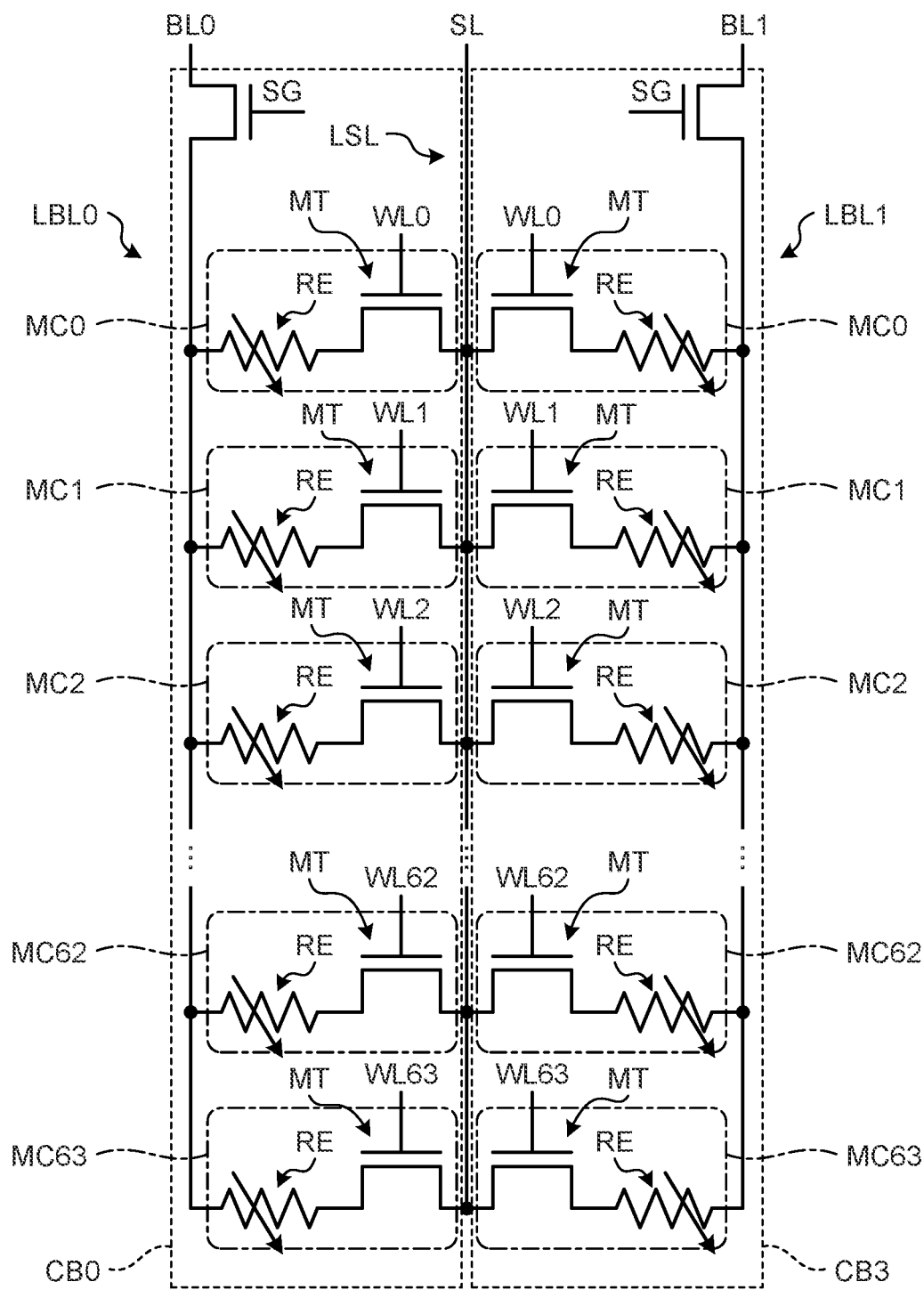
FIG. 7 is a circuit diagram illustrating a configuration of the cell block in the first embodiment.

An equivalent circuit diagram of a set of the cell block CB0 and the cell block CB3 is as illustrated in FIG. 7. FIG. 7 is a circuit diagram illustrating a configuration of the cell block CB.

As illustrated in the equivalent circuit diagram of FIG. 7, the memory cell MC is configured by series connection of the cell transistor MT connected to a word line WLi (i=0 to 63) and a two-terminal resistance change element RE. One of a plurality of memory cells MC0 to MC63 connected to word lines WL0 to WL63 is connected to the common local bit line (local bit lines LBL0 and LBL1) and the other is connected to the common local source line LSL in parallel connection. The local bit line LBL is connected to the bit lines BL0 and BL1 via cell block select transistors SG0 and SG1. With this configuration, by turning on the cell block select transistors SG0 and SG3 to select the cell blocks CB0 and CB3 and turning on the cell transistor MT connected to the select word line WL in the select cell blocks CB0 and CB3, voltage application and current application can be selectively performed to the resistance change element RE of the select memory cell MC, and random reading and random writing can be performed. Furthermore, the number of series transistors in the current path between the bit line BL and the source line SL can be suppressed to only two, and a current capable of sufficiently performing the set/reset operation of the resistance change element RE can be supplied even if the ON resistance of the transistor is high.

In this example, an equivalent circuit of the two left and right cell blocks CB0 and CB3 in which the local source line LSL is common is illustrated. A common word line WL1 and a cell block control line SG may be used, and memory cells MC1 of the two cell blocks CB0 and CB3 of the two cell blocks CB0 and CB3 may be read/written simultaneously.

Figure 8:
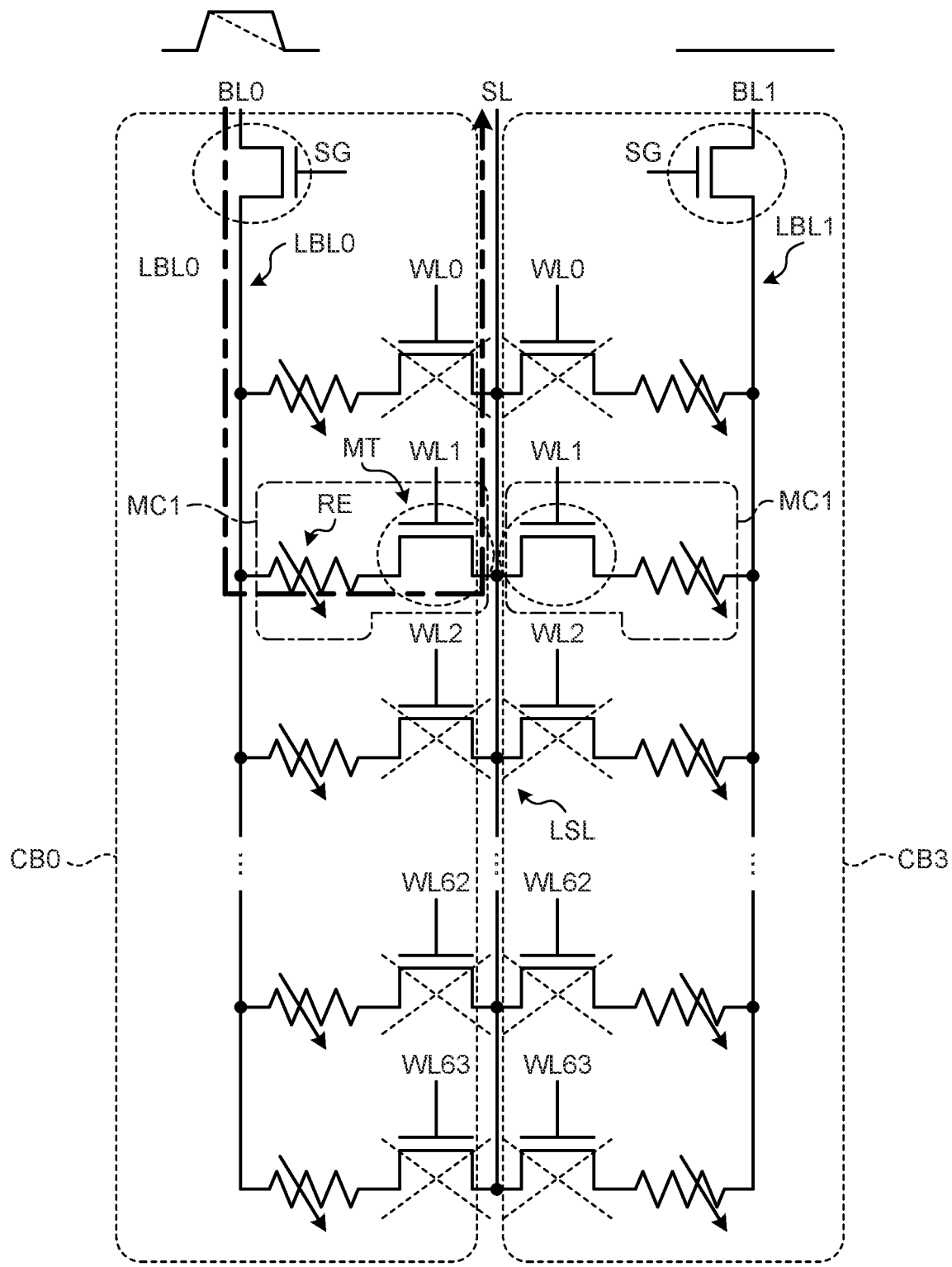
FIG. 8 is a circuit diagram illustrating an operation of the cell block in the first embodiment.

Alternatively, as illustrated in FIG. 8, the potential of the bit line BL1 corresponding to the cell block CB3 on the right side in the drawing is set to a fixed potential equal to the source line SL potential, and a voltage is applied to the select word line WL1. As a result, a voltage is not applied to the memory cell MC1 corresponding to the select word line WL1, and the cell block CB3 may be made non-accessible. It is assumed that (the potential of the bit line BL0)>(the potential of the source line SL) corresponding to the cell block CB0 on the left side in the drawing. As a result, the cell current selectively flows through the memory cell MC1 corresponding to the select word line WL1, and the cell block CB0 may be read/written. In this case, as illustrated in FIGS. 5, 6C, and 8, the current path is a path through which a current flows from the local bit line column LBL of the select cell block CB0 toward the center local source line column LSL via the semiconductor film CH of the select memory cell MC1. FIG. 8 is a circuit diagram illustrating the operation of the cell block CB, and a current path when the select word line is WL1 is indicated by an alternate long and short dash line. At this time, since the current amount changes in accordance with the resistance state (set/reset state) of the resistance change film RE, the read operation becomes possible. The cell transistors MT disposed in the openings of the stacked word lines WL are usually polysilicon channels and have mobility much lower than that of bulk transistors, but since the number of series transistors (in the case of FIG. 8, the cell block transistor SG and one cell transistor MT) of the cell block CB at the time of access is as small as two, a sufficiently large cell current may flow. This facilitates the set/reset drive operation of the resistance change element RE. When the local bit line column LBL and the local source line column LSL are formed of low-resistance tungsten or the like, even if the number of stacked word lines WL is increased, the cell current at the time of the read and write operations of the resistance change element RE hardly decreases, in a manner that a low-cost memory can be realized.

As described above, according to the first embodiment, the plurality of word lines includes the plurality of conductive films stacked apart from each other, and the cell block includes the columnar structure penetrating the plurality of conductive films in the stacking direction. This structure can be formed by providing the memory hole MH in the stacked body in which the insulating layer and the sacrificial layer SF are alternately stacked and embedding one or several cell blocks CB in that, and the manufacturing cost can be greatly reduced. Furthermore, since a cell block is configured by connecting a block select transistor to parallel connection of the plurality of memory cells, the number of series transistors through which a cell current passes during operation in the cell block can be suppressed to about two. As a result, the cell current can be easily increased, and the set/reset drive operation of the resistance change element RE is facilitated. Therefore, it is possible to realize a memory having a high degree of integration and is a low cost.

In addition, according to the first embodiment, when the local bit line column LBL and the local source line column LSL are formed of low-resistance tungsten or the like, even if the number of stacked word lines WL is increased, the cell current during the read and write operations is hardly reduced. Also from this point of view, it is possible to realize a memory having a high degree of integration and is a low cost.

Second Embodiment

Next, the nonvolatile semiconductor memory device 1 according to a second embodiment will be described. Hereinafter, portions different from those of the first embodiment will be mainly described.

In the first embodiment, a configuration in which a set of two cell blocks is disposed in the memory hole MH is exemplified, but in the second embodiment, a configuration in which one cell block is disposed in the memory hole MH is exemplified.

Figure 9:
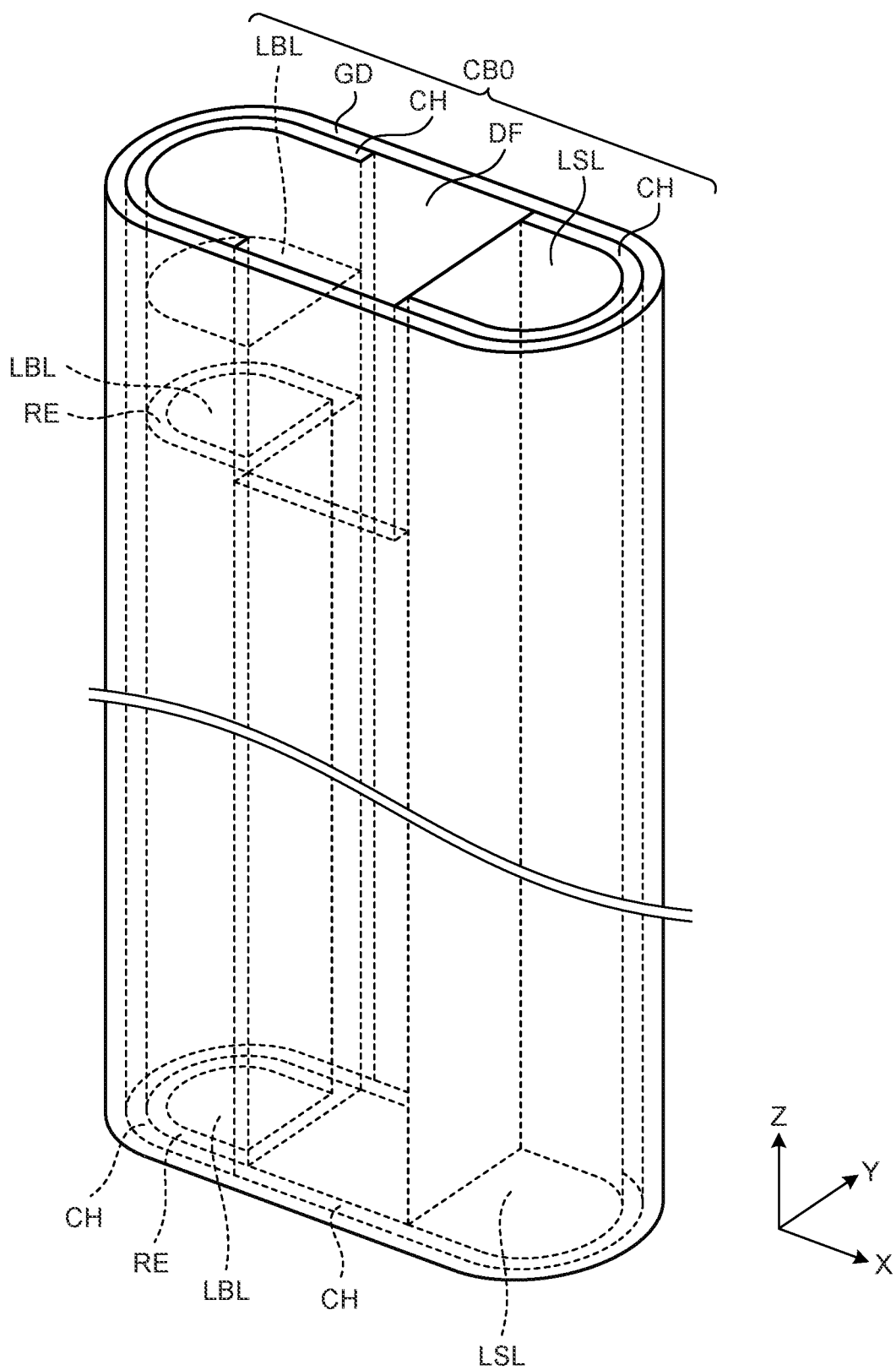
FIG. 9 is a perspective view illustrating a configuration of a cell block in the second embodiment.
Figure 10:
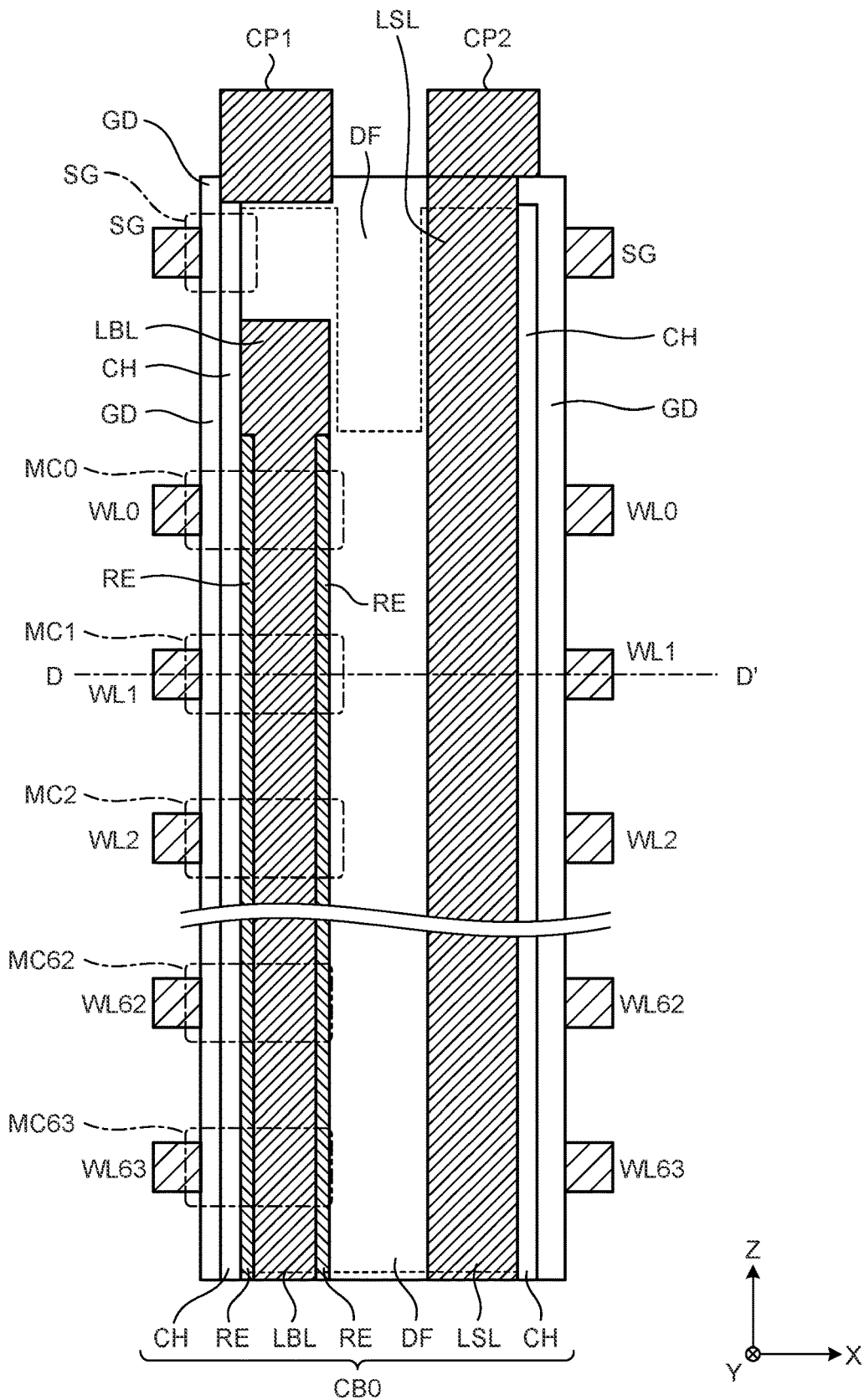
FIG. 10 is a vertical cross-sectional view illustrating a configuration of the cell block in the second embodiment.
Figure 11:
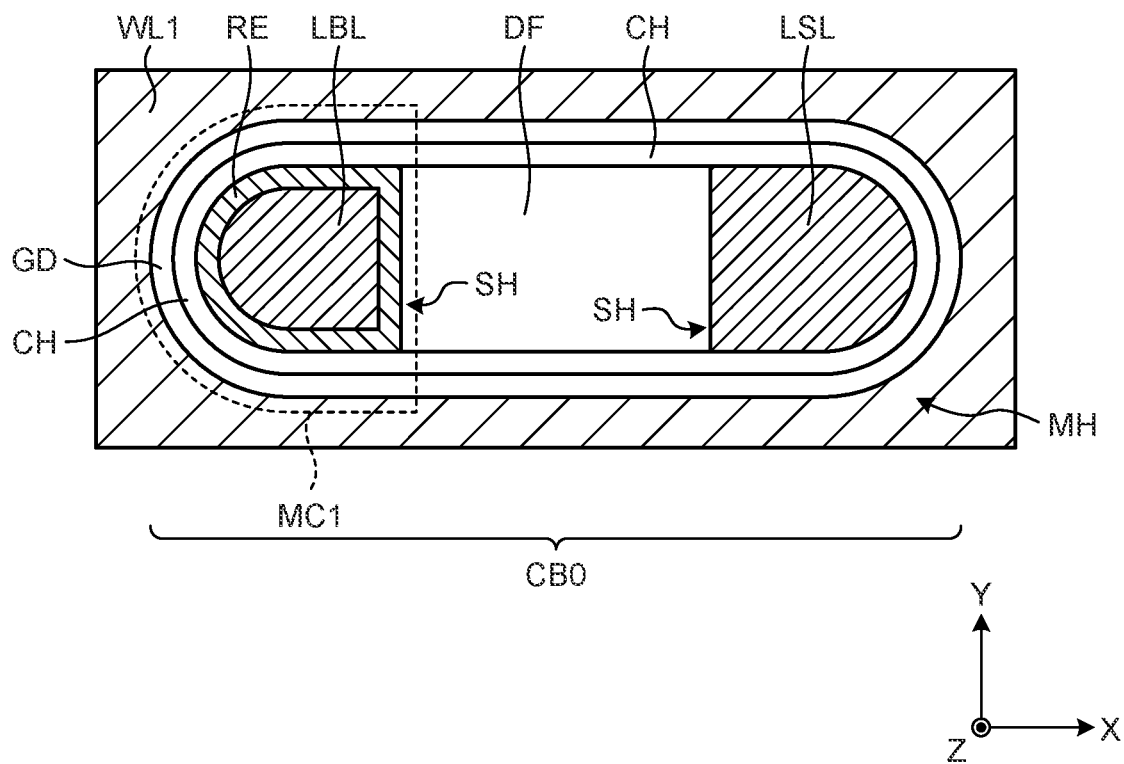
FIG. 11 is a planar cross-sectional view illustrating a configuration of the cell block in the second embodiment.

The cell block CB is configured as illustrated in FIGS. 9 to 11, for example. FIG. 9 is a perspective view illustrating a configuration of the cell block CB, and exemplifies a configuration of the cell block CB0. FIG. 10 is a vertical cross-sectional view illustrating a configuration of the cell block CB, and illustrates an XZ cross section passing through the central axis of the cell block CB. In FIG. 10, illustration of an insulating layer between the word line WL and the word line WL is omitted for simplification. FIG. 11 is a planar cross-sectional view illustrating a configuration of the cell block CB. FIG. 11 illustrates an XY cross section taken along line D-D' in FIG. 10.

As illustrated in FIGS. 9 to 11, the cell block CB0 includes a columnar structure. The columnar structure has an XY planar shape with the X direction as a longitudinal direction, and has a three-dimensional shape extending in the Z direction in a columnar shape with the XY cross-sectional shape. The cell block CB0 has a substantially elliptical columnar shape.

In this example, one cell block CB is disposed in the memory hole MH. These cell blocks CB may be manufactured by a manufacturing process different from that of the first embodiment in the following points. The steps up to the step of forming the plurality of memory holes MH are the same, but are different in that one cell block CB is embedded in each memory hole MH. After that, the sacrificial layer SF is removed, and the conductive film WL is embedded in the gap formed by the removal, and a very low-cost memory can be realized, which are similar to the first embodiment.

The embedding of one cell block CB is different from that of the first embodiment in the following points as illustrated in FIGS. 9, 10, and 11. The steps up to the step of filling the insulating film DF are similar, but are different in that the two left and right subholes SH in the drawing are then formed in the memory hole MH by lithography. In the subhole SH on the right side in the drawing, tungsten or the like is used to fill the low-resistance local source line column LSL, in a manner that the subhole SH is in contact with the semiconductor film CH. In the subhole SH on the left side in the drawing, the resistance change film RE is deposited with a chalcogenide-based material (Ge, Sb, or Te) or the like to be in contact with the semiconductor film CH on inner side of the semiconductor film CH, but the resistance change film RE is removed at the Z position of the cell block select line SG and the Z position between the cell block select line SG and the conductive film WL. The local bit line column LBL having a low resistance such as tungsten is filled further on inner side, but the local bit line column LBL is removed at the Z position of the cell block select line SG.

As a result, at the Z position of the cell block select line SG, the cell block select transistor SG that can be controlled by the cell block select line SG can be formed, and connection switches of the bit line BL and the local bit line LBL can be formed. In addition, since the local bit line LBL is electrically connected to the semiconductor film CH at the Z position between the cell block select line SG and the conductive film WL, the local bit line LBL is electrically connected to the bit line BL when the cell block select transistor SG is in the ON state. In addition, at the Z position corresponding to the conductive film WL, the local bit line column LBL is connected to the local source line column LSL via the resistance change film RE and the semiconductor film CH, in a manner that the memory cell MC may be formed.

Figure 12:
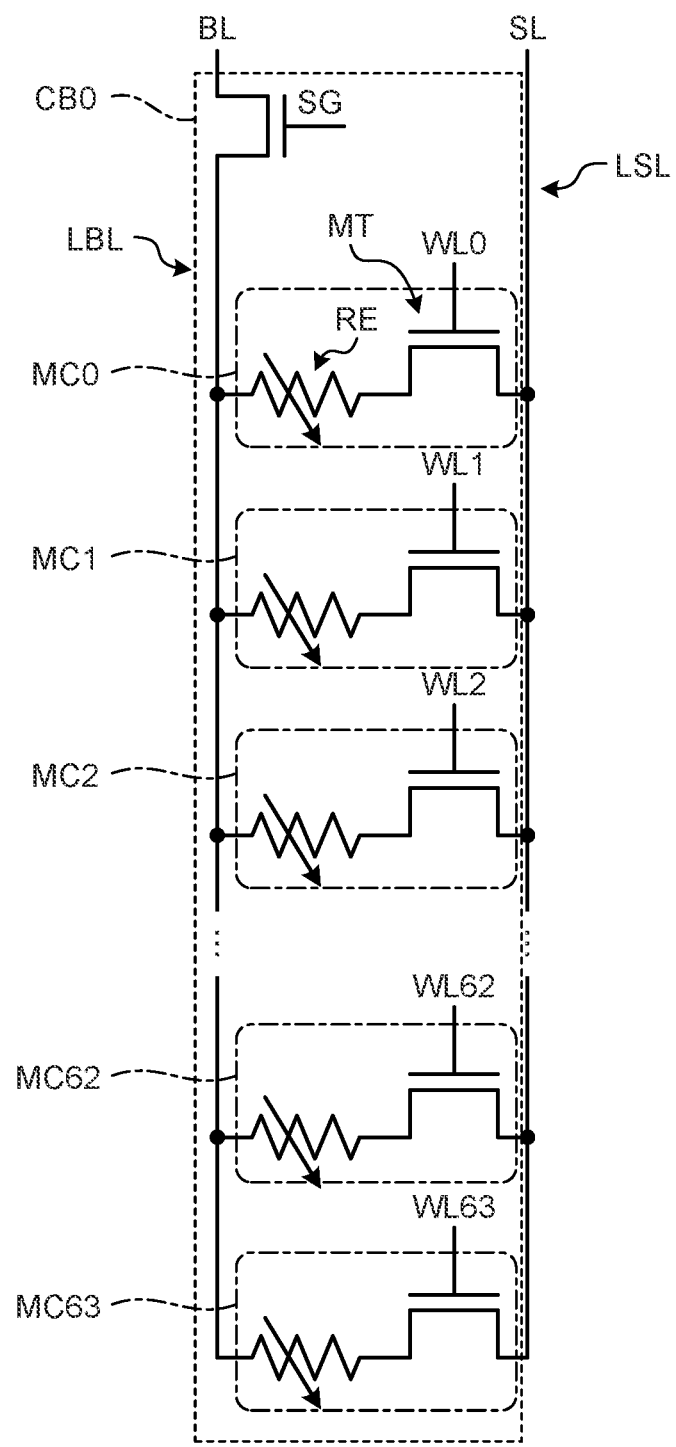
FIG. 12 is a circuit diagram illustrating a configuration of the cell block in the second embodiment.

An equivalent circuit diagram of the cell block CB is as illustrated in FIG. 12. FIG. 12 is a circuit diagram illustrating a configuration of the cell block.

As illustrated in the equivalent circuit diagram of FIG. 12, the memory cell MC is configured by series connection of the cell transistor MT connected to a word line WLi (i=0 to 63) and a two-terminal resistance change element RE. One of the plurality of memory cells MC0 to MC63 connected to the word lines WL0 to WL63 is connected to the common local bit line LBL and the other is connected to the common local source line LSL in parallel connection. The local bit line LBL is connected to the bit line BL via cell block select transistor SG.

Figure 13:
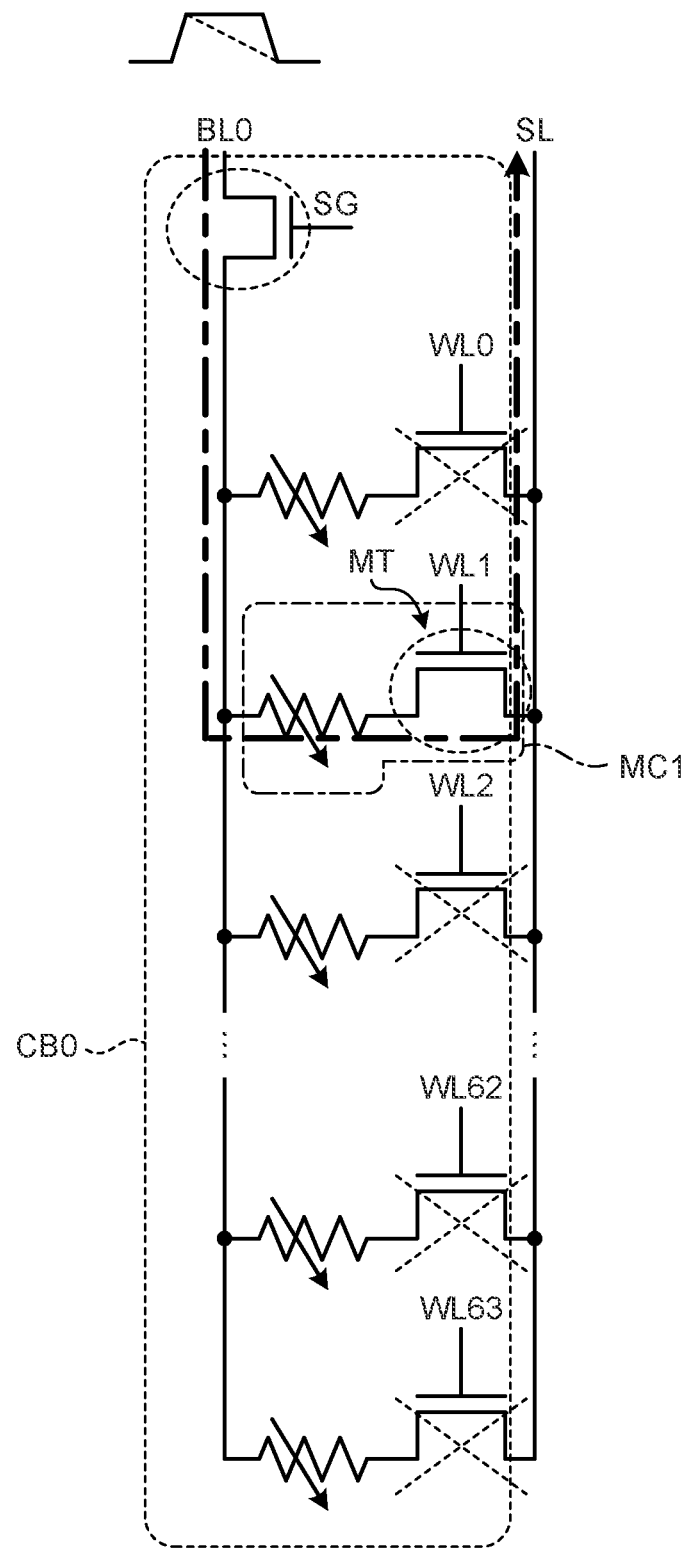
FIG. 13 is a circuit diagram illustrating an operation of the cell block in the second embodiment.

With this configuration, by turning on the cell block select transistor SG to select the cell block CB and turning on the cell transistor MT connected to the select word line WL in the select cell block CB, voltage application and current application can be selectively performed to the resistance change element RE of the select memory cell MC, and random reading and random writing can be performed. Furthermore, as illustrated in FIG. 13, the number of series transistors in the current path between the bit line BL and the source line SL can be suppressed to only two, and a current capable of sufficiently performing the set/reset operation of the resistance change element RE can be supplied even if the ON resistance of the transistor is high. FIG. 13 is a circuit diagram illustrating the operation of the cell block.

As described above, in the second embodiment, one cell block CB includes a columnar structure disposed in the memory hole MH. Also with this structure, since the cell block CB is configured by connecting the block select transistor SG to parallel connection of the plurality of memory cells MC, the number of series transistors through which a cell current passes during operation in the cell block CB can be suppressed to about two. As a result, the cell current can be easily increased, and the set/reset drive operation of the resistance change element RE is facilitated. Therefore, it is possible to realize a memory having a high degree of integration and is a low cost.

Third Embodiment

Next, the nonvolatile semiconductor memory device 1 according to a third embodiment will be described. Hereinafter, portions different from those of the first embodiment and the second embodiment will be mainly described.

In the second embodiment, a configuration in which one memory cell includes one resistance change element is exemplified, but in the third embodiment, a configuration in which one memory cell includes a plurality of resistance change elements is exemplified.

Figure 14:
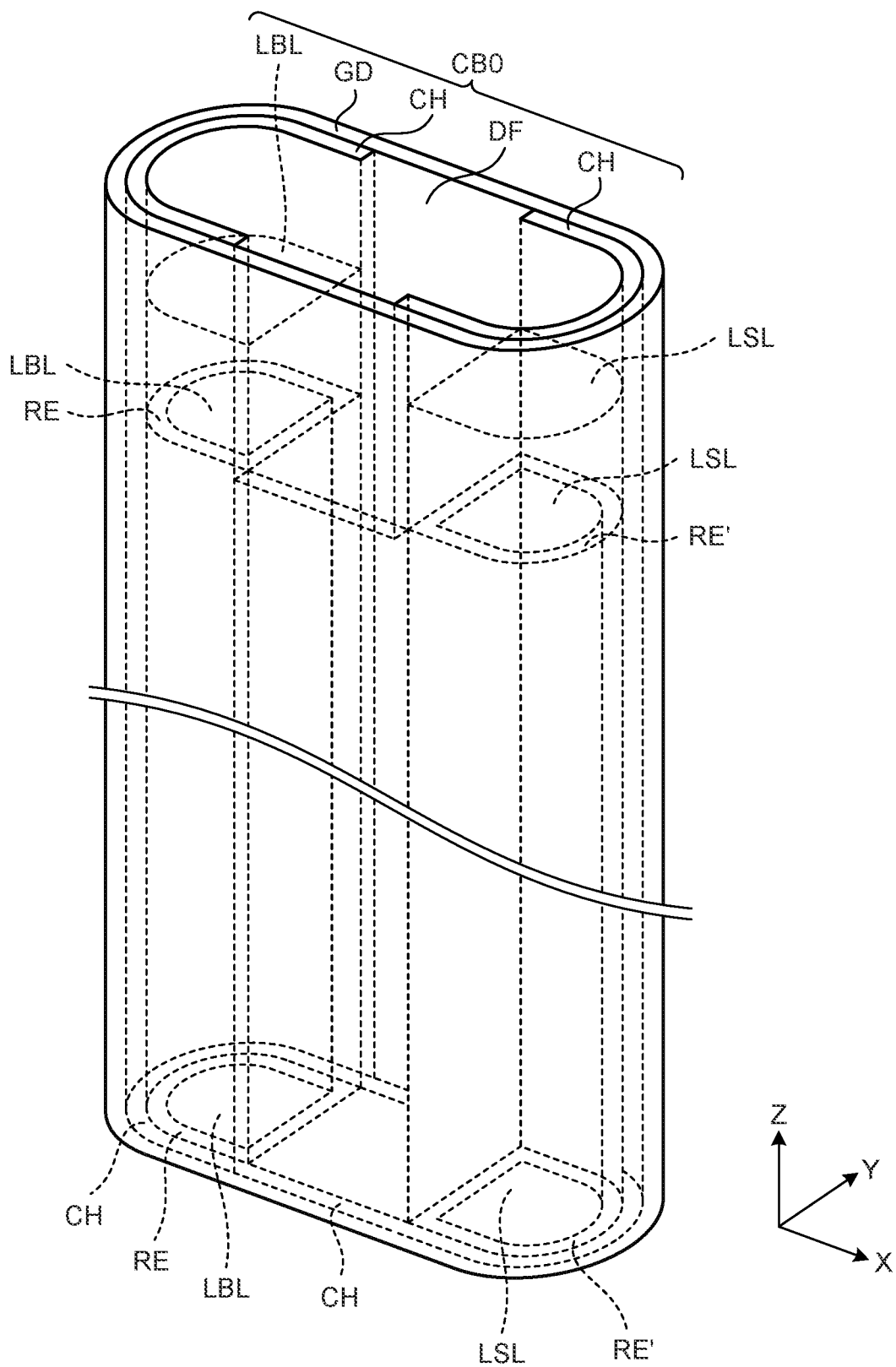
FIG. 14 is a perspective view illustrating a configuration of the cell block in a third embodiment.
Figure 15:
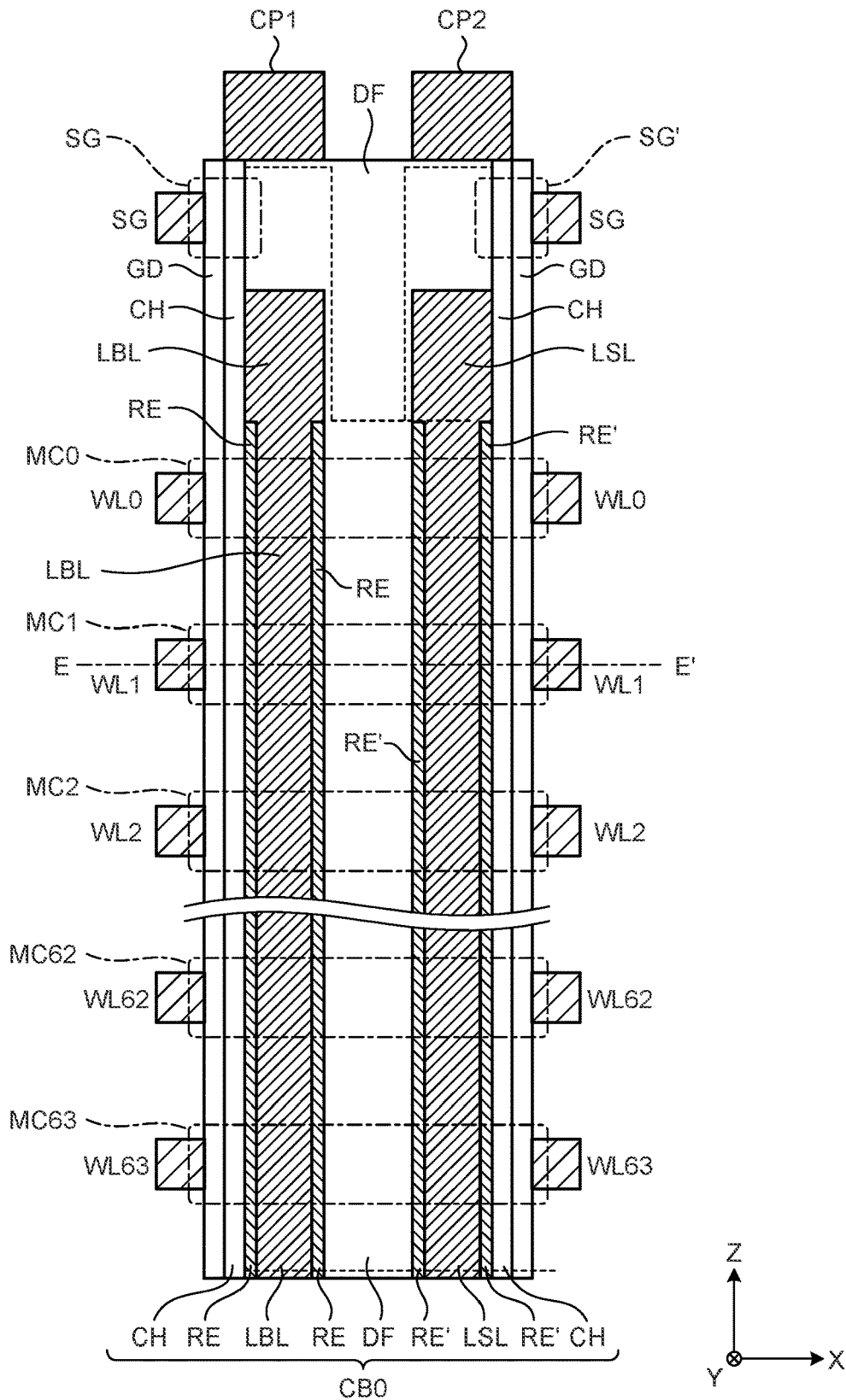
FIG. 15 is a vertical cross-sectional view illustrating a configuration of the cell block in the third embodiment.
Figure 16:
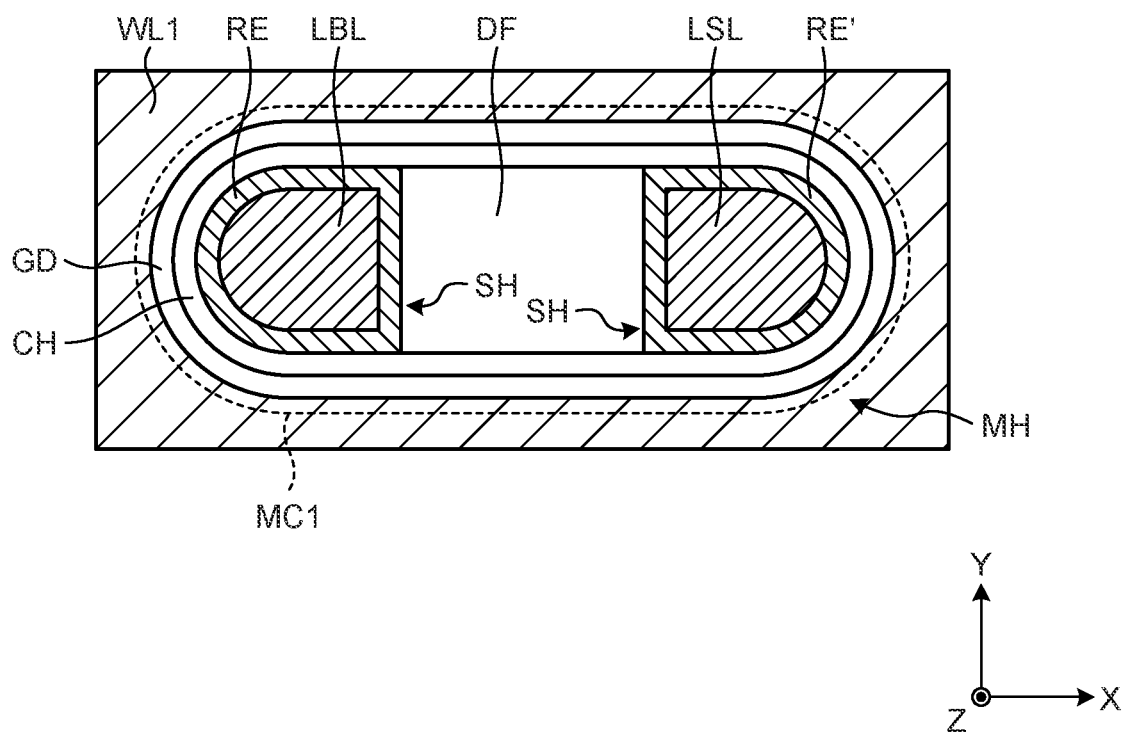
FIG. 16 is a planar cross-sectional view of a configuration of the cell block in the third embodiment.

The cell block CB is configured as illustrated in FIGS. 14 to 16, for example. FIG. 14 is a perspective view illustrating a configuration of the cell block CB, and exemplifies a configuration of the cell block CB0. FIG. 15 is a vertical cross-sectional view illustrating a configuration of the cell block CB, and illustrates an XZ cross section passing through the central axis of the cell block CB. In FIG. 15, illustration of an insulating layer between the word line WL and the word line WL is omitted for simplification. FIG. 16 is a planar cross-sectional view illustrating a configuration of the cell block CB. FIG. 16 illustrates an XY cross section taken along line E-E' in FIG. 15.

As illustrated in FIGS. 14 to 16, the cell block CB0 is similar to that of the second embodiment in that the cell block CB0 is formed of a columnar structure, but is different from that of the second embodiment in that a resistance change film RE' is also disposed on the side surface of the local source line column LSL, and the resistance change film RE' is in contact with the semiconductor film CH.

These cell blocks CB may be manufactured by a manufacturing process different from that of the second embodiment in the following points. The steps up to the step of forming the plurality of memory holes MH are the same, but a specific step of embedding one cell block CB in each memory hole MH is different. After that, the sacrificial layer SF is removed, and the conductive film WL is embedded in the gap formed by the removal, and a very low-cost memory can be realized, which are similar to the second embodiment.

The embedding of one cell block CB is different from that of the second embodiment in the following points as illustrated in FIGS. 14, 15, and 16. The steps up to the step of forming the two left and right subholes SH in the drawing are the same, but are different in that in each of the subhole SH on the right side in the drawing and the subhole SH on the left side in the drawing, the resistance change film RE and RE' are deposited on the inner side of the semiconductor film CH with a chalcogenide-based material (Ge, Sb, or Te) or the like to be in contact with the semiconductor film CH, and the resistance change films RE and RE' are removed to the Z position of the cell block select line SG and the Z position between the cell block select line SG and the conductive film WL. Furthermore, in the subhole SH on the right side in the drawing, the local bit line column LBL having low resistance such as tungsten is filled on inner side of the resistance change film RE', but the local bit line column LBL is removed at the Z position of the cell block select line SG. In the subhole SH on the left side in the drawing, the local source line column LSL having low resistance such as tungsten is filled on inner side of the resistance change film RE, but the local source line column LSL is removed at the Z position of the cell block select line SG.

As a result, at the Z position of the cell block select line SG, the cell block select transistor SG as a connection switch between the bit line BL and the local bit line LBL and a cell block select transistor SG' as a connection switch between the source line SL and the local source line LSL can be formed. In addition, at the Z position corresponding to the conductive film WL, the local bit line column LBL is connected to the local source line column LSL via the resistance change film RE, the semiconductor film CH, and the resistance change film RE', in a manner that the memory cell MC may be formed.

Figure 17:
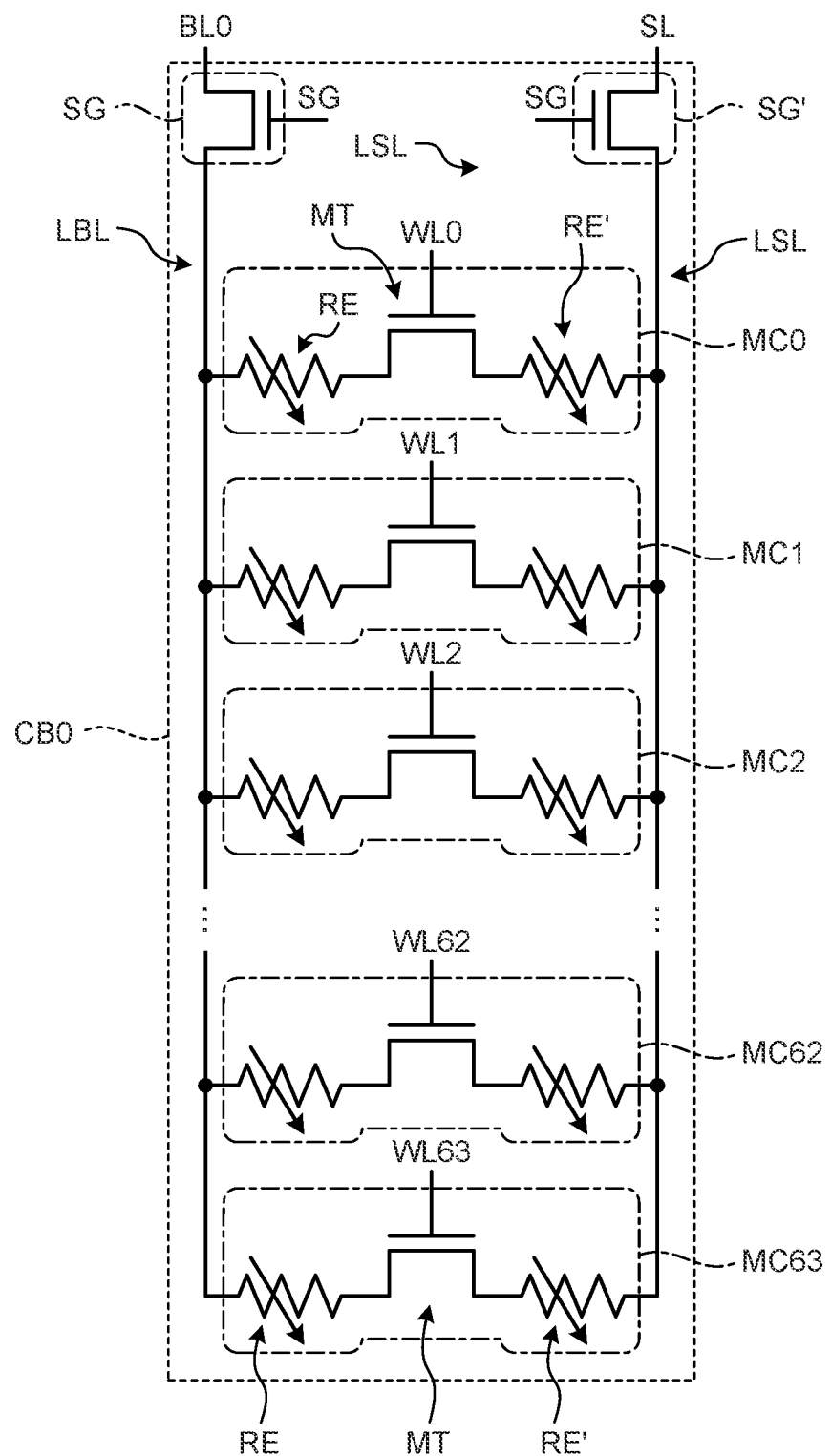
FIG. 17 is a circuit diagram illustrating a configuration of the cell block in the third embodiment.

An equivalent circuit diagram of the cell block CB is as illustrated in FIG. 17. FIG. 17 is a circuit diagram illustrating a configuration of the cell block CB.

As illustrated in the equivalent circuit diagram of FIG. 17, the memory cell MC has a configuration in which the cell transistor MT is sandwiched between two resistance change elements RE and RE'. With this configuration, the processes of forming the subhole SH for the local source line column LSL and the local bit line column LBL, forming the resistance change film RE and RE', and embedding the local source line column LSL and the local bit line column LBL can be performed at one time, the number of manufacturing steps can be reduced, and the manufacturing cost can be reduced.

Figure 18:
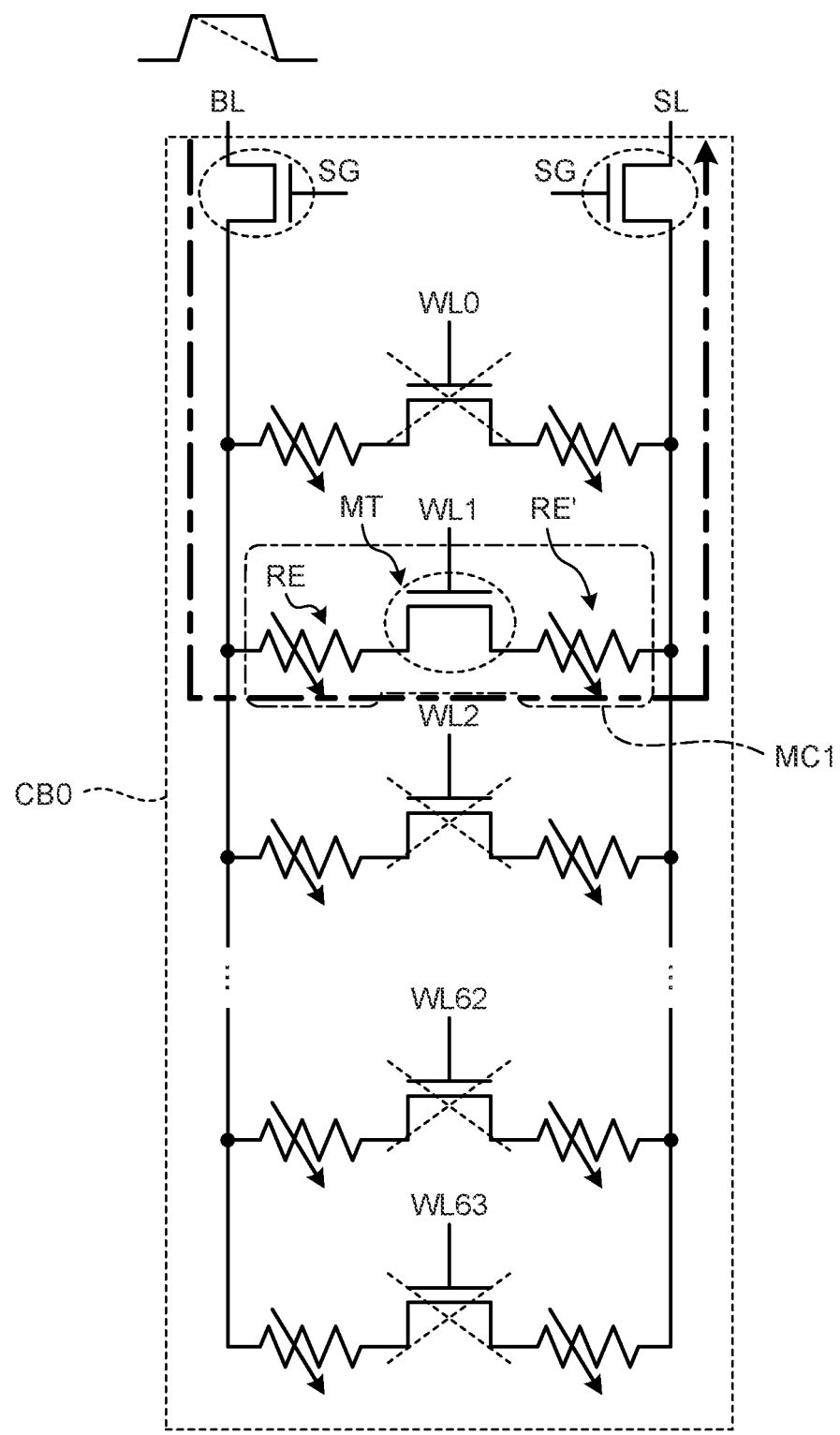
FIG. 18 is a circuit diagram illustrating an operation of the cell block in the third embodiment.

However, in the memory cell MC illustrated in FIG. 17, since the two resistance change film RE and RE' are simultaneously switched, as illustrated in FIG. 18, two voltages are applied at the time of set. Therefore, there is a possibility that the total set voltage in the memory cell MC increases, but when a phase change material or a superlattice material is used for the resistance change film RE and RE', the set voltage of each resistance change film can be set to about 0.8 V to 1.5 V, and thus the influence is small. In addition, since the reset current is in series, the same current only flows, and thus there is substantially no influence. Furthermore, in a case where the resistance change elements RE and RE' are likely to change from a high resistance to a low resistance, even if one of the resistance change elements RE and RE' is reduced in resistance, if the other can maintain a high resistance state, the reliability of the data holding characteristic can be significantly improved. FIG. 18 is a circuit diagram illustrating the operation of the cell block CB.

As described above, in the third embodiment, one cell block CB includes a columnar structure disposed in the memory hole MH. Each memory cell in the cell block CB is configured to include a plurality of resistance change elements. As a result, the number of manufacturing steps can be reduced, and the manufacturing cost can be reduced, in a manner that a memory with a lower cost can be realized.

Fourth Embodiment

Next, the nonvolatile semiconductor memory device 1 according to a fourth embodiment will be described. Hereinafter, portions different from those of the first embodiment and the third embodiment will be mainly described.

In the third embodiment, a configuration of a cell array in which one cell block CB is disposed in the memory hole MH is exemplified, but in the fourth embodiment, a method of manufacturing a cell array in which one cell block CB is formed in the memory hole MH is exemplified.

Figure 19A:
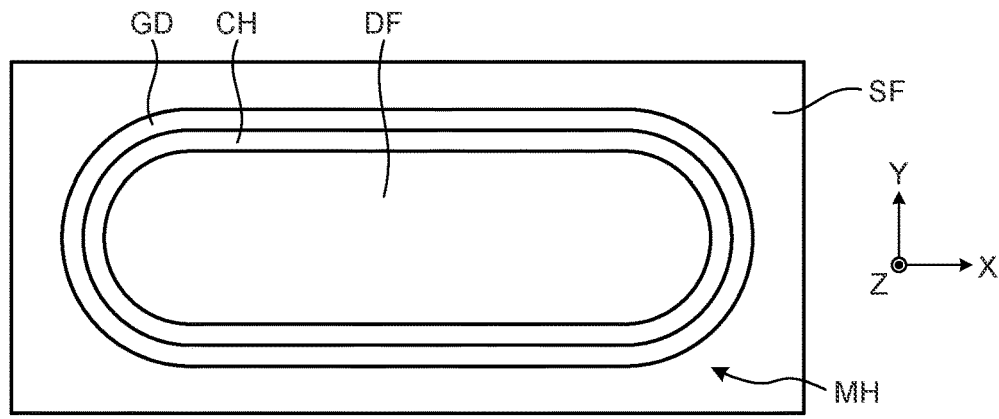
FIGS. 19A to 19C are planar cross-sectional views illustrating a method for manufacturing a cell array in a fourth embodiment.
Figure 19B:
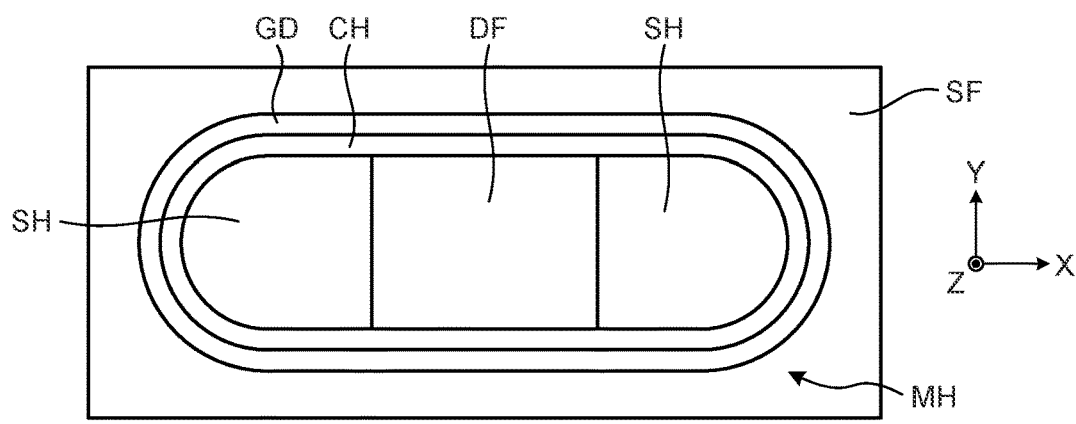
Figure 19C:
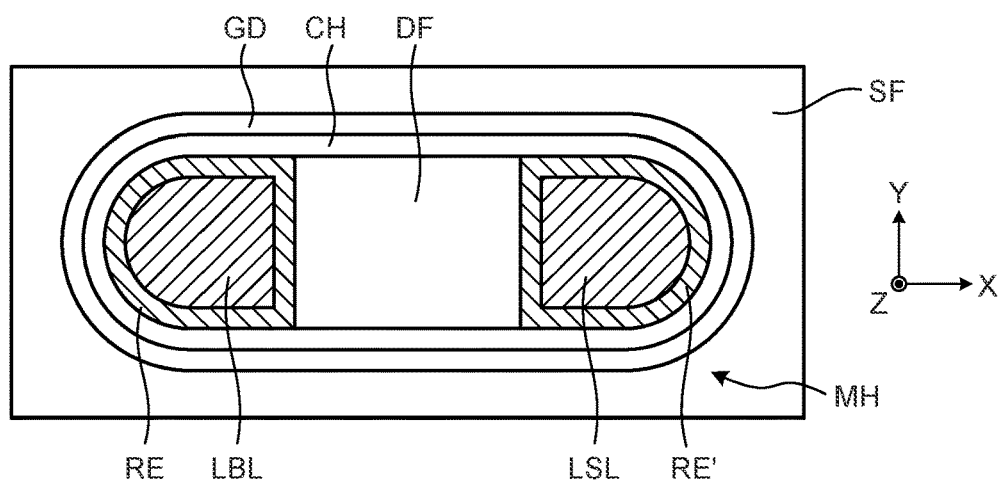

The cell array 5 including the cell block CB illustrated in FIGS. 14 to 16 is manufactured as illustrated in FIGS. 19A to 19C. Each of FIGS. 19A to 19C is an XY cross-sectional view illustrating the method of manufacturing the cell array 5, and illustrates an XY cross section cut at the Z position of a sacrificial film SF corresponding to the line E-E' of FIG. 15.

The insulating layer 222 and a sacrificial layer SF are alternately stacked a plurality of times on the +Z side of the semiconductor substrate 21 (see FIG. 3) to form a stacked body. The insulating layer 222 is formed of, for example, a material containing silicon oxide as a main component, and the sacrificial layer SF is formed of, for example, a material containing silicon nitride as a main component. In order to form the cell block CB, the plurality of memory holes MH each penetrating the stacked body in the Z direction are formed. Each memory hole MH may be formed in a substantially elliptical shape with the X direction as a longitudinal direction in the XY cross-sectional view. As illustrated in FIG. 19A, the gate oxide film GD is deposited on the outer periphery of the sidewall of each memory hole MH, the semiconductor film CH is deposited on inner side of the gate oxide film GD, and then the on inner side is filled with the insulating film DF, and then the left and right portions in the drawing are removed while the central portion of the insulating film DF in the drawing is left. By selectively masking the left and right portions of the insulating film DF in the drawing with an exposing resist pattern using lithography, etching processing is performed to remove the left and right portions in the drawing while the central portion in the drawing in the insulating film DF is left. As illustrated in FIG. 19B, two subholes SH are formed. After that, as illustrated in FIG. 19C, in each of the subhole SH on the right side in the drawing and the subhole SH on the left side in the drawing, the resistance change film RE and RE' are deposited on the inner side of the semiconductor film CH with a phase change material such as a chalcogenide-based material (Ge, Sb, or Te) to be in contact with the semiconductor film CH, and the resistance change films RE and RE' are removed to the Z position of the cell block select line SG and the Z position between the cell block select line SG and the conductive film WL. Also with respect to the semiconductor film CH, a portion up to the Z position in the vicinity of the center in the X direction and immediately above the conductive film WL is removed. Furthermore, in the subhole SH on the right side in the drawing, the local bit line column LBL having low resistance such as tungsten is filled on inner side of the resistance change film RE', but the local bit line column LBL is removed at the Z position of the cell block select line SG, and the insulating film DF is embedded. In the subhole SH on the left side in the drawing, the local source line column LSL having low resistance such as tungsten is filled on inner side of the resistance change film RE, but the local source line column LSL is removed at the Z position of the cell block select line SG, and the insulating film DF is embedded. After that, the sacrificial layer SF is removed, and the conductive film WL is embedded in the gap formed by the removal, in a manner that the cell array 5 including the cell block CB illustrated in FIGS. 14 to 16 is manufactured.

As described above, in the fourth embodiment, in the manufacturing method in which one cell block CB is formed in the memory hole MH, the resistance change film RE and RE' may be deposited simultaneously. The embedding of the local bit line column LBL and the embedding of the local source line column LSL may be performed simultaneously. As a result, since the number of manufacturing steps can be reduced and the manufacturing cost can be reduced, a low-cost memory can be realized.

Fifth Embodiment

Next, the nonvolatile semiconductor memory device 1 according to a fifth embodiment will be described. Hereinafter, portions different from those of the first embodiment and the fourth embodiment will be mainly described.

In the first embodiment, a configuration of a cell array in which two cell blocks CB are disposed in the memory hole MH is exemplified, but in the fifth embodiment, a method of manufacturing a cell array in which two cell blocks CB are formed in the memory hole MH is exemplified.

The cell array 5 including the cell block CB illustrated in FIGS. 4 to 6 is manufactured as illustrated in FIGS. 20A to 20D. Each of FIGS. 20A to 20D is an XY cross-sectional view illustrating the method of manufacturing the cell array 5, and illustrates an XY cross section cut at the Z position of the sacrificial film SF corresponding to the line C-C' of FIG. 5.

Figure 20A:
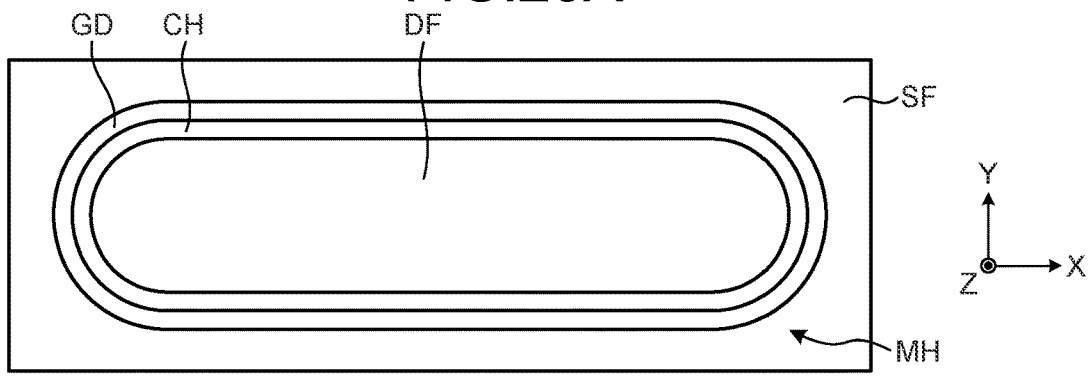
FIGS. 20A to 20D are planar cross-sectional views illustrating a method for manufacturing a cell array in a fifth embodiment.
Figure 20B:
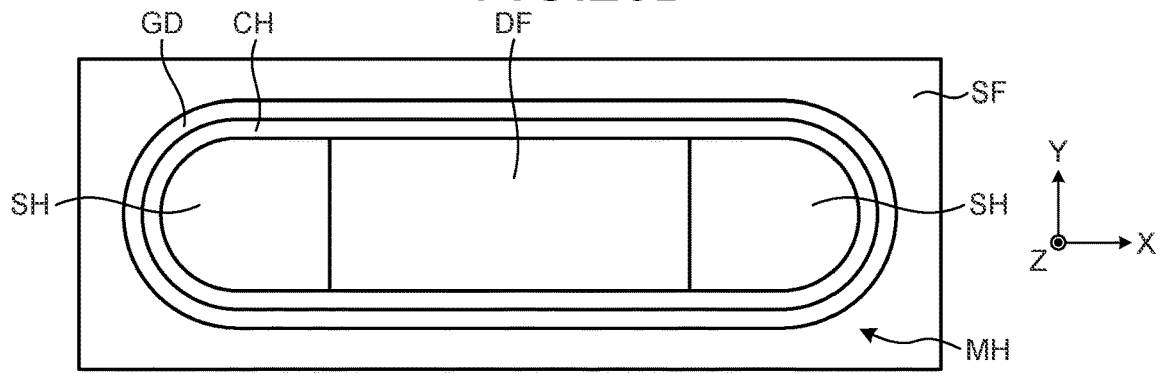
Figure 20C:
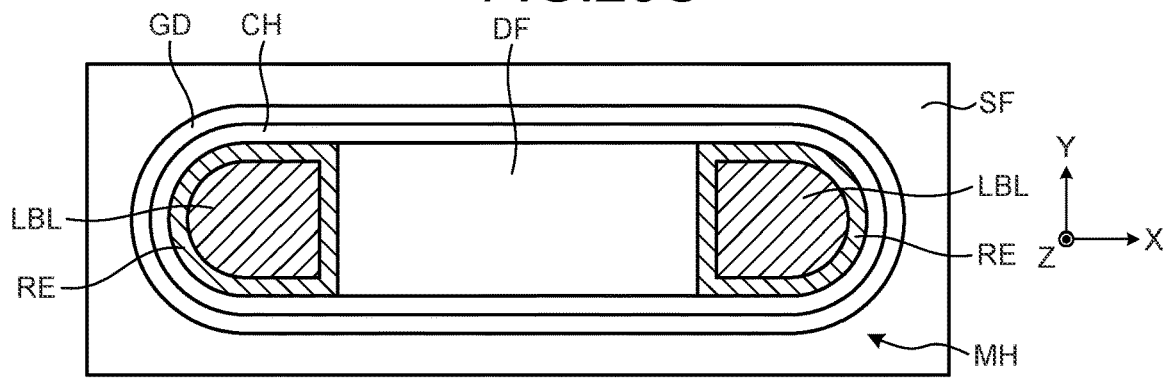
Figure 20D:
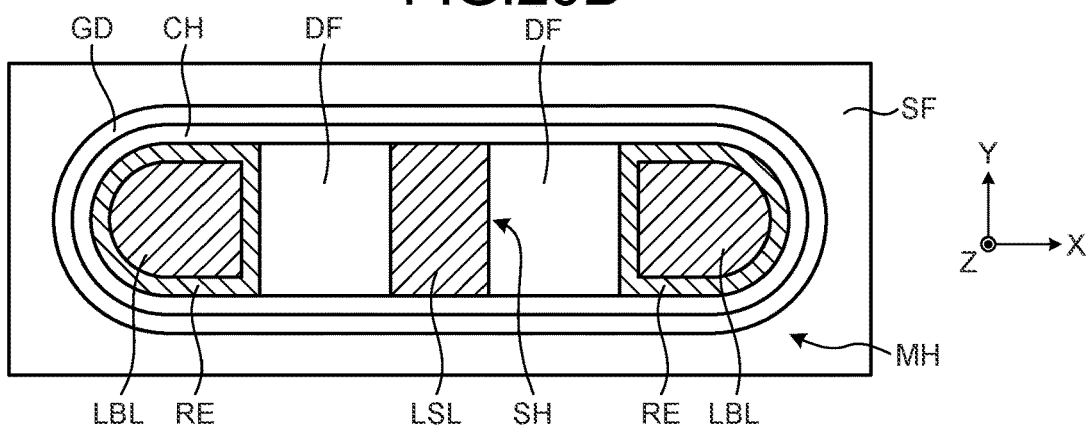

The insulating layer 222 and a sacrificial layer SF are alternately stacked a plurality of times on the +Z side of the semiconductor substrate 21 (see FIG. 3) to form a stacked body. The insulating layer 222 is formed of, for example, a material containing silicon oxide as a main component, and the sacrificial layer SF is formed of, for example, a material containing silicon nitride as a main component. In order to form the cell block CB, the plurality of memory holes MH each penetrating the stacked body in the Z direction are formed. Each memory hole MH may be formed in a substantially elliptical shape with the X direction as a longitudinal direction in the XY cross-sectional view. As illustrated in FIG. 20A, the gate oxide film GD is deposited on the outer periphery of the sidewall of each memory hole MH, the semiconductor film CH is deposited on inner side of the gate oxide film GD, and then the on inner side is filled with the insulating film DF, and then the left and right portions in the drawing are removed while the central portion of the insulating film DF in the drawing is left. By selectively masking the central portion of the insulating film DF in the drawing with a resist pattern using lithography, etching processing is performed to remove the left and right portions in the drawing while the central portion of the insulating film DF in the drawing is left. As illustrated in FIG. 20B, two left and right subholes SH in the drawing are formed. As illustrated in FIG. 20C, in the left and right subholes SH in the drawing, the resistance change film RE is deposited on inner side of the semiconductor film CH to be in contact with the semiconductor film CH, but at the Z position of the cell block select line SG and the Z position between the cell block select line SG and the conductive film WL, the resistance change film RE is removed (see in FIGS. 6A and 6B). Also with respect to the semiconductor film CH, a portion up to the Z position in the vicinity of the center in the X direction and immediately above the conductive film WL is removed. The local bit line column LBL is filled further on inner side, but the local bit line column LBL is removed and the insulating film DF is embedded at the Z position of the cell block select line SG (see FIG. 6A). As illustrated in FIG. 20D, the central portion in the drawing is removed while the left and right portions of the insulating film DF in the drawing are left. By selectively masking the central portion of the insulating film DF in the drawing with an exposing resist pattern using lithography, etching processing is performed to remove the central portion in the drawing while the left and right portions of the insulating film DF in the drawing are left. As a result, the subhole SH at the center in the drawing is formed. The local source line column LSL is filled in the subhole SH at the center in the drawing. The semiconductor film CH is not in contact at the Z position of the cell block select line SG and the Z position between the cell block select line SG and the conductive film WL (see FIGS. 6A and 6B), but the semiconductor film CH is in contact at the Z position corresponding to the conductive film WL (see FIG. 6C). After that, the sacrificial layer SF is removed, and the conductive film WL is embedded in the gap formed by the removal, in a manner that the cell array 5 including the cell block CB illustrated in FIGS. 4 to 6 is manufactured.

As described above, in the fifth embodiment, in the manufacturing method in which two cell blocks CB are formed in the memory hole MH, the resistance change film RE of the two cell blocks CB may be deposited simultaneously. The embedding of the local bit line column LBL of the two cell blocks CB may be performed simultaneously. As a result, the number of manufacturing steps can be reduced, and the manufacturing cost can be reduced, in a manner that a low-cost memory can be realized.

Figure 21A:
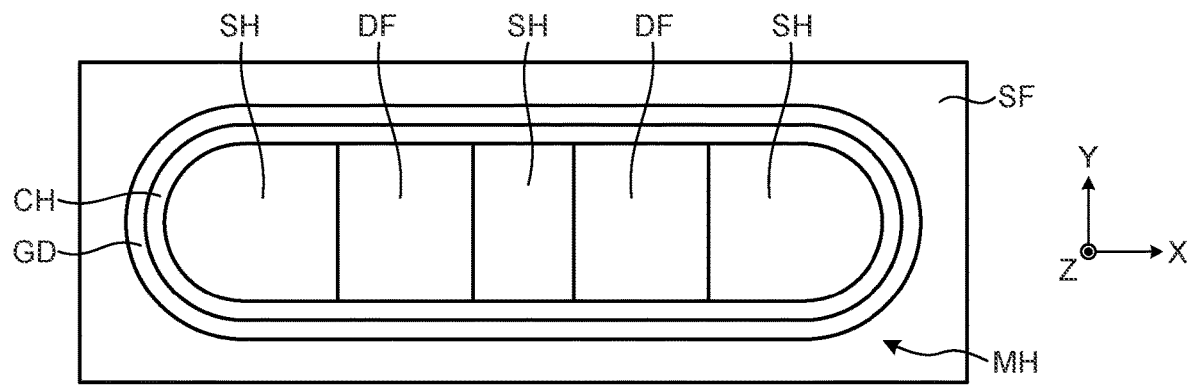
FIGS. 21A to 21C are planar cross-sectional views illustrating a method for manufacturing a cell array in a modification of the fifth embodiment.
Figure 21B:
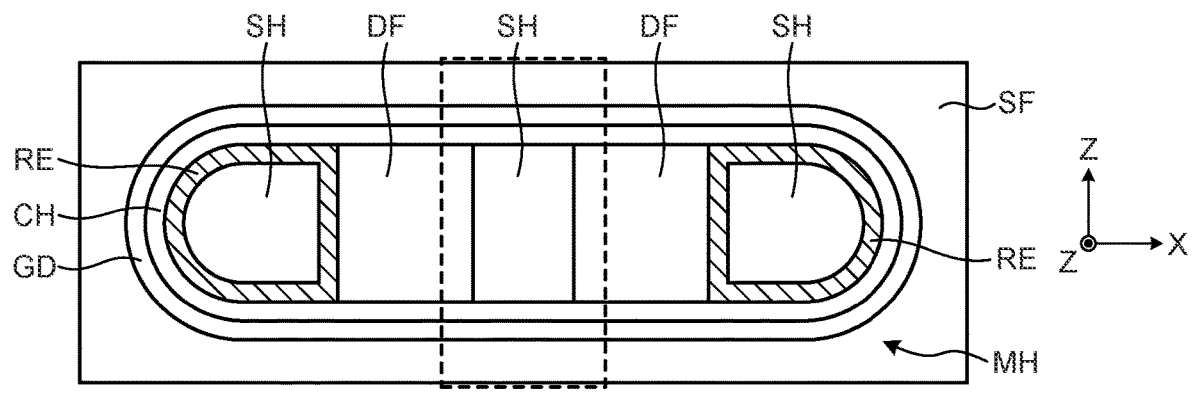
Figure 21C:
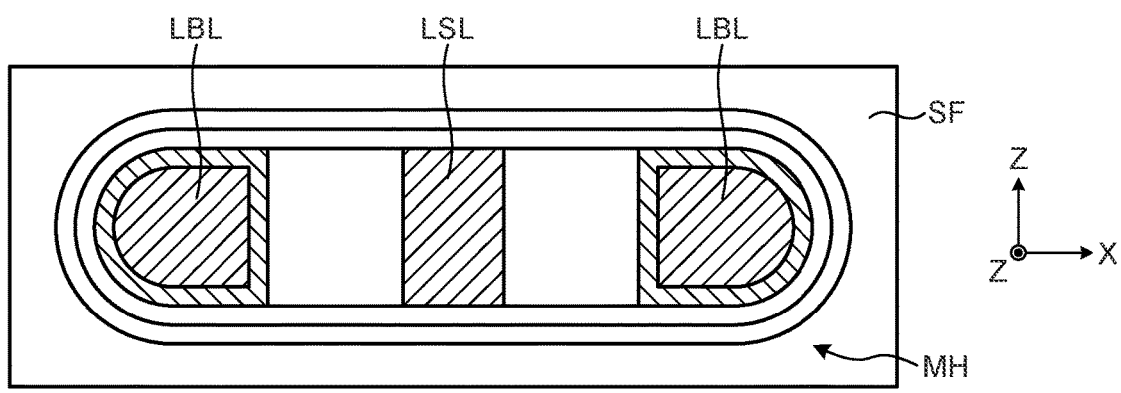

If there is misalignment in the lithography of two times, the distance between the local source line column LSL and the local bit line column LBL changes (the semiconductor channel length changes), and the operation characteristics of the cell block CB may vary. In consideration of this, in the cell array 5, the steps illustrated in FIGS. 21A to 21C may be performed instead of the steps illustrated in FIGS. 20B to 20D. In this case, etching processing is performed using a resist pattern that masks a central portion and a portion between the left and right of the insulating film DF in the drawing illustrated in FIG. 20A, in a manner that three subholes SH at the center and the left and right in the drawing are formed as illustrated in FIG. 21A. As indicated by a dotted line in FIG. 21B, the resistance change film RE is deposited in the left and right subholes SH in the drawing by masking with a resist pattern selectively covering the center subhole SH in the drawing, and the resistance change film RE is removed at the Z position of the cell block select line SG and the Z position between the cell block select line SG and the conductive film WL (see FIGS. 6A and 6B). After that, as illustrated in FIG. 21C, the masking is removed, and in the left and right subholes SH in the drawing, the local bit line columns LBL are filled further on inner side, and in the center subhole SH in the drawing, the local source line columns LSL are filled. The local bit line column LBL is removed and the insulating film DF is embedded at the Z position of the cell block select line SG (see FIG. 6A). In the left and right subholes SH in the drawing, the local bit line column LBL is removed at the Z position of the cell block select line SG.

In this manner, the three subholes SH at the center and the left and right in the drawing can be formed simultaneously, and the subholes SH can be easily formed in a manner that the distance between the local source line column LSL and the local bit line column LBL becomes a desired distance. As a result, variations in the operation characteristics of the cell block CB can be suppressed.

Sixth Embodiment

Next, the nonvolatile semiconductor memory device 1 according to a sixth embodiment will be described. Hereinafter, portions different from those of the first embodiment and the fifth embodiment will be mainly described.

In the first embodiment, the configuration of the nonvolatile semiconductor memory device 1 is exemplified, but in the sixth embodiment, the operation of the nonvolatile semiconductor memory device 1 with the configuration is exemplified.

Figure 22:
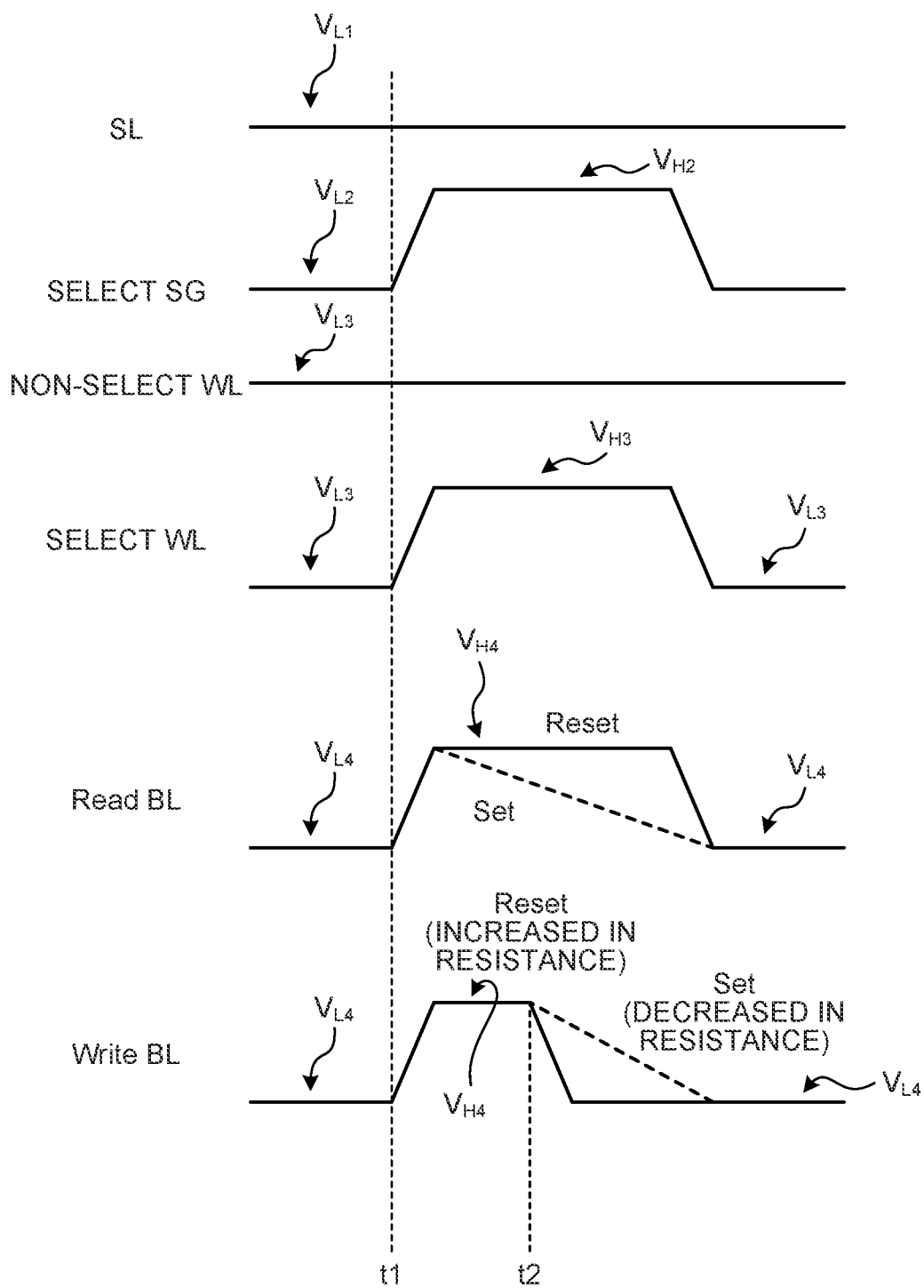
FIG. 22 is a waveform diagram illustrating an operation of a nonvolatile semiconductor memory device according to a sixth embodiment.

Specifically, the nonvolatile semiconductor memory device 1 may operate as illustrated in FIG. 22. FIG. 22 illustrates an operation example of a string block.

In FIG. 22, before timing t1, the operation at the time of standby is performed. The row decoder 6 maintains the source line SL at a low level $V_{L1}$ (for example, $V_{L1}$=0V), maintains the cell block select line SG at a low level $V_{L2}$ (for example, $V_{L2}$=0 V or negative potential), and maintains both the non-select word line WL and the select word line WL at a low level $V_{L3}$ (for example, $V_{L3}$=0V). The low level $V_{L3}$ of the word line WL may be a negative potential (for example, −2 V) in order to improve the off characteristic of the cell transistor MT. Since the cell block select transistor SG is maintained in the off state, the bit line BL may be 0 V or any potential.

At the timing t1, the read/write operation is started. The row decoder 6 causes transition of the signal of the select cell block select line SG from the low level $V_{L2}$ to a high level $V_{H2}$ and selects the cell block CB0.

When the memory cell MC1 corresponding to the word line WL1 is selected (see FIG. 8), the signal of the word line WL1 caused to transition from the low level $V_{L3}$ to a high level $V_{H3}$, and the signals of the other word lines WL0, WL2 to WLA63 are maintained at the low level $V_{L3}$. In the signal of the word line WL, the low level $V_{L3}$ is the non-select potential, and the high level $V_{H3}$ is the select potential.

As a result, the memory cell MC1 corresponding to the cell block select line SG and the word line WL1 in the cell block CB0 can access. That is, the bit line BL and the source line SL are conducted via the resistance change element RE of the select memory cell MC1. When one memory cell MC is selected, the select bit line BL0 of the plurality of bit lines BL0 and BL1 is increased from a low level $V_{L4}$ to a high level $V_{H4}$ while the source line SL is fixed at the low level $V_L$, and the remaining bit lines are fixed at the low level $V_{L4}$, a current flows between the select bit line BL and the source line SL. The potential of the bit line BL is in a manner that the high level $V_{H4}$ is the select potential and the low level $V_{L4}$ is the non-select potential.

At the time of reading, at the timing t1, the row decoder 6 increases the select bit line BL from the low level $V_{L4}$ to the high level $V_{H4}$ and then performs floating. Accordingly, when the select memory cell MC is in the high resistance state (reset state), the potential of the bit line BL is unlikely to decrease and is maintained near the high level $V_{H4}$. As a result, the sense amplifier 7 detects that the potential of the bit line BL is at the high level $V_{H4}$, and "1" is read from the memory cell MC. When the memory cell MC is in the low resistance state (set state), the potential of the bit line BL decreases to the low level $V_{L4}$. As a result, the sense amplifier 7 detects that the potential of the bit line BL is at the low level $V_{L4}$, and "0" is read from the memory cell MC. At this time, the number of transistors through which the cell current passes in the cell block CB0 is two.

At the time of writing, at the timing t1, the sense amplifier 7 increases the potential of the bit line BL to be written from the low level $V_{L4}$ to the high level $V_{H4}$, and causes a current to flow through the select memory cell MC. Also at this time, the number of transistors through which the cell current passes in the cell block CB0 is two.

At timing t2 after the timing t1, if the potential of the bit line BL is steeply decreased from the high level $V_{H4}$ to the low level $V_{L4}$, the resistance change element (phase change element) RE of the selected memory cell MC is rapidly cooled and amorphized (increased in resistance) in the sense amplifier 7. As a result, the memory cell MC becomes the high resistance state (reset state), and "1" is written to the memory cell MC. If the potential of the bit line BL is slowly decreased from the high level $V_{H4}$ to the low level $V_{L4}$, the resistance change element (phase change element) RE of the selected memory cell MC is rapidly cooled and crystallized (decreased in resistance) in the sense amplifier 7. As a result, the memory cell MC becomes the low resistance state (set state), and "0" is written to the memory cell MC.

After that, in response to the completion of the read/write, each signal may be returned to the level before the transition. For example, the signal of the select local string select line SG is returned from a high level $V_{H1}$ to the low level $V_{L1}$. The signal of the non-select word line WL remains maintained at the low level $V_{L3}$. The signal of the select word line WL is returned from the high level $V_{H3}$ to the low level $V_{L3}$.

As described above, in the sixth embodiment, in the nonvolatile semiconductor memory device 1, the number of transistors through which the cell current in the cell block CB0 passes during the read/write operation for the select memory cell MC is two. That is, since the path length of the semiconductor film through which the cell current passes is suppressed during the read/write operation, the cell current can be easily increased, and the set/reset drive operation of the resistance change element RE is easy.

Figure 23A:
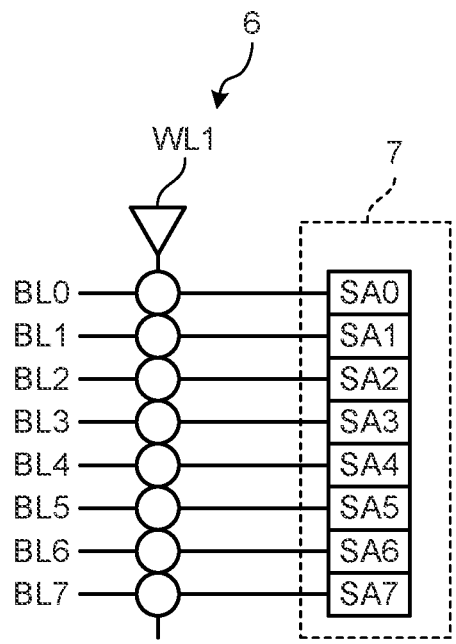
FIGS. 23A to 23C are circuit diagrams illustrating a configuration of a sense amplifier in the sixth embodiment.
Figure 23B:
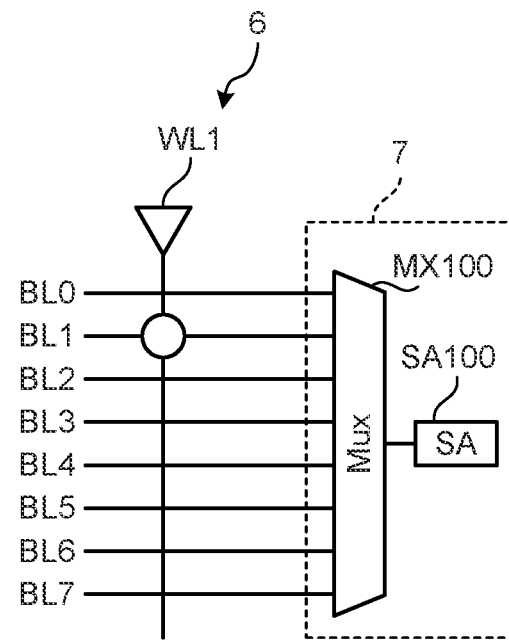
Figure 23C:
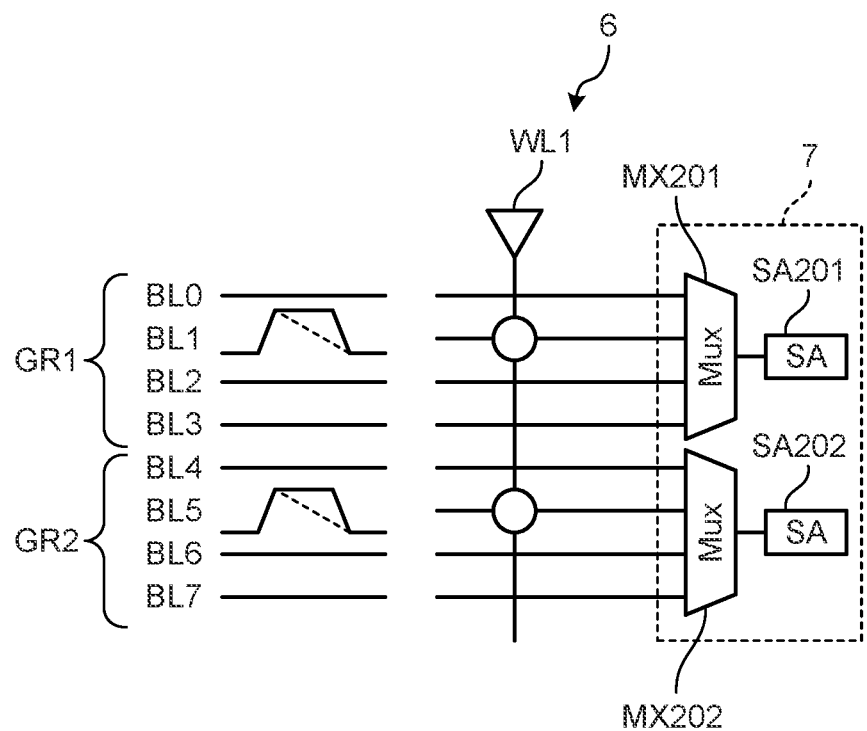

In the first to sixth embodiments, the configuration in the sense amplifier 7 is not mentioned, but the sense amplifier 7 may be configured as illustrated in, for example, FIGS. 23A to 23C. FIGS. 23A to 23C are circuit diagrams illustrating a configuration of a sense amplifier in a modification of the sixth embodiment. FIGS. 23A to 23C exemplify the case where the number of the bit lines BL is eight, but the number of the bit lines BL may be two to seven or nine or more.

As described above, since it is sufficient to apply the voltage of the select potential to the bit line BL to be written and to be read, the sense amplifier 7 may be configured to select all the bit lines BL0 to BL7 as illustrated in FIG. 23A. Alternatively, as illustrated in FIG. 23B, one bit line BL may be selected. Alternatively, as illustrated in FIG. 23C, a plurality of bit lines BL selected for each group may be selected from the plurality of grouped bit lines BL.

The sense amplifier 7 illustrated in FIG. 23A includes a plurality of sense amplifier modules SA0 to SA7 corresponding to the plurality of bit lines BL0 to BL7. Each of the sense amplifier modules SA0 to SA7 is connected to the corresponding bit line BL.

For example, when the low level $V_{L3}$ (see FIG. 22), which is the select potential, is supplied from a driver WL1 to the word line WL1 in the row decoder 6, the sense amplifier 7 sets each of the bit lines BL0 to BL7 to the high level $V_{H4}$, which is the select potential. As a result, as indicated by circles in FIG. 23A, each memory cell MC at a position where the word line WL1 intersects the plurality of bit lines BL0 to BL7 is selected, and the cell currents flowing through the plurality of bit lines BL0 to BL7 is detected in parallel by the plurality of sense amplifier modules SA0 to SA7. As a result, the sense amplifier 7 can perform the sense amplifier operation at high speed.

Alternatively, the sense amplifier 7 illustrated in FIG. 23B includes a multiplexer MX100 and a sense amplifier module SA100. The multiplexer MX100 is connected between the plurality of bit lines BL0 to BL7 and the sense amplifier module SA100. The sense amplifier module SA100 is shared by the plurality of bit lines BL0 to BL7 via the multiplexer MX100. As a result, when the cell array 5 is subdivided into a plurality of subarrays, the circuit area of the sense amplifier 7 can be reduced.

For example, as illustrated in FIG. 23B, when the low level $V_{L3}$ (see FIG. 22), which is the select potential, is supplied from the driver WL1 to the word line WL1 in the row decoder 6, the sense amplifier 7 sets one bit line BL1 to the high level $V_{H4}$, which is the select potential, and sets the other bit lines BL0 and BL2 to BL7 to the low level $V_{L4}$, which is the non-select potential. In response to this, the sense amplifier 7 controls the multiplexer MX100, selects the bit line BL1 to which the select potential is supplied, and connect it to the sense amplifier module SA100. As a result, as indicated by circles in FIG. 23B, each memory cell MC at the position where the word line WL1 and the select bit line BL1 intersect is selected, and each memory cell MC at the position where the word line WL1 and the non-select bit lines BL0 and BL2 to BL7 intersect is unselected. The cell current flowing through the select bit line BL1 is detected by the sense amplifier module SA100 via the multiplexer MX100.

Alternatively, the sense amplifier 7 illustrated in FIG. 23C includes a plurality of multiplexers MX201 and MX202 and a plurality of sense amplifier modules SA201 and SA202. The multiplexer MX201 is connected between the plurality of bit lines BL0 to BL3 and the sense amplifier module SA201. The multiplexer MX202 is connected between the plurality of bit lines BL4 to BL7 and the sense amplifier module SA202. That is, the plurality of bit lines BL0 to BL3 can be considered to be grouped in a group GR1 corresponding to the sense amplifier module SA201, and the plurality of bit lines BL4 to BL7 can be considered to be grouped in a group GR2 corresponding to the sense amplifier module SA202.

The sense amplifier module SA201 is shared by the plurality of bit lines BL0 to BL3 via the multiplexer MX201. The sense amplifier module SA202 is shared by the plurality of bit lines BL4 to BL7 via the multiplexer MX202. As a result, when the cell array 5 is subdivided into a plurality of subarrays, the circuit area of the sense amplifier 7 can be reduced.

For example, as illustrated in FIG. 23C, when the low level $V_{L3}$ (see FIG. 22), which is the select potential, is supplied from the driver WL1 to the word line WL1 in the row decoder 6, the sense amplifier 7 sets one bit line BL1 to the high level $V_{H4}$, which is the select potential, and sets the other bit lines BL0 and BL2 to BL3 to the low level $V_{L4}$, which is the non-select potential, in the group GR1. In response to this, the sense amplifier 7 controls the multiplexer MX201, selects the bit line BL1 to which the select potential is supplied, and connect it to the sense amplifier module SA201. Similarly, in the group GR2, the sense amplifier 7 sets one bit line BL5 to the high level $V_{H4}$, which is the select potential, and sets the other bit lines BL4, BL6 to BL7 to the low level $V_{L4}$, which is the non-select potential. In response to this, the sense amplifier 7 controls the multiplexer MX202, selects the bit line BL5 to which the select potential is supplied, and connect it to the sense amplifier module SA202.

As a result, as indicated by circles in FIG. 23C, for the group GR1, each memory cell MC at the position where the word line WL1 and the select bit line BL1 intersect is selected, and each memory cell MC at the position where the word line WL1 and the non-select bit lines BL0 and BL2 to BL3 intersect is unselected. The cell current flowing through the select bit line BL1 is detected by the sense amplifier module SA201 via the multiplexer MX201. Similarly, for the group GR2, each memory cell MC at the position where the word line WL1 and the select bit line BL5 intersect is selected, and each memory cell MC at the position where the word line WL1 and the non-select bit lines BL4 and BL6 to BL7 intersect is unselected. The cell current flowing through the select bit line BL5 is detected by the sense amplifier module SA202 via the multiplexer MX202.

In addition, in the nonvolatile semiconductor memory device 1, when the cell array 5 is subdivided, the area of the page buffer (sense amplifier) connected to the bit line BL end can also be reduced. As described above, since it is sufficient to apply a voltage only to the bit line BL to be written and to be read, the reading/writing of all the bit lines BL may be performed like a three-dimensional flash memory, one bit line BL may be selected and performed like a cross-point memory, or any bit line BL may be selected and read/written. For example, when one of the eight bit lines BL is read/written and then the other bit line BL is gradually read/written and read/written in a time division manner, a page buffer (sense amplifier) that performs reading/writing can be shared by the eight bit lines BL, in a manner that an effect of reducing the page buffer area even when the number of divisions of the bit line BL is large is produced.

Seventh Embodiment

Next, the nonvolatile semiconductor memory device 1 according to a seventh embodiment will be described. Hereinafter, portions different from those of the first embodiment and the sixth embodiment will be mainly described.

In the first embodiment, a configuration in which the resistance change films of the respective cell blocks are integrated is exemplified, but in the seventh embodiment, a configuration in which the resistance change film of each cell block is divided into a plurality of resistance change films is exemplified.

For example, when a resistance change film is present between the memory cells MC adjacent in the Z direction, there is no problem as long as the resistance change film is in a high resistance state. However, when the Z distance between the word lines WL adjacent in the Z direction is short, the resistance change film between the memory cells MC adjacent in the Z direction may reduce the resistance due to the influence of the electric field of the word line WL or the like. If there is a portion in the low resistance state in the resistance change film between the memory cells MC adjacent in the Z direction, there is a possibility that a disturbance current (leakage current) flows between the memory cells MC. In a case where the select memory cell is in the high resistance state (reset state) and the adjacent non-select memory cell is in the low resistance state (set state), if a disturbance current flows between the memory cells MC adjacent in the Z direction, the total cell current becomes a current corresponding to the set state, and there is a possibility that the sense amplifier 7 erroneously determines the state as the set state.

Figure 24:
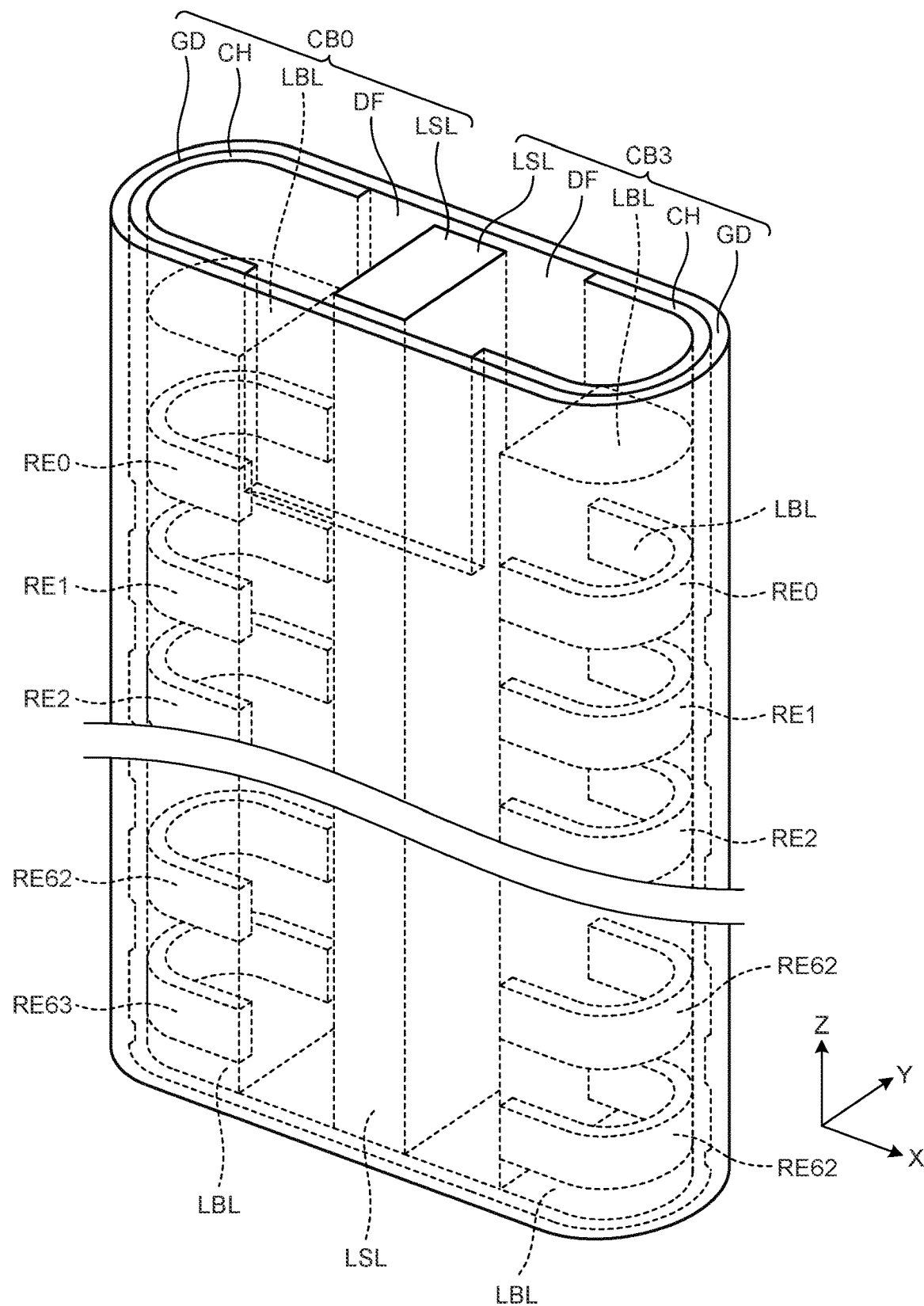
FIG. 24 is a perspective view illustrating a configuration of a cell block in a seventh embodiment.
Figure 25:
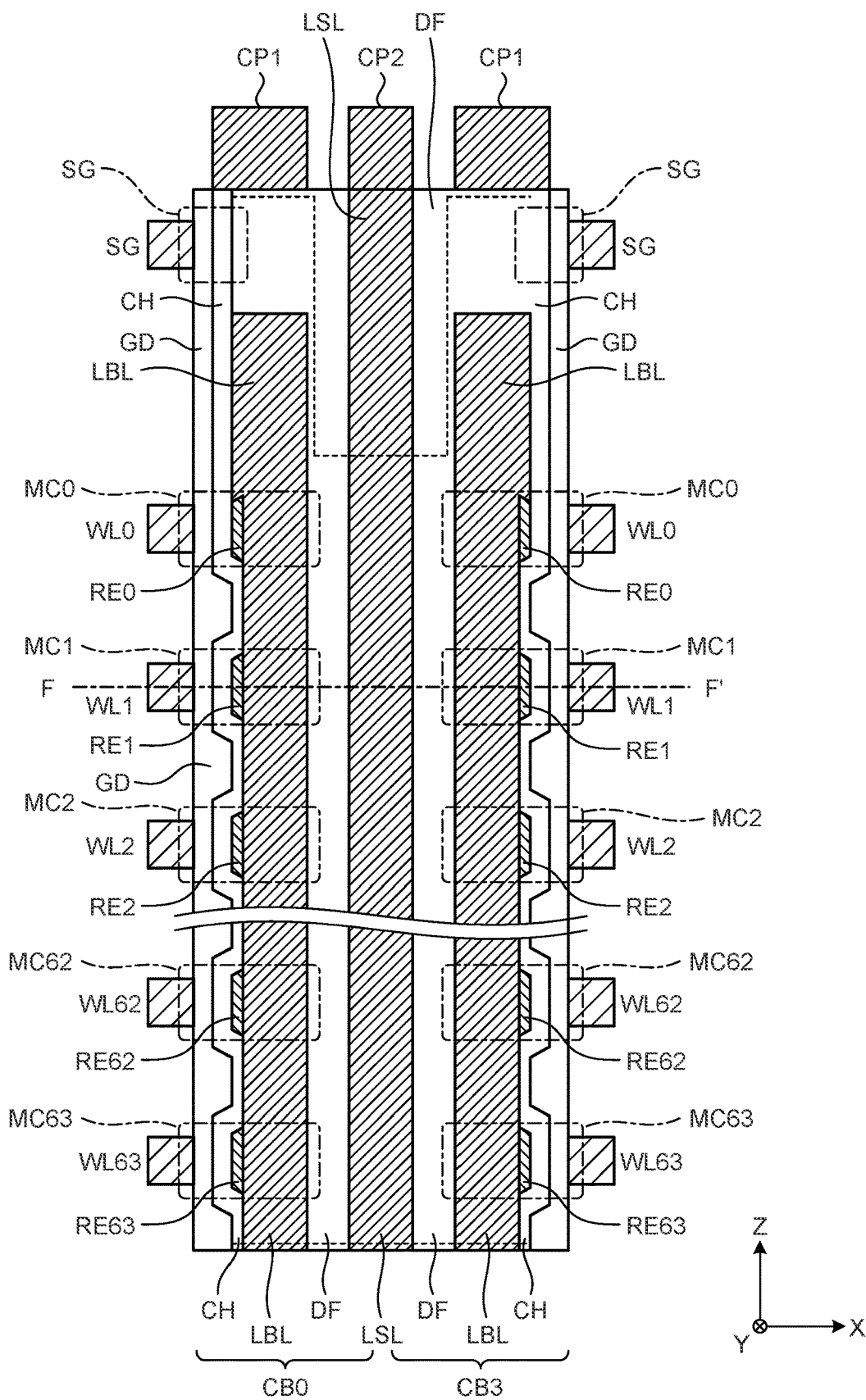
FIG. 25 is a vertical cross-sectional view illustrating a configuration of the cell block in the seventh embodiment.
Figure 26:
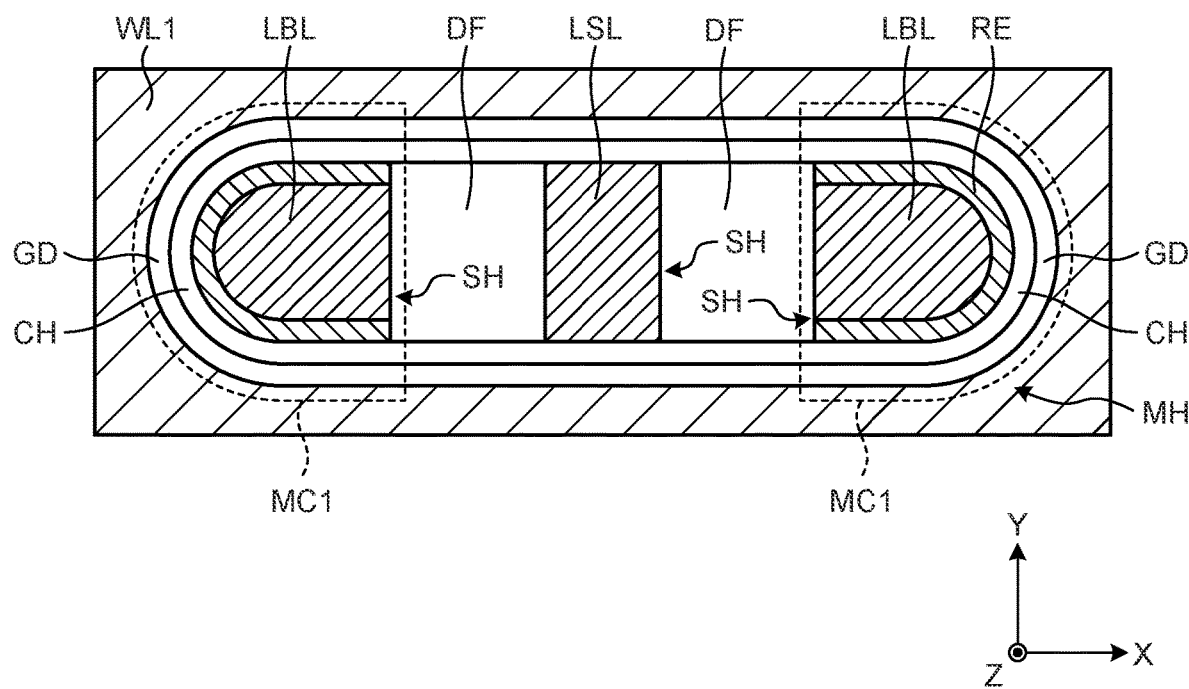
FIG. 26 is a planar cross-sectional view illustrating a configuration of the cell block in the seventh embodiment.

Considering that, in the seventh embodiment, the cell block CB may be configured as illustrated in FIGS. 24 to 26. FIG. 24 is a perspective view illustrating a configuration of the cell block CB, and exemplifies a configuration of the cell blocks CB0 and CB3. FIG. 25 is a vertical cross-sectional view illustrating a configuration of the cell block CB, and illustrates an XZ cross section passing through the central axis of each of the cell blocks CB0 and CB3. In FIG. 25, illustration of an insulating layer between the word line WL and the word line WL is omitted for simplification. FIG. 26 is a planar cross-sectional view illustrating a configuration of the cell block CB. FIG. 26 illustrates an XY cross section taken along line F-F' in FIG. 25.

In each cell block CB, it is desirable to have a structure in which the resistance change film is divided into a plurality of resistance change films RE0 to RE63 corresponding to the plurality of word lines WL0 to WL63. The plurality of resistance change films RE0 to RE63 is stacked apart from each other in the Z direction. Each of the resistance change films RE0 to RE63 has a lateral U-shape in which a side facing the local source line column LSL is opened in the XY plan view.

In addition, the semiconductor film CH has a first portion at the same Z position as the resistance change films RE0 to RE63 and a second portion at the Z position between the plurality of resistance change films RE0 to RE63, and the second portion is recessed toward the side of the local source line column LSL from the first portion. As a result, the plurality of resistance change films RE0 to RE63 may be reliably divided in the Z direction.

For example, the structure illustrated in FIGS. 24 to 26 may be manufactured as follows. The insulating layer 222 and a sacrificial layer SF are alternately stacked a plurality of times on the +Z side of the semiconductor substrate 21 (see FIG. 3) to form a stacked body. The insulating layer 222 is formed of, for example, a material containing silicon oxide as a main component, and the sacrificial layer SF is formed of, for example, a material containing silicon nitride as a main component. In order to form the cell block CB, the plurality of memory holes MH each penetrating the stacked body in the Z direction are formed. The sacrificial layer SF is etched with an etchant capable of securing a select ratio of the sacrificial layer SF with respect to the insulating layer 222, and the inner surface of the memory hole MH is recessed outward. After that, the gate oxide film GD is deposited on the outer periphery of the sidewall of each memory hole MH, the semiconductor film CH is deposited on inner side of the gate oxide film GD, the insulating film DF is embedded on inner side of the gate oxide film GD, and left and right subholes SH (see FIG. 20B) are formed. The inner surfaces of the left and right subholes SH are recessed outward at the Z position corresponding to the conductive film WL (see FIG. 25). In the left and right subholes SH, the resistance change film RE is deposited thickly, the resistance change film RE is slimmed by anisotropic etching, and the semiconductor film CH is exposed at the Z position between the conductive films WL. As a result, the plurality of resistance change films RE0 to RE63 divided in the Z direction are formed. After that, steps similar to those in the fifth embodiment are performed to manufacture the structure illustrated in FIGS. 24 to 26.

As described above, in the seventh embodiment, in each cell block CB, the plurality of resistance change films RE0 to RE63 is divided in the Z direction corresponding to the plurality of word lines WL0 to WL63. As a result, since the resistance change elements RE0 to RE63 of the memory cells MC may be electrically separated in the Z direction, it is possible to suppress the flow of the disturbance current between the memory cells MC adjacent in the Z direction, and it is possible to improve the writing budget and the reading budget for the resistance change elements RE0 to RE63 of the memory cells MC.

Eighth Embodiment

Next, the nonvolatile semiconductor memory device 1 according to an eighth embodiment will be described. Hereinafter, portions different from those of the first embodiment and the seventh embodiment will be mainly described.

In the first embodiment, a configuration in which the resistance change film in each cell block is in contact with the local bit line column is exemplified, but in the eighth embodiment, a configuration in which a thermal barrier film is interposed between the resistance change film in each cell block and the local bit line column and the semiconductor film is exemplified.

For example, Joule heat generated in the resistance change element RE by the cell current is used when the set/reset operation is performed on the resistance change element RE of the select memory cell MC. In the configuration in which the resistance change film RE is in contact with the local bit line column LBL, the heat generated by the resistance change film RE leaks to the local bit line column LBL and the semiconductor film CH, in a manner that a relatively large cell current flows in order to raise the temperature of the resistance change element RE of the select memory cell MC to a temperature at which a set/reset operation can be performed.

Figure 27:
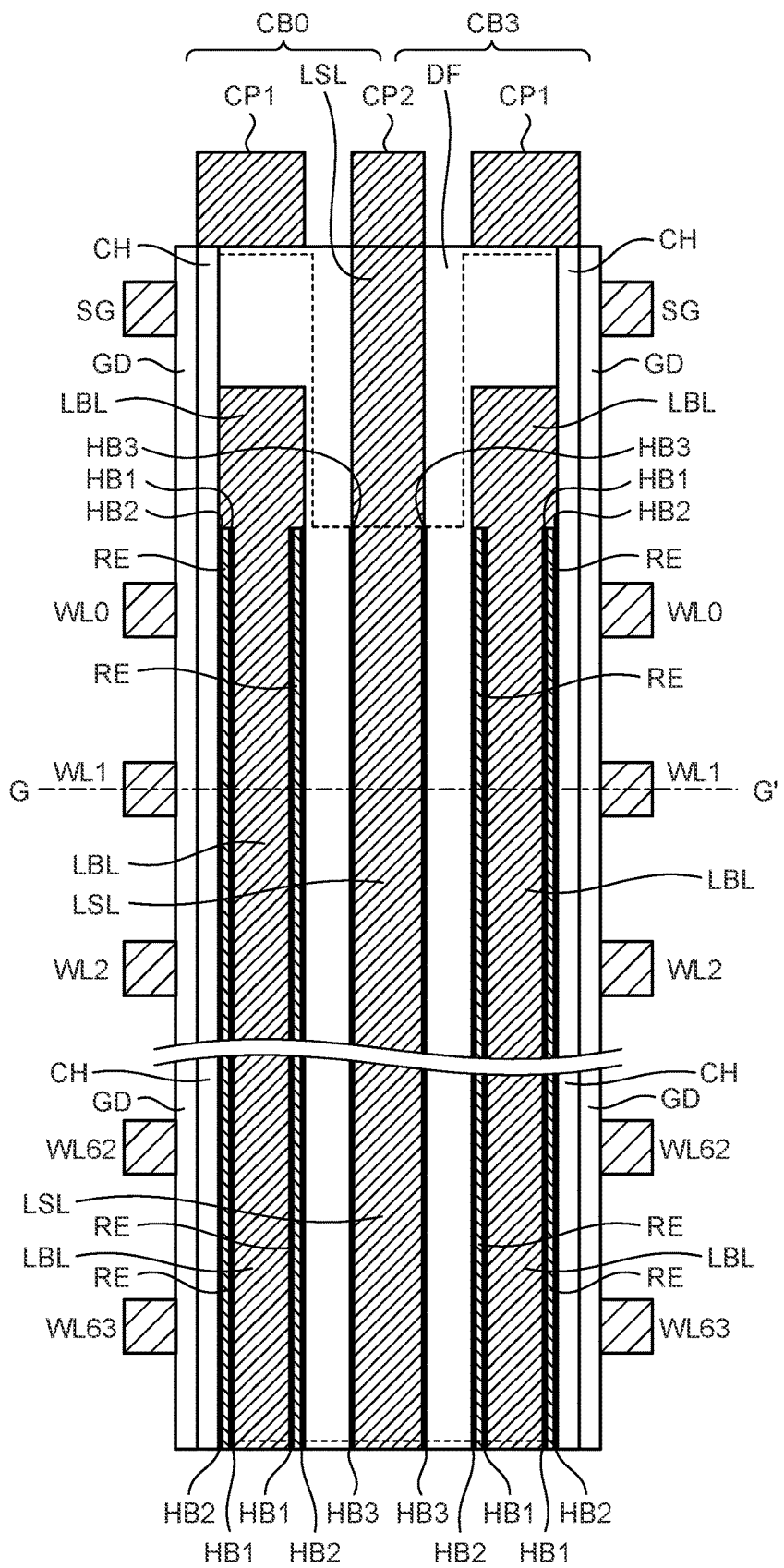
FIG. 27 is a vertical cross-sectional view illustrating a configuration of a cell block in an eighth embodiment.
Figure 27:
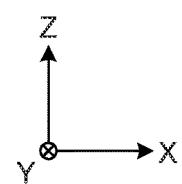
Figure 28:
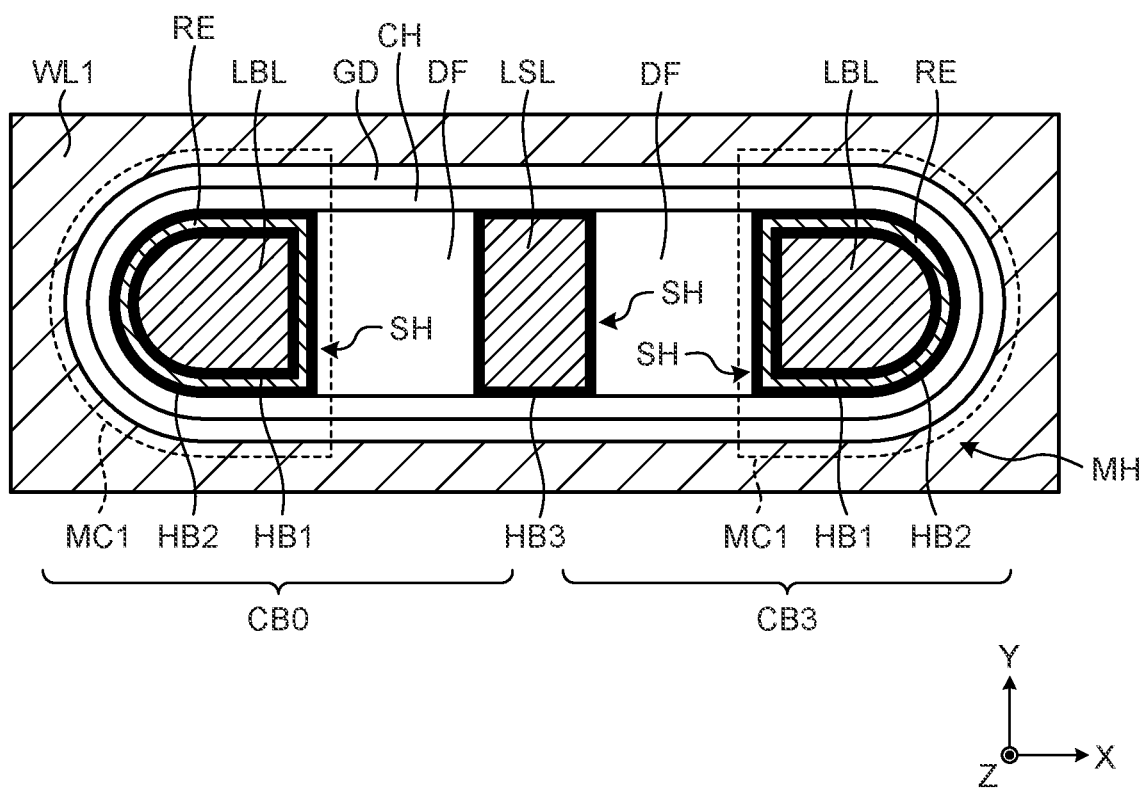
FIG. 28 is a planar cross-sectional view illustrating a configuration of the cell block in the eighth embodiment.

Considering that, in the eighth embodiment, the cell block CB may be configured as illustrated in FIGS. 27 to 28. FIG. 27 is a vertical cross-sectional view illustrating a configuration of the cell block CB, and illustrates an XZ cross section passing through the central axis of the cell blocks CB0 and CB3. In FIG. 27, illustration of an insulating layer between the word line WL and the word line WL is omitted for simplification. FIG. 28 is a planar cross-sectional view illustrating a configuration of the cell block CB. FIG. 28 illustrates an XY cross section taken along line G-G' in FIG. 27.

In each cell block CB, a thermal barrier film HB1 is interposed between the resistance change film RE and the local bit line column LBL. The thermal barrier film HB1 extends in the Z direction between the resistance change film RE and the local bit line column LBL and penetrates the plurality of conductive films WL0 to WL63. The thermal barrier film HB1 has a substantially semi-cylindrical shape, and its outer surface is in contact with the inner surface of the resistance change film RE, and its inner surface is in contact with the outer surface of the local bit line column LBL.

A thermal barrier film HB2 is interposed between the resistance change film RE and the semiconductor film CH. The thermal barrier film HB2 extends in the Z direction between the resistance change film RE and the semiconductor film CH and penetrates the plurality of conductive films WL0 to WL63. The thermal barrier film HB2 has a substantially semi-cylindrical shape, and its outer surface is in contact with the inner surface of the semiconductor film CH, and its inner surface is in contact with the outer surface of the resistance change film RE. At this time, the resistance change film RE includes a portion in contact with the semiconductor film CH and a portion in contact with the local bit line column LBL.

Furthermore, a thermal barrier film HB3 may be interposed between the local source line column LSL and the semiconductor film CH. The thermal barrier film HB3 extends in the Z direction between the local source line column LSL and the semiconductor film CH and penetrates the plurality of conductive films WL0 to WL63. The thermal barrier film HB3 has a substantially rectangular tube shape, and its +Y side and −Y side outer surfaces are in contact with the inner surface of the semiconductor film CH, and its inner surface is in contact with the outer surface of the local source line column LSL.

Each of the thermal barrier films HB1, HB2, and HB3 is formed of a conductive material having high thermal resistance, and is formed of, for example, a conductive material such as TiN, TaN, TiOx, C, or CN. The thermal barrier film HB1 can suppress heat leakage from the resistance change film RE while allowing a current to pass between the resistance change film RE and the local bit line column LBL. The thermal barrier film HB2 can suppress heat leakage from the resistance change film RE while allowing a current to pass between the resistance change film RE and the semiconductor film CH. The thermal barrier film HB3 can suppress heat leakage from the resistance change film RE while allowing a current to pass between local source line column LSL and the semiconductor film CH.

For example, even in a case where the resistance change film RE is formed of any of a phase change material, a magnetic material, and a metal oxide material, the resistance change film RE operates at a raised temperature or operates with easy switching at a high temperature. Therefore, by sandwiching the resistance change film RE between the thermal barrier films HB1 and HB2 having a high thermal resistance, heat dissipation due to heat generation can be suppressed, and the temperature can be raised at a lower current. If the thermal barrier film HB3 is also inserted around the center local source line column LSL, the thermal energy of the resistance change film RE can be prevented from escaping to the local source line column LSL via the semiconductor film RE. At the same time, the electrical contact resistance between the resistance change film RE and another film can be reduced by the thermal barrier films HB1 and HB2.

In addition, according to the thermal barrier films HB1 and HB2, it is possible to prevent diffusion of various atoms to or from the resistance change film RE, and deterioration of data holding reliability can be suppressed.

As described above, in the eighth embodiment, in each cell block CB, the thermal barrier film HB1 is interposed between the resistance change film RE and the local bit line column LBL, and the thermal barrier film HB2 is interposed between the resistance change film RE and the semiconductor film CH. As a result, the magnitude of the cell current for raising the temperature of the resistance change element RE of the select memory cell MC to a temperature at which the set/reset operation can be performed can be reduced, and the power consumption of the nonvolatile semiconductor memory device 1 can be reduced.

Note that a material having a relatively high electrical resistance at the interface may be inserted as the material of the thermal barrier films HB1 and HB2 to provide a thermal assist function using heat generation at the interface resistance for temperature rise. Alternatively, the material of the thermal barrier films HB1 and HB2 may be a material having a high thermal contact resistance with respect to the resistance change film RE, and the interface between the thermal barrier films HB1 and HB2 and the resistance change film RE may be in an initial high resistance state. As a result, the current path separation between the conductive films WL can be realized even if the resistance change film RE is not divided between the memory cells MC (see FIG. 25). As described above, the thermal barrier films HB1 and HB2 can be applied to many applications.

Ninth Embodiment

Next, the nonvolatile semiconductor memory device 1 according to a ninth embodiment will be described. Hereinafter, portions different from those of the first embodiment and the eighth embodiment will be mainly described.

Figure 29:
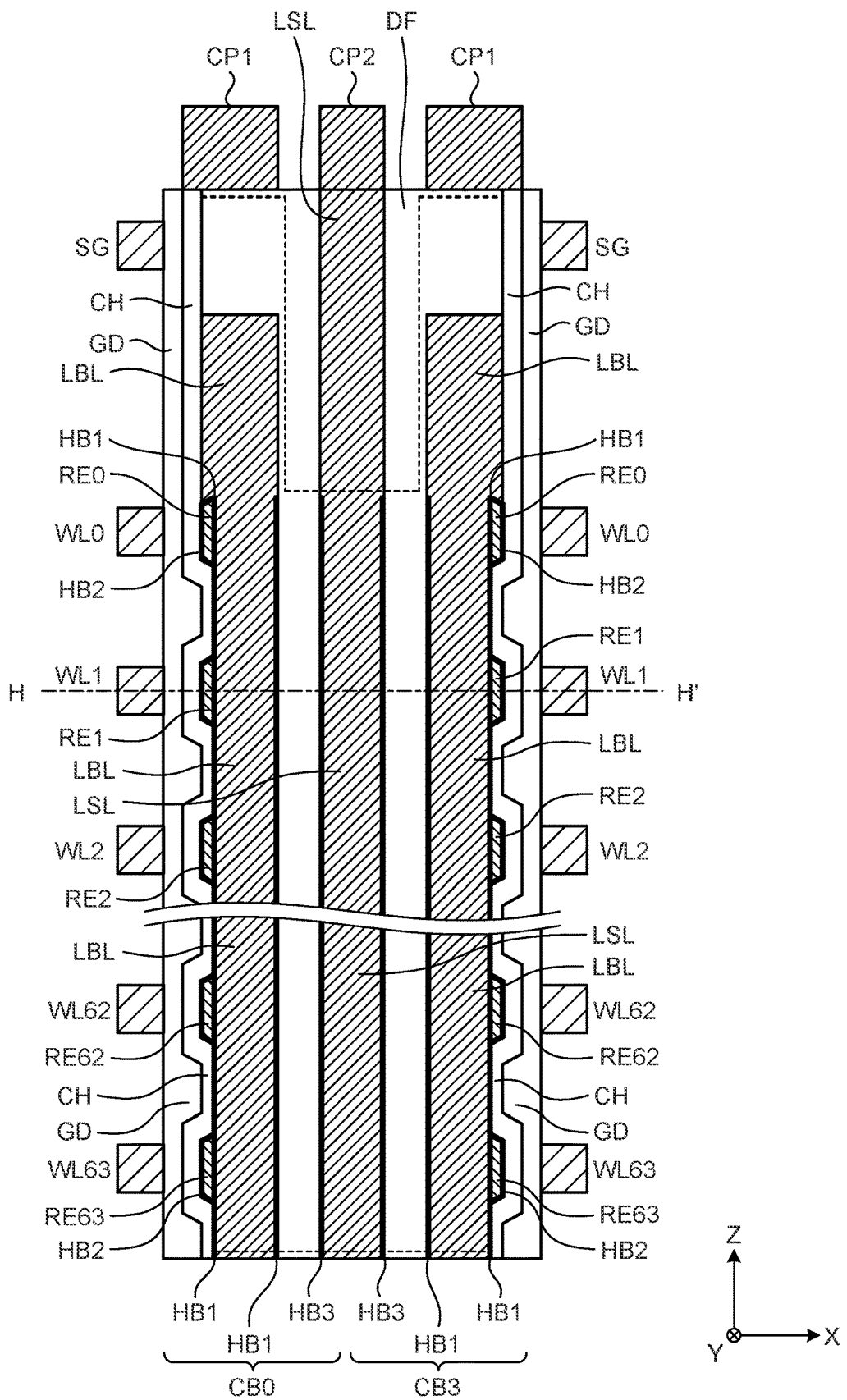
FIG. 29 is a vertical cross-sectional view illustrating a configuration of a cell block in a ninth embodiment.
Figure 30:
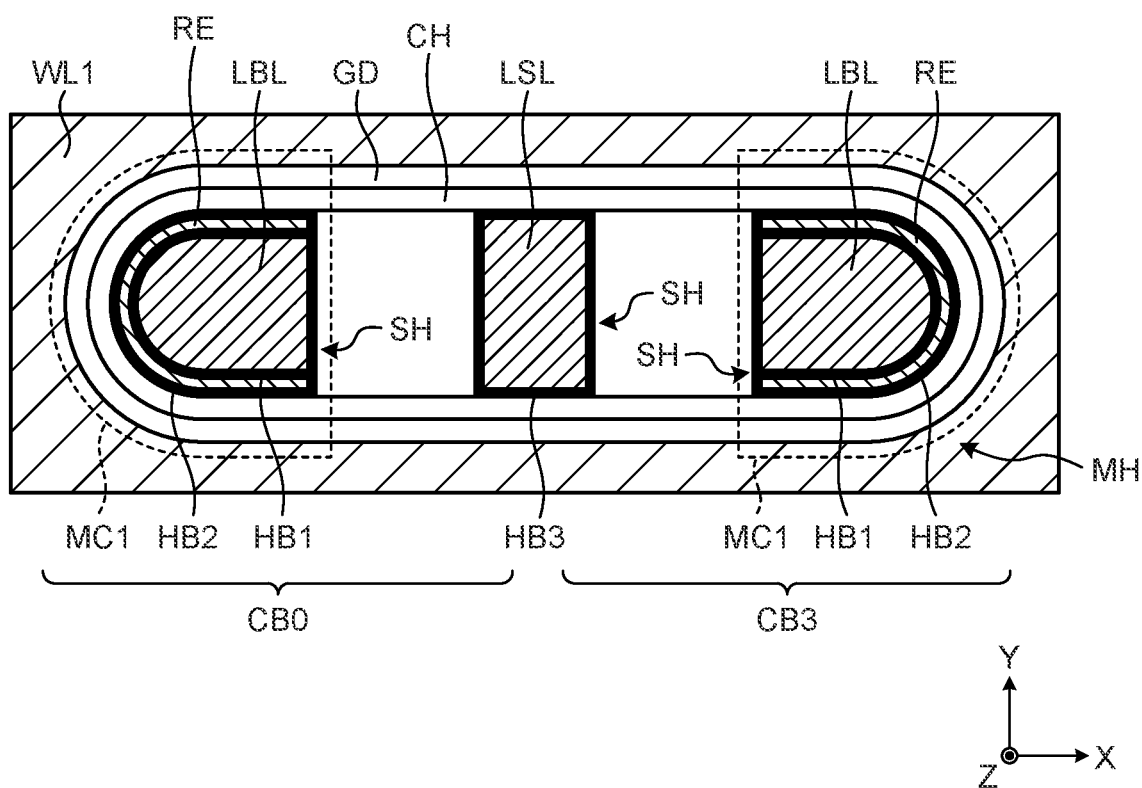
FIG. 30 is a planar cross-sectional view illustrating a configuration of the cell block in the ninth embodiment.

In a ninth embodiment, the seventh embodiment and the eighth embodiment are combined. In the ninth embodiment, the cell block CB may be configured as illustrated in FIGS. 29 to 30. FIG. 29 is a vertical cross-sectional view illustrating a configuration of the cell block CB, and illustrates an XZ cross section passing through the central axis of each of the cell blocks CB0 and CB3. In FIG. 29, illustration of an insulating layer between the word line WL and the word line WL is omitted for simplification. FIG. 30 is a planar cross-sectional view illustrating a configuration of the cell block CB. FIG. 30 illustrates an XY cross section taken along line H-H' in FIG. 29.

In each cell block CB, the resistance change film is divided into the plurality of resistance change films RE0 to RE63 corresponding to the plurality of word lines WL0 to WL63. The plurality of resistance change films RE0 to RE63 is stacked apart from each other in the Z direction. Each of the resistance change films RE0 to RE63 has a lateral U-shape in which a side facing the local source line column LSL is opened in the XY plan view. As a result, since the resistance change elements RE0 to RE63 of the memory cells MC may be electrically separated in the Z direction, it is possible to suppress the flow of the disturbance current between the memory cells MC adjacent in the Z direction.

Thermal barrier film HB1 is interposed between the resistance change film RE and the local bit line column LBL. The thermal barrier film HB1 extends in the Z direction between the resistance change film RE and the local bit line column LBL and penetrates the plurality of conductive films WL0 to WL63. The thermal barrier film HB1 has a substantially semi-cylindrical shape, and its outer surface is in contact with the inner surface of the resistance change film RE, and its inner surface is in contact with the outer surface of the local bit line column LBL.

A thermal barrier film HB2 is interposed between the resistance change film RE and the semiconductor film CH. The thermal barrier film HB2 extends in the Z direction between the resistance change film RE and the semiconductor film CH and penetrates the plurality of conductive films WL0 to WL63. The thermal barrier film HB2 has a substantially semi-cylindrical shape, and its outer surface is in contact with the inner surface of the semiconductor film CH, and its inner surface is in contact with the outer surface of the resistance change film RE.

Furthermore, a thermal barrier film HB3 may be interposed between the local source line column LSL and the semiconductor film CH. The thermal barrier film HB3 extends in the Z direction between the local source line column LSL and the semiconductor film CH and penetrates the plurality of conductive films WL0 to WL63. The thermal barrier film HB3 has a substantially rectangular tube shape, and its +Y side and −Y side outer surfaces are in contact with the inner surface of the semiconductor film CH, and its inner surface is in contact with the outer surface of the local source line column LSL.

Each of the thermal barrier films HB1, HB2, and HB3 is formed of a conductive material having high thermal resistance, and is formed of, for example, a conductive material such as TiN, TaN, TiOx, C, or CN. The thermal barrier film HB1 can suppress heat leakage from the resistance change film RE while allowing a current to pass between the resistance change film RE and the semiconductor film CH. The thermal barrier film HB2 can suppress heat leakage from the resistance change film RE while allowing a current to pass between the resistance change film RE and the semiconductor film CH. The thermal barrier film HB3 can suppress heat leakage from the resistance change film RE while allowing a current to pass between local source line column LSL and the semiconductor film CH.

As described above, in the ninth embodiment, in each cell block CB, the plurality of resistance change films RE0 to RE63 is divided in the Z direction corresponding to the plurality of word lines WL0 to WL63. As a result, since the resistance change elements RE0 to RE63 of the memory cells MC may be electrically separated in the Z direction, it is possible to suppress the flow of the disturbance current between the memory cells MC adjacent in the Z direction. In each cell block CB, the thermal barrier film HB1 is interposed between the resistance change film RE and the local bit line column LBL, and the thermal barrier film HB2 is interposed between the resistance change film RE and the semiconductor film CH. As a result, the magnitude of the cell current for raising the temperature of the resistance change element RE of the select memory cell MC to a temperature at which the set/reset operation can be performed can be reduced. Therefore, the writing budget and the reading budget for the resistance change elements RE0 to RE63 of the memory cell MC can be improved, and the power consumption of the nonvolatile semiconductor memory device 1 can be reduced.

10th Embodiment

Next, the nonvolatile semiconductor memory device 1 according to a 10th embodiment will be described. Hereinafter, portions different from those of the first embodiment and the ninth embodiment will be mainly described.

Although the layout configuration of the plurality of cell blocks CB is not mentioned in the first embodiment to ninth embodiment, the 10th embodiment exemplifies the layout configuration of the plurality of cell blocks CB.

Figure 31A:
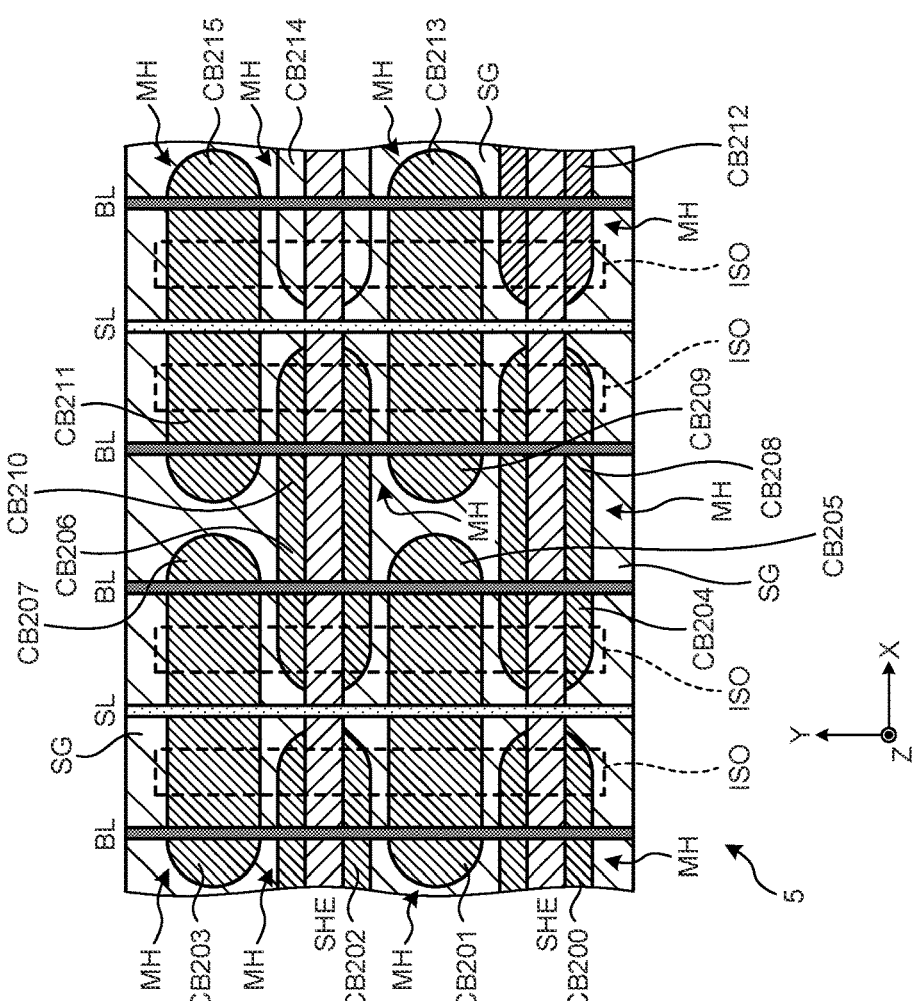
FIGS. 31A and 31B are plan views illustrating a configuration of a cell array in a 10th embodiment.

In the nonvolatile semiconductor memory device 1, as illustrated in FIG. 31A, the cell array 5 may be configured by two-dimensionally arranging a plurality of cell blocks CB100 to CB107 in the XY direction. FIG. 31A is a plan view illustrating a configuration of the cell array 5, and exemplifies a layout configuration of the plurality of cell blocks CB100 to CB107 in a case where one cell block CB is configured by a columnar structure disposed in the memory hole MH (see FIGS. 9 to 11).

As illustrated in FIG. 31A, the plurality of cell blocks CB100 to CB107 is arranged to form a plurality of rows each of which is along the X direction. The arrangement of the cell blocks CB102 and CB106 forms one row, and the arrangement of the cell blocks CB100 and CB104 forms another row. In the plurality of rows, the X position of the disposition is shifted by a half pitch of the arrangement between the rows adjacent in the Y direction. The X position of the cell block CB100 is shifted with respect to the X position of the cell block CB102 by a half pitch of the arrangement of the cell blocks CB102 and CB106. As a result, the openings of the plurality of memory holes MH with respect to the plurality of cell blocks CB100 to CB107 are lithographically facilitated.

In the example of FIG. 31A, dummy memory holes MH are formed every other row in the Y direction. In the dummy cell blocks CB102, CB103, CB106, and CB107, the cell block select transistor is omitted. Therefore, the cell block select signal line SG is divided in the Y direction by the division film SHE. As a result, even if the bit lines BL and the source lines SL are alternately disposed one by one in the X direction, the arrangement pitch of the cell blocks CB in the Y direction can be reduced. A separation pattern ISO is a layout of a resist pattern for masking that separates the subhole SH for embedding the local source line column LSL and the subhole SH for embedding the local bit line column LBL (see FIG. 19B) during manufacturing.

Figure 31B:
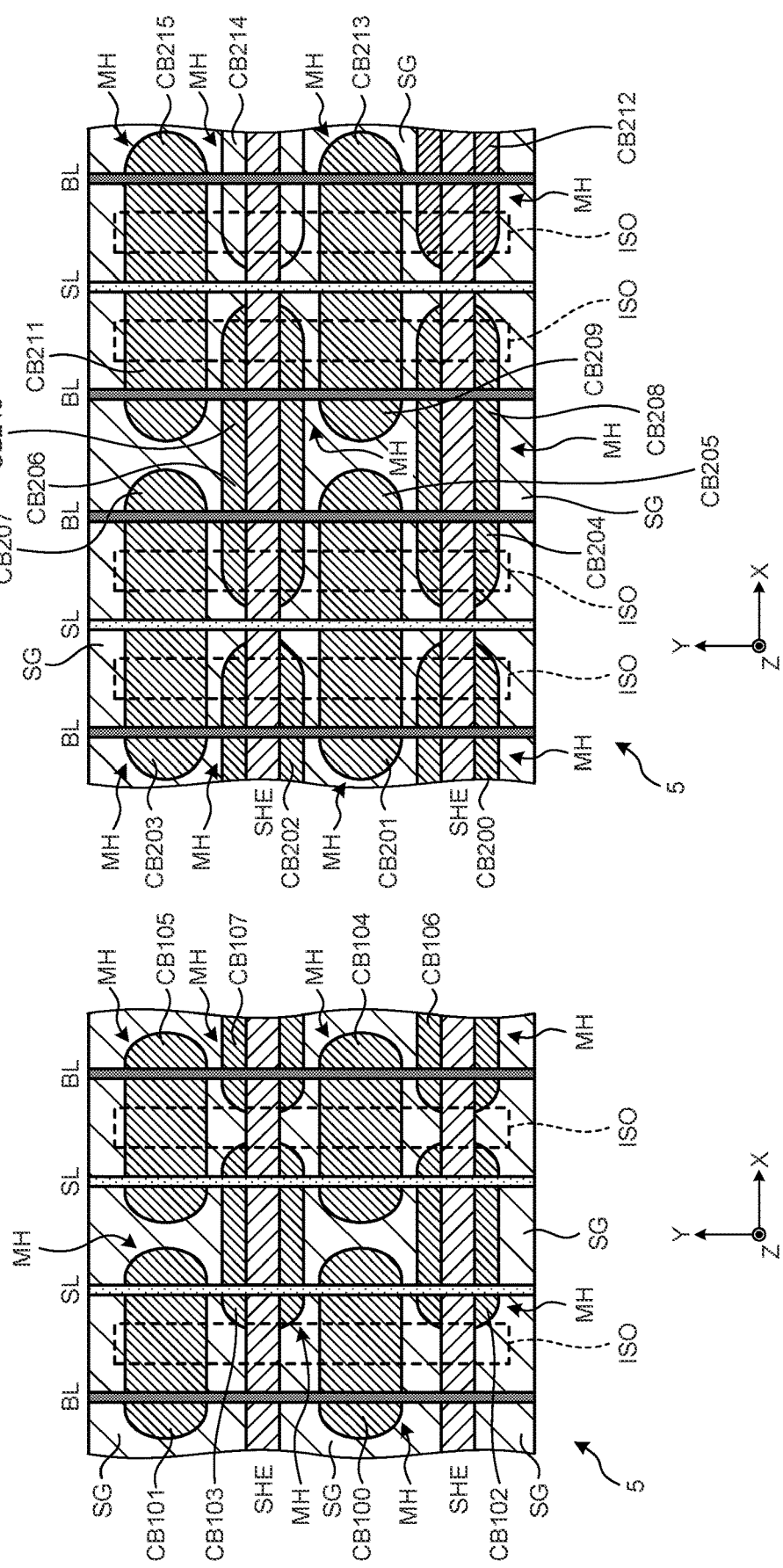

Alternatively, in the nonvolatile semiconductor memory device 1, as illustrated in FIG. 31B, the cell array 5 may be configured by two-dimensionally arranging a plurality of cell blocks CB200 to CB215 in the XY direction. FIG. 31B is a plan view illustrating a configuration of the cell array 5, and exemplifies a layout configuration of the plurality of cell blocks CB200 to CB215 in a case where a set of two cell blocks CB is configured by a columnar structure disposed in the memory hole MH (see FIGS. 4 to 6).

As illustrated in FIG. 31B, the plurality of cell blocks CB200 to CB215 is arranged to form a plurality of rows each of which is along the X direction. An arrangement of a set of the cell blocks CB200 and CB204 and a set of the cell blocks CB208 and CB212 forms one row, and an arrangement of a set of the cell blocks CB201 and CB205 and a set of the cell blocks CB209 and CB213 forms another row. In the plurality of rows, the X position of the disposition is shifted by a half pitch of the arrangement between the rows adjacent in the Y direction. The intermediate X position of the cell blocks CB201 and CB205 is shifted with respect to the intermediate X position of the cell blocks CB204 and CB208 by a half pitch of the arrangement of the set of the cell blocks CB200 and CB204 and the set of the cell blocks CB208 and CB212. As a result, the openings of the plurality of memory holes MH with respect to the plurality of cell blocks CB200 to CB215 are lithographically facilitated.

In the example of FIG. 31B, dummy memory holes MH are formed every other row in the Y direction. In the dummy cell blocks CB200, CB204, CB208, CB212, 202, CB207, CB210, and CB214, the cell block select transistor is omitted. Therefore, the cell block select signal line SG is divided in the Y direction by the division film SHE. As a result, even if the source lines SL are disposed alternately between the bit lines BL in the X direction, the wiring pitch of the cell block CB in the Y direction can be reduced. A separation pattern ISO is a layout of a resist pattern for masking that separates the center subhole SH for embedding the local source line column LSL and the left and right subholes SH for embedding the local bit line column LBL (see FIG. 21A) during manufacturing. Although depending on the ease of lithography, the formation of the memory hole MH under the division film SHE may be omitted from the beginning.

As described above, in the 10th embodiment, in the cell array 5 of the nonvolatile semiconductor memory device 1, the plurality of cell blocks CB100 to CB108 is two-dimensionally arranged in the XY direction to form a plurality of rows in which X positions of the arrangement are shifted by a half pitch between rows adjacent in the Y direction. As a result, the plurality of memory holes MH can be easily formed, and the nonvolatile semiconductor memory device 1 can be easily manufactured.

11th Embodiment

Next, the nonvolatile semiconductor memory device 1 according to an 11th embodiment will be described. Hereinafter, portions different from those of the first embodiment and the 10th embodiment will be mainly described.

In the 10th embodiment, a layout configuration of a plurality of cell blocks CB is exemplified, but in the 11th embodiment, a connection configuration with the sense amplifier 7 is further exemplified in addition to the layout configuration of the plurality of cell blocks CB.

Figure 32:
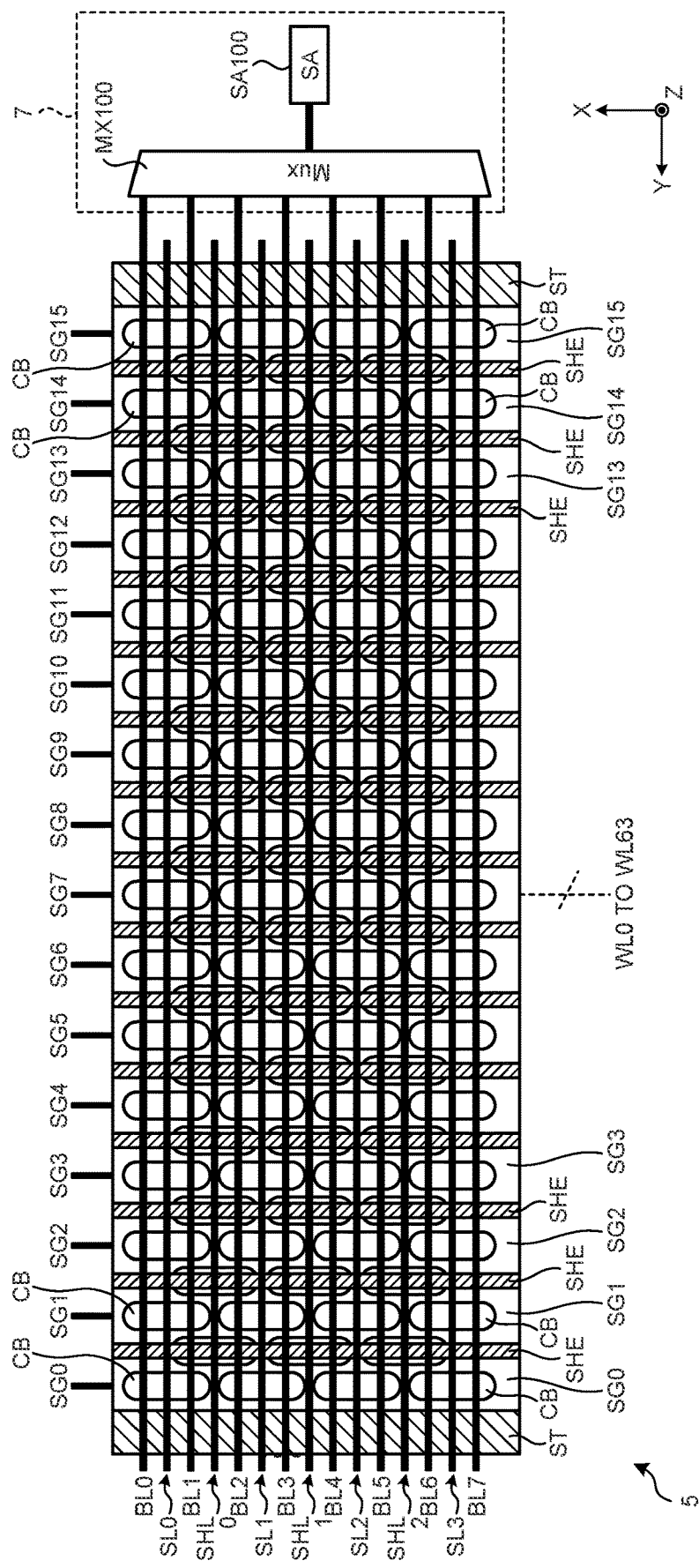
FIG. 32 is a plan view illustrating a configuration of a cell array in an 11th embodiment.

In the nonvolatile semiconductor memory device 1, as illustrated in FIG. 32, the cell array 5 may be configured by two-dimensionally arranging a plurality of cell blocks CB100 to CB108 in the XY direction. FIG. 32 is a plan view illustrating a configuration of the cell array 5, and illustrates a layout configuration in a case where two cell blocks CB are disposed in the memory hole MH (see FIG. 31B) in an extended manner between the separation portions ST. As a connection configuration between the plurality of bit lines BL0 to BL7 and the sense amplifier 7, any configuration as illustrated in FIGS. 23A to 23C can be adopted, but FIG. 32 exemplifies a configuration corresponding to FIG. 23B.

The plurality of bit lines BL0 to BL7 extends in the Y direction and is arranged in the X direction. The plurality of bit lines BL0 to BL7 is connected to the sense amplifier 7 on one end side. The plurality of bit lines BL0 to BL7 is connected to, for example, the multiplexer MX100.

The plurality of source lines SL0 to SL3 extends in the Y direction, and is arranged in the X direction to be disposed alternately between the bit lines BL. Each of the source lines SL0 to SL3 is connected to the row decoder 6. The plurality of source lines SL0 to SL3 is not connected to the sense amplifier 7.

A shield line SHL may be disposed between the bit lines BL in which the source lines SL are not disposed. The plurality of shield lines SHL0 to SHL2 extends in the Y direction and is arranged in the X direction to be disposed between the source lines SL and alternately between the bit lines BL. Each of the shield lines SHL0 to SHL2 is connected to the row decoder 6. The plurality of shield lines SHL0 to SHL2 is not connected to the sense amplifier 7.

Note that a fixed potential (for example, the L level) may be supplied from the row decoder 6 to each of the source lines SL0 to SL3. A fixed potential (for example, the L level) may be supplied from the row decoder 6 to each of the shield lines SHL0 to SHL2. As a result, it is possible to reduce the X distance between the bit lines BL while suppressing the crosstalk between the bit lines BL.

In the cell array 5 illustrated in FIG. 32, a plurality of cell block select lines SG0 to SG15 extends in the X direction and is divided in the Y direction via the division film SHE. A longitudinal direction of each cell block CB is defined as an X direction. The plurality of cell blocks CB is arranged in the X direction to be contained in the cell block select line SG. On the −Z side of the plurality of cell block select lines SG0 to SG15 and the plurality of division films SHE, a plurality of layers of word lines WL0 to WL63 is stacked apart from each other in the Z direction (see FIG. 3). Each word line WL includes a continuous conductive film between the separation portions ST. In the cell array 5 illustrated in FIG. 32, the word lines WL0 to WL63 are common to the 16 cell block select lines SG0 to SG15.

In the nonvolatile semiconductor memory device 1, since reading/writing can be performed on an arbitrary number of memory cells MC by a combination of the cell block select line SG, the select word line WL, and the select bit line BL, the number of cell block select lines SG capable of sharing the word line WL is arbitrary. However, since the power consumption increases when the number of cell block select lines SG to be shared is increased, it is desirable to share the cell block select lines SG at a ratio of about 16 cell block select lines SG per single word line WL. In the example illustrated in FIG. 32, a configuration in which one of the plurality of bit lines BL0 to BL7 is activated by the multiplexer MX100 and connected to the sense amplifier module SA100 to perform reading/writing is exemplified. By activating the ⅛ bit lines BL, the layout area of the sense amplifier 7 can be reduced to about one/eight. This makes it possible to suppress an increase in the layout area of the sense amplifier 7 even when the bit line BL length is shortened in order to reduce IR drop of the bit line BL even in the resistance change type memory driven by the current.

As described above, in the 11th embodiment, in the cell array 5 of the nonvolatile semiconductor memory device 1, the source line SL or the shield line SHL is disposed between the plurality of bit lines BL0 to BL7. As a result, it is possible to reduce the X distance between the bit lines BL while suppressing the crosstalk between the bit lines BL, and to easily reduce the layout area of the cell array 5.

12th Embodiment

Next, the nonvolatile semiconductor memory device 1 according to a 12th embodiment will be described. Hereinafter, portions different from those of the first embodiment and the 11th embodiment will be mainly described.

In the first embodiment and the eighth embodiment, a configuration in which a set of two cell blocks is disposed in the memory hole MH is exemplified, but in the 12th embodiment, a configuration in which a set of four cell blocks is disposed in the memory hole MH is exemplified.

Figure 33:
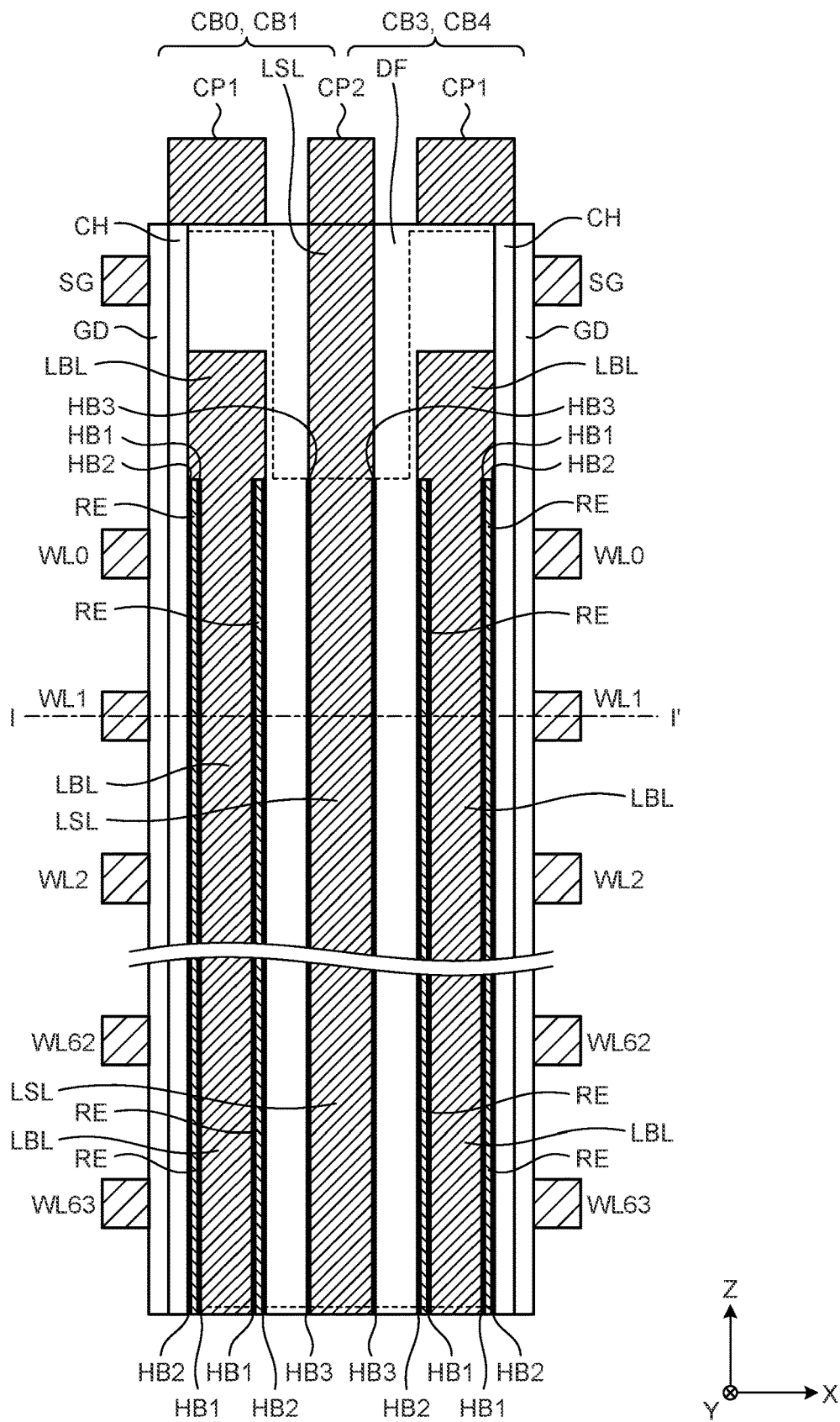
FIG. 33 is a vertical cross-sectional view illustrating a configuration of a cell block in a 12th embodiment.
Figure 34:
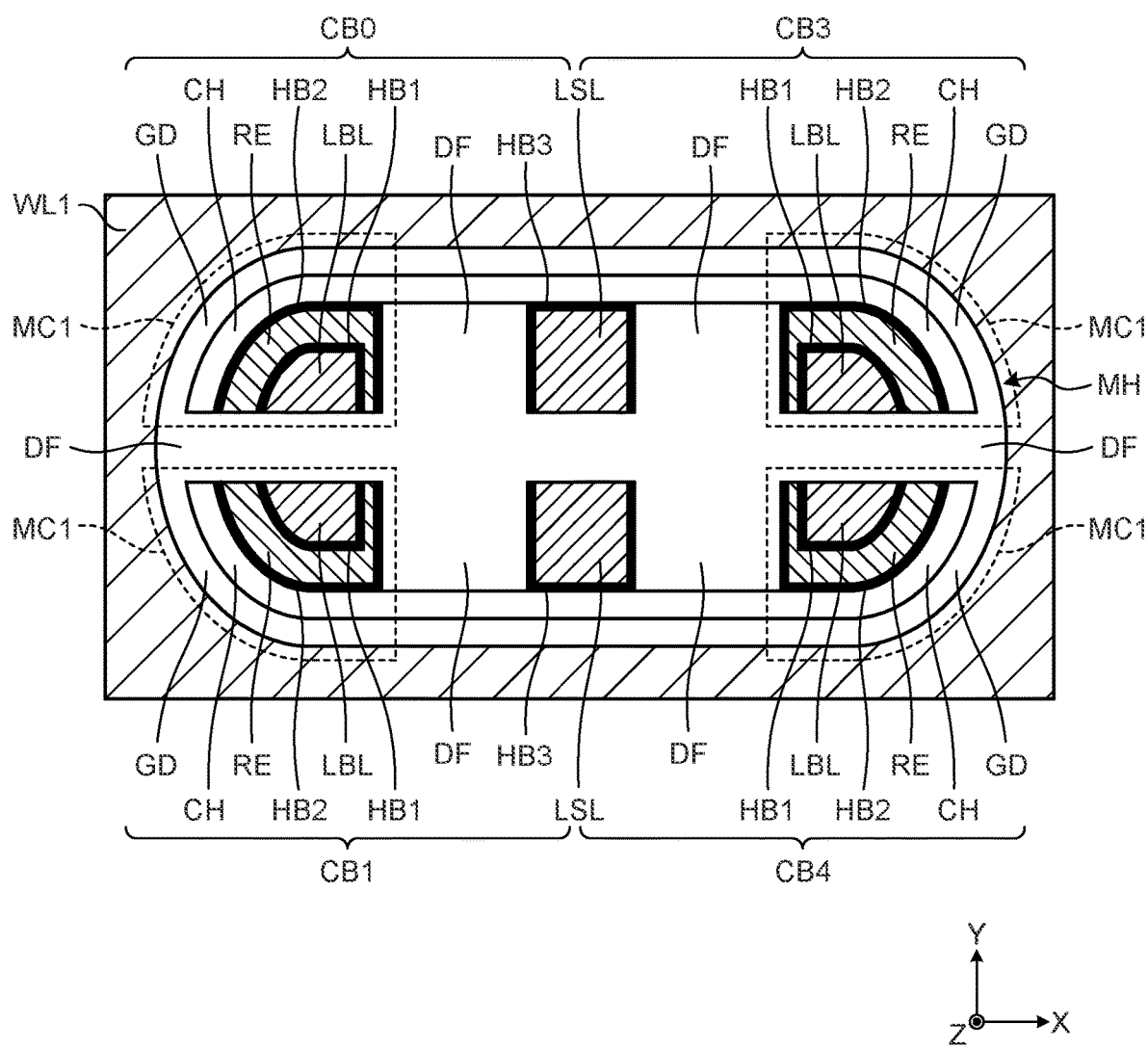
FIG. 34 is a planar cross-sectional view illustrating a configuration of the cell block in the 12th embodiment.

The cell block CB is configured as illustrated in FIGS. 33 to 34, for example. FIG. 33 is a vertical cross-sectional view illustrating a configuration of the cell block CB, and illustrates an XZ cross section passing through the central axis of the cell block CB. In FIG. 33, illustration of an insulating layer between the word line WL and the word line WL is omitted for simplification. FIG. 34 is a planar cross-sectional view illustrating a configuration of the cell block CB. FIG. 34 illustrates an XY cross section taken along line I-I' in FIG. 33.

The structure illustrated in FIGS. 33 to 34 is a structure in which the structure illustrated in FIGS. 4 to 6 is changed to be divided by a groove passing through the center of the memory hole MH and along the X direction to embed the insulating film DF.

The insulating film DF between the cell block CB0 and the cell block CB1 reaches the −Z side end of each cell block CB, and electrically separates the cell block CB0 and the cell block CB1 from each other. The local bit line column LBL of the cell block CB0 and the local bit line column LBL of the cell block CB1 are electrically separated by the insulating film DF. The resistance change film RE of the cell block CB0 and the resistance change film RE of the cell block CB1 are electrically separated by the insulating film DF.

The insulating film DF between the cell block CB3 and the cell block CB4 reaches the −Z side end of each cell block CB, and electrically separates the cell block CB3 and the cell block CB4 from each other. The local bit line column LBL of the cell block CB3 and the local bit line column LBL of the cell block CB4 are electrically separated by the insulating film DF. The resistance change film RE of the cell block CB3 and the resistance change film RE of the cell block CB4 are electrically separated by the insulating film DF.

The insulating film DF between the −Y side local source line column LSL and the +Y side local source line column LSL reaches the −Z side end of each column, and the −Y side local source line column LSL and the +Y side local source line column LSL are electrically separated by the insulating film DF.

As illustrated in FIGS. 33 to 34, in each cell block CB, the thermal barrier film HB1 may be interposed between the resistance change film RE and the local bit line column LBL, and the thermal barrier film HB2 may be interposed between the resistance change film RE and the semiconductor film CH. Furthermore, the thermal barrier film HB3 may be interposed between the local source line column LSL and the semiconductor film CH.

As illustrated in FIGS. 35A and 35B, the structure illustrated in FIGS. 33 to 34 may be manufactured by a manufacturing method different from the manufacturing method illustrated in FIGS. 20A to 20D in the following points. FIGS. 35A and 35B are plan views illustrating a configuration of the cell array 5, but are used as views illustrating a manufacturing method.

After the structure illustrated in FIG. 20D is formed, as illustrated in FIG. 35A, a groove pattern TR1 passing through the Y position outside the memory hole MH and extending in the X direction is formed up to the Z position (see FIG. 3) of the uppermost insulating layer 222 of the stacked body 22. In addition, a groove pattern TR2 passing through the Y position of the center of the memory hole MH and extending across the memory hole MH in the X direction to reach the −Z side end (see FIG. 3) of the memory hole MH is formed. Then, an insulating material (for example, silicon oxide) is embedded in each of the groove patterns TR1 and TR2 to form the division film SHE. After that, the sacrificial layer SF is removed, and the conductive film WL is embedded in the gap formed by the removal, in a manner that the cell array 5 including the set of four cell blocks illustrated in FIGS. 33 to 34 is manufactured.

Alternatively, after the structure illustrated in FIG. 20D is formed, as illustrated in FIG. 35B, a groove pattern TR3 that passes through the center Y position in the memory hole MH, extends in the X direction, and reaches the −Z side end of the memory hole MH is formed. Then, an insulating material (for example, silicon oxide) is embedded in the groove pattern TR3 to form the insulating film DF. After that, also by removing the sacrificial layer SF and embedding the conductive film WL in the gap formed by the removal, the cell array 5 including the set of four cell blocks illustrated in FIGS. 33 to 34 is manufactured.

In the structure illustrated in FIGS. 33 to 34, since a large number of cell blocks disposed in the memory hole MH can be secured, the arrangement density of the memory cells MC in the XY directions can be easily improved, and the chip cost per unit storage capacity can be reduced.

In the layout configuration of the cell block select line SG, as illustrated in FIG. 35A, the plurality of cell blocks CB adjacent in the Y direction in the memory hole MH may correspond to different cell block select lines SG. In this case, the local bit line columns LBL of the plurality of cell blocks CB adjacent in the Y direction in the memory hole MH may be connected to the common bit line BL. For example, the cell block CB0 and the cell block CB1 are adjacent to each other in the Y direction in the memory hole MH. The cell block CB0 corresponds to the cell block select line SG0. The cell block CB1 corresponds to the cell block select line SG1. In the cell block CB0, the local bit line column LBL may be connected to the bit line BL0 via the contact plug CP1 when the cell block select transistor SG0 is turned on. In the cell block CB1, the local bit line column LBL may be connected to the bit line BL0 via the contact plug CP1 when the cell block select transistor SG1 is turned on.

The cell block CB3 and the cell block CB4 are adjacent to each other in the Y direction in the memory hole MH. The cell block CB3 corresponds to the cell block select line SG0. The cell block CB4 corresponds to the cell block select line SG1. In the cell block CB3, the local bit line column LBL may be connected to the common bit line BL1 via the contact plug CP1 when the cell block select transistor SG0 is turned on. In the cell block CB4, the local bit line column LBL may be connected to the bit line BL1 via the contact plug CP1 when the cell block select transistor SG is turned on.

The +Y side local source line column LSL and the −Y side local source line column LSL are adjacent to each other in the Y direction in the memory hole MH. The +Y side local source line column LSL corresponds to the cell block select line SG0. The −Y side local source line column LSL corresponds to the cell block select line SG1. The +Y side local source line column LSL and the −Y side local source line column LSL are connected to the common source line SL via the contact plug CP2.

Alternatively, in the layout configuration of the cell block select line SG, as illustrated in FIG. 35B, the plurality of cell blocks CB adjacent in the Y direction in the memory hole MH may correspond to the same cell block select line SG. In this case, the plurality of cell blocks CB adjacent in the Y direction in the memory hole MH may be connected to different bit lines BL. For example, the cell block CB0 and the cell block CB1 are adjacent to each other in the Y direction in the memory hole MH. The cell block CB0 and the cell block CB1 correspond to the common cell block select line SG. The cell block CB0 is connected to the bit line BL0 via the contact plug CP1 when the cell block select transistor SG is turned on. The cell block CB1 is connected to the bit line BL1 via the contact plug CP1 when the cell block select transistor SG is turned on.

The cell block CB3 and the cell block CB4 are adjacent to each other in the Y direction in the memory hole MH. The cell block CB3 and the cell block CB4 correspond to the common cell block select line SG. The cell block CB3 is connected to the bit line BL2 via the contact plug CP1 when the cell block select transistor SG is turned on. The cell block CB4 is connected to the bit line BL3 via the contact plug CP1 when the cell block select transistor SG is turned on.

The +Y side local source line column LSL and the −Y side local source line column LSL are adjacent to each other in the Y direction in the memory hole MH. The +Y side local source line column LSL and the −Y side local source line column LSL correspond to the common cell block select line SG. The +Y side local source line column LSL and the −Y side local source line column LSL are connected to the common source line SL via the contact plug CP2.

As described above, in the 12th embodiment, in the cell array 5 of the nonvolatile semiconductor memory device 1, a set of four cell blocks CB is disposed in the memory hole MH. As a result, since a large number of cell blocks disposed in the memory hole MH can be secured, the arrangement density of the memory cells MC in the XY directions can be easily improved, and the chip cost per unit storage capacity can be reduced.

13th Embodiment

Next, the nonvolatile semiconductor memory device 1 according to a 13th embodiment will be described. Hereinafter, portions different from those of the first embodiment and the 12th embodiment will be mainly described.

In the first embodiment to 12th embodiment, a configuration in which each cell block corresponds to one locus source line is exemplified, but in the 12th embodiment, a configuration in which each cell block corresponds to a plurality of locus source lines is exemplified.

Figure 36:
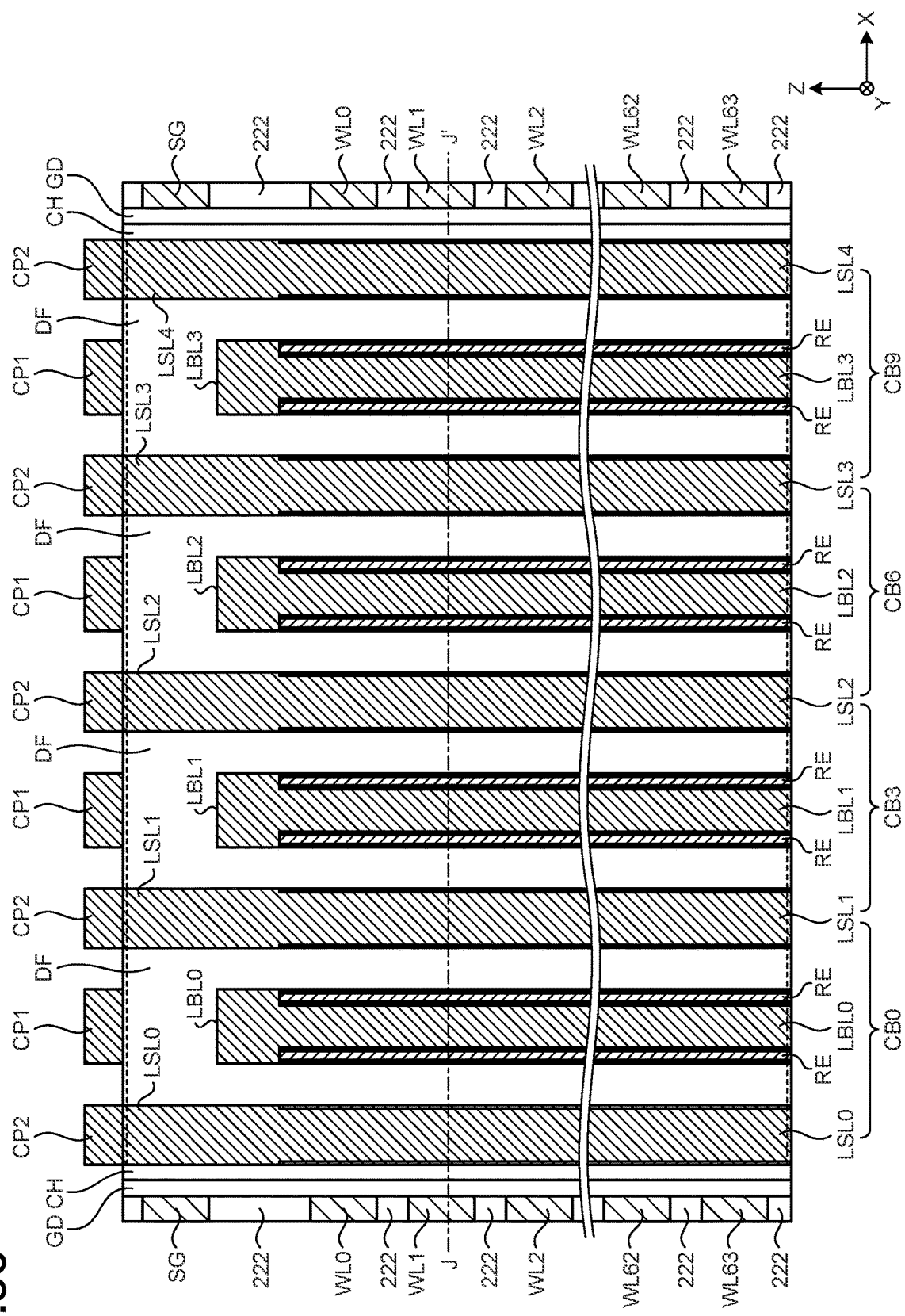
FIG. 36 is a vertical cross-sectional view illustrating a configuration of a cell block in a 13th embodiment.
Figure 37:
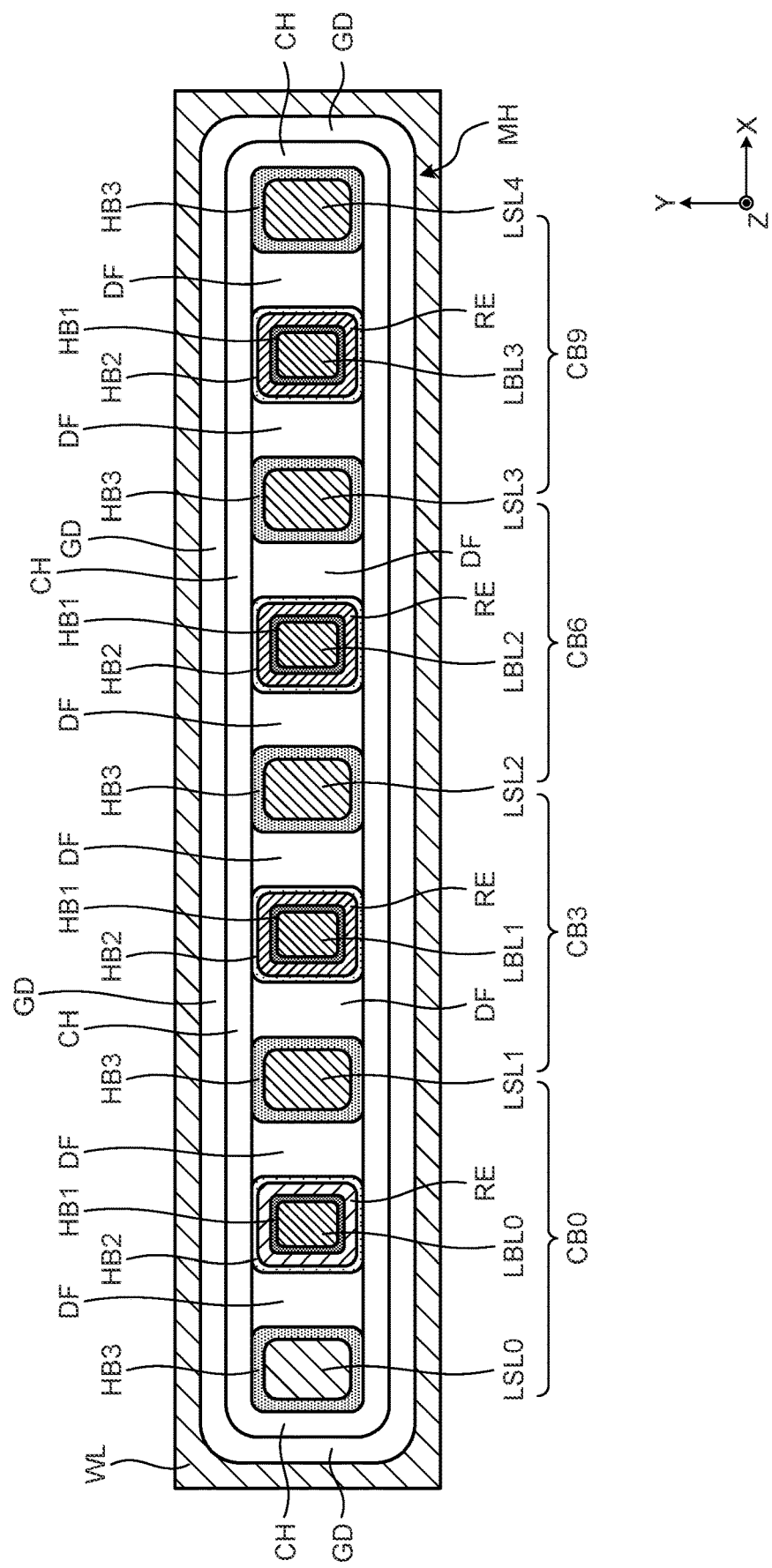
FIG. 37 is a planar cross-sectional view illustrating a configuration of the cell block in the 13th embodiment.

The cell block CB is configured as illustrated in FIGS. 36 to 37, for example. FIG. 36 is a vertical cross-sectional view illustrating a configuration of the cell blocks CB0, CB3, CB6, and CB9, and illustrates an XZ cross section passing through the central axis of each of the cell blocks CB0, CB3, CB6, and CB9. In FIG. 36, illustration of an insulating layer between the word line WL and the word line WL is omitted for simplification. FIG. 37 is a planar cross-sectional view illustrating a configuration of the cell blocks CB0, CB3, CB6, and CB9. FIG. 37 illustrates an XY cross section taken along line J-J' in FIG. 36. FIGS. 36 and 37 exemplifies a configuration in which four cell blocks CB are disposed in one memory hole MH, but the number of cell blocks CB disposed in one memory hole MH may be one to three, or may be five or more.

The memory hole MH is formed in a line shape extending in the X direction in the XY plan view and extends in a plate shape in the XZ direction. In the memory hole MH, a set of a plurality of cell blocks CB0, CB3, CB6, and CB9 is disposed. The plurality of cell blocks CB0 to CB9 is arranged in the X direction. As illustrated in FIGS. 36 to 37, each cell block CB includes a columnar structure. The columnar structure is different from that of the first embodiment in that the columnar structure includes a plurality of local source line columns LSL.

For example, the columnar structure of the cell block CB0 includes a local bit line column LBL0 and a plurality of local source line columns LSL0 and LSL1. The local source line column LSL0 is disposed on the −X side of the local bit line column LBL0, extends in the Z direction, and penetrates the plurality of word lines WL0 to WL63. The local source line column LSL1 is disposed on the +X side of the local bit line column LBL0, extends in the Z direction, and penetrates the plurality of word lines WL0 to WL63. The columnar structure of the cell block CB9 includes a local bit line column LBL3 and a plurality of local source line columns LSL3 and LSL4. The local source line column LSL3 is disposed on the −X side of the local bit line column LBL3, extends in the Z direction, and penetrates the plurality of word lines WL0 to WL63. The local source line column LSL4 is disposed on the +X side of the local bit line column LBL3, extends in the Z direction, and penetrates the plurality of word lines WL0 to WL63.

That is, in the memory hole MH, the local source line columns LSL and the local bit line columns LBL are alternately and repeatedly arranged along the X direction. In FIG. 37, in the memory hole MH, the local source line column LSL0, the local bit line column LBL0, the local source line column LSL1, the local bit line column LBL1, a local source line column LSL2, a local bit line column LBL2, the local source line column LSL3, the local bit line column LBL3, and the local source line column LSL4 are disposed from the −X side to the +X side.

The local source line column LSL is shared by the plurality of cell blocks CB similarly to the first embodiment. For example, the local source line column LSL1 is shared by the cell block CB0 and the cell block CB3. The local source line column LSL3 is shared by the cell block CB6 and the cell block CB8.

As illustrated in FIGS. 36 to 37, in each cell block CB, the thermal barrier film HB1 may be interposed between the resistance change film RE and the local bit line column LBL, and the thermal barrier film HB2 may be interposed between the resistance change film RE and the semiconductor film CH. Furthermore, the thermal barrier film HB3 may be interposed between the local source line column LSL and the semiconductor film CH.

In the structure illustrated in FIGS. 36 to 37, since the memory holes MH are formed in a line shape in the XY plan view, a margin for lithography can be easily secured, and an arrangement of the cell blocks CB having a narrow disposition pitch in the Y direction can be formed. In addition, since the local bit line column LBL and the local source line column LSL are formed separately in the X direction in the memory hole MH extending linearly in the X direction, a margin for lithography can be easily secured, and an arrangement of the cell blocks CB having a narrow disposition pitch in the X direction can be formed.

Figure 38:
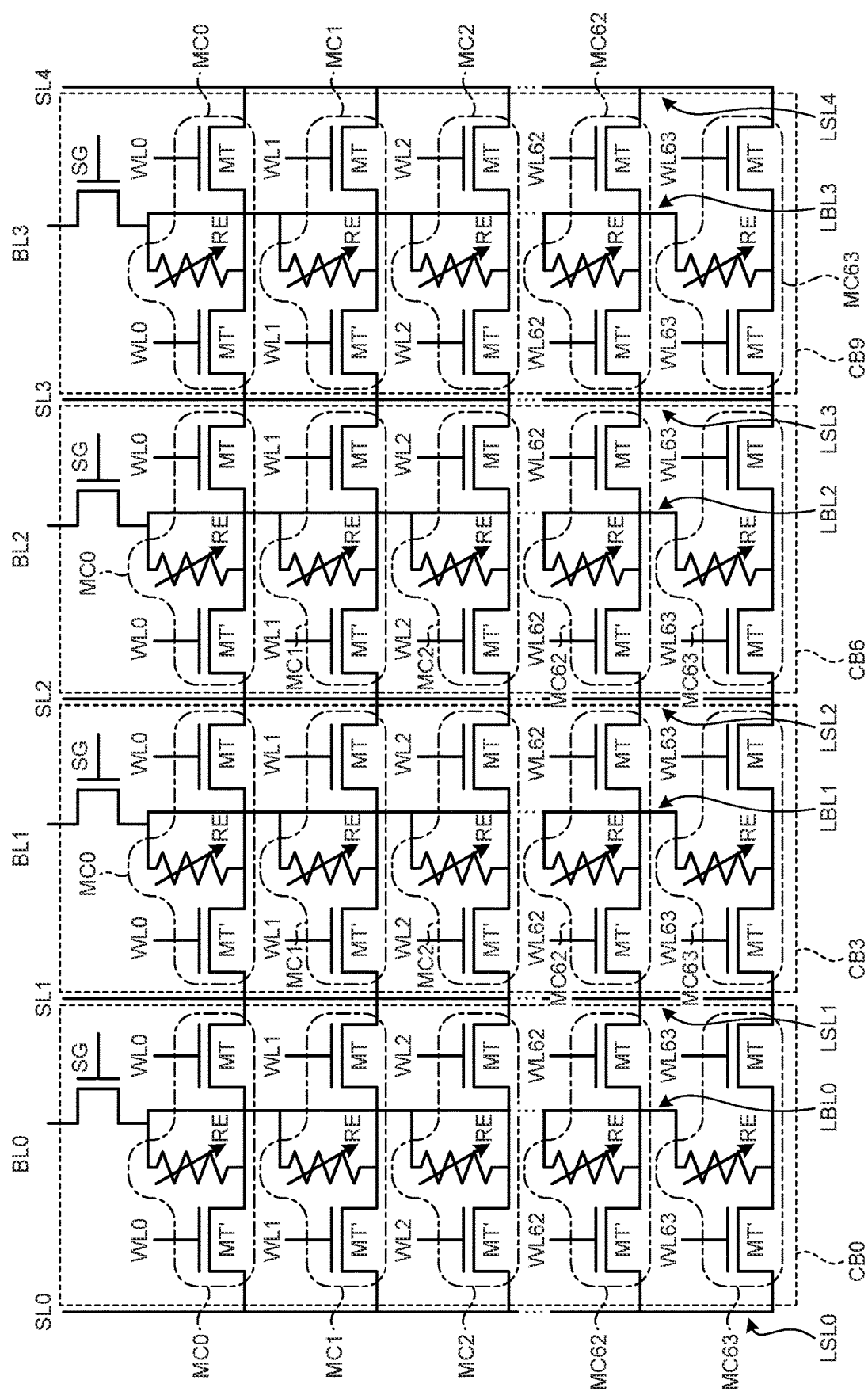
FIG. 38 is a circuit diagram illustrating a configuration of the cell block in the 13th embodiment.

An equivalent circuit diagram of a set of the plurality of cell blocks CB0, CB3, CB6, and CB9 disposed in the memory hole MH is as illustrated in FIG. 38. FIG. 38 is a circuit diagram illustrating a configuration of the cell block CB.

As illustrated in the equivalent circuit diagram of FIG. 38, the memory cell MC includes two series connections. For example, the memory cell MC0 of the cell block CB0 includes a series connection of the resistance change element RE and a memory transistor MT' between the local bit line LBL0 and a local source line LSL0, and includes a series connection of the resistance change element RE and the memory transistor MT between the local bit line LBL0 and a local source line LSL1. The gates of both the memory transistor MT' and the memory transistor MT of the memory cell MC0 are connected to the word line WL0.

The memory cell MC1 of the cell block CB3 includes a series connection of the resistance change element RE and a memory transistor MT' between the local bit line LBL1 and the local source line LSL1, and includes a series connection of the resistance change element RE and the memory transistor MT between the local bit line LBL1 and a local source line LSL2. The gates of both the memory transistor MT' and the memory transistor MT of the memory cell MC1 are connected to the word line WL1.

The memory cell MC63 of the cell block CB9 includes a series connection of the resistance change element RE and the memory transistor MT' between a local bit line LBL3 and a local source line LSL3, and includes a series connection of the resistance change element RE and the memory transistor MT between the local bit line LBL3 and a local source line LSL4. The gates of both the memory transistor MT' and the memory transistor MT of the memory cell MC63 are connected to the word line WL63.

Figure 39:
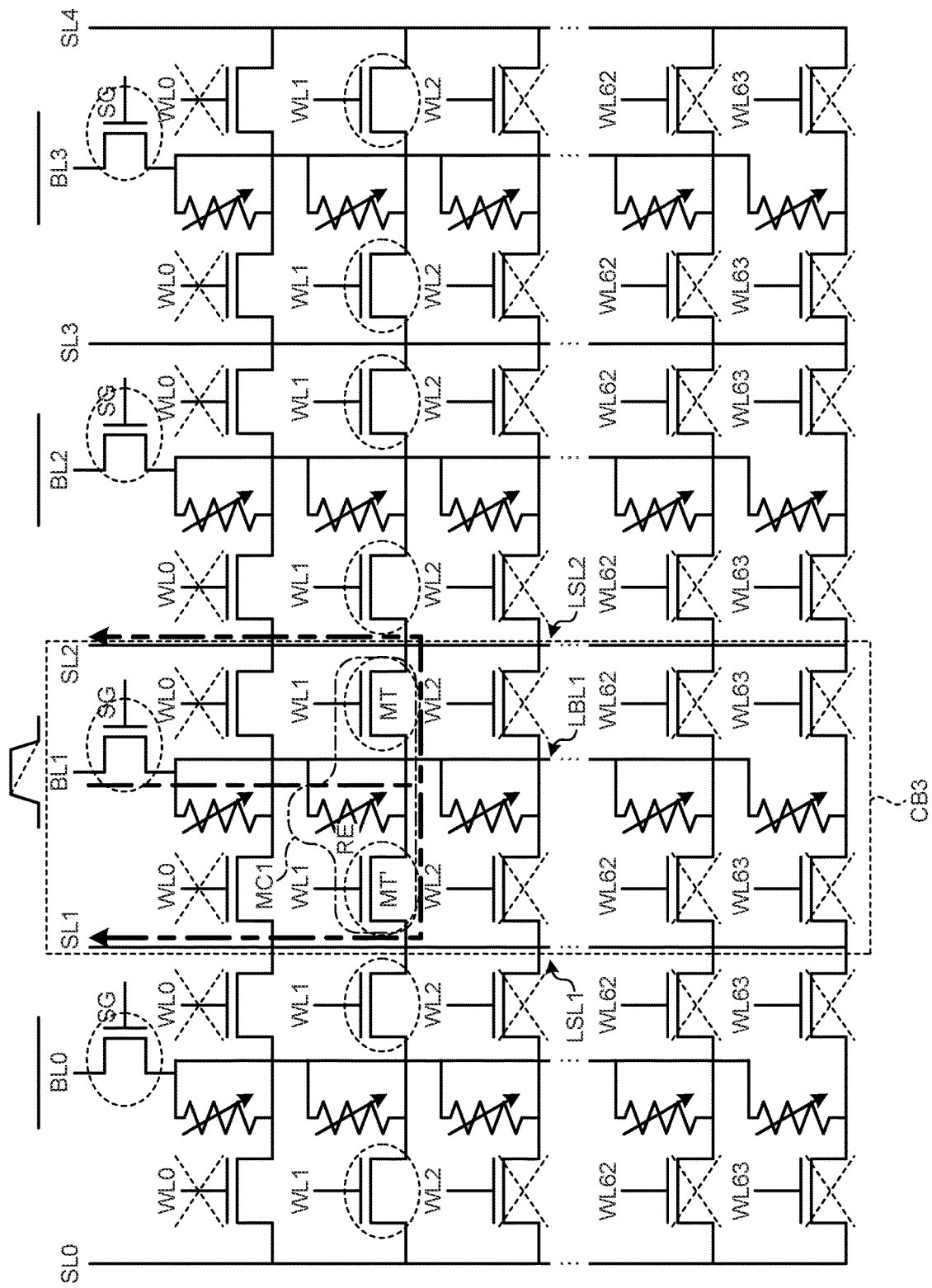
FIG. 39 is a circuit diagram illustrating an operation of the cell block in the 13th embodiment.

With this configuration, as illustrated in FIG. 39, a current can flow from the local bit line LBL to the left and right local source lines LSL1 and LSL2 through the resistance change element RE and via the semiconductor channels of the left and right cell transistors MT and MT'. When the word line WL1 among the plurality of word lines WL0 to WL63 is selectively set to the high level $V_{H3}$ and the bit line L1 among the plurality of bit lines BL0 to BL3 is selectively set to the high level $V_{H4}$, the memory transistor MT' and the memory transistor MT of the memory cell MC1 are turned on. As a result, the current path of the cell current is parallelized to the current path of the bit line BL1→the local bit line LBL1→the resistance change element RE→the memory transistor MT'→the local source line LSL1→a source line SL1, and the current path of the bit line BL1→the local bit line LBL1→the resistance change element RE→the memory transistor MT→the local source line LSL2→a source line SL2. Therefore, the resistance of the current path of the cell current can be reduced, and the cell current can be easily secured.

As described above, in the 13th embodiment, in the cell array 5 of the nonvolatile semiconductor memory device 1, the columnar structure of each cell block includes the plurality of locus source line columns. As a result, the current paths of the cell currents in each cell block can be parallelized, and the current paths of the cell currents can be reduced in resistance. That is, the semiconductor channel width in the current path can be substantially doubled, and the current budget can be significantly reduced.

14th Embodiment

Next, the nonvolatile semiconductor memory device 1 according to a 14th embodiment will be described. Hereinafter, portions different from those of the first embodiment and the 13th embodiment will be mainly described.

In the first embodiment to 13th embodiment, a configuration in which the resistance change film RE is formed of a phase change material (for example, chalcogenide-based materials (Ge, Sb, or Te) and the like) is exemplified, but in the 14th embodiment, a configuration in which the resistance change film RE is formed of another material is exemplified.

In each cell block CB, the material of the resistance change film may be a superlattice film material instead of the phase change material. The resistance change film RE may have a structure in which a superlattice is realized by alternately stacking GeTe layers and SbTe layers with a layer thickness of about an interatomic distance from the center side to the outside in the XY plan view. As a result, the resistance change film RE can function as a phase change film.

Figure 40A:
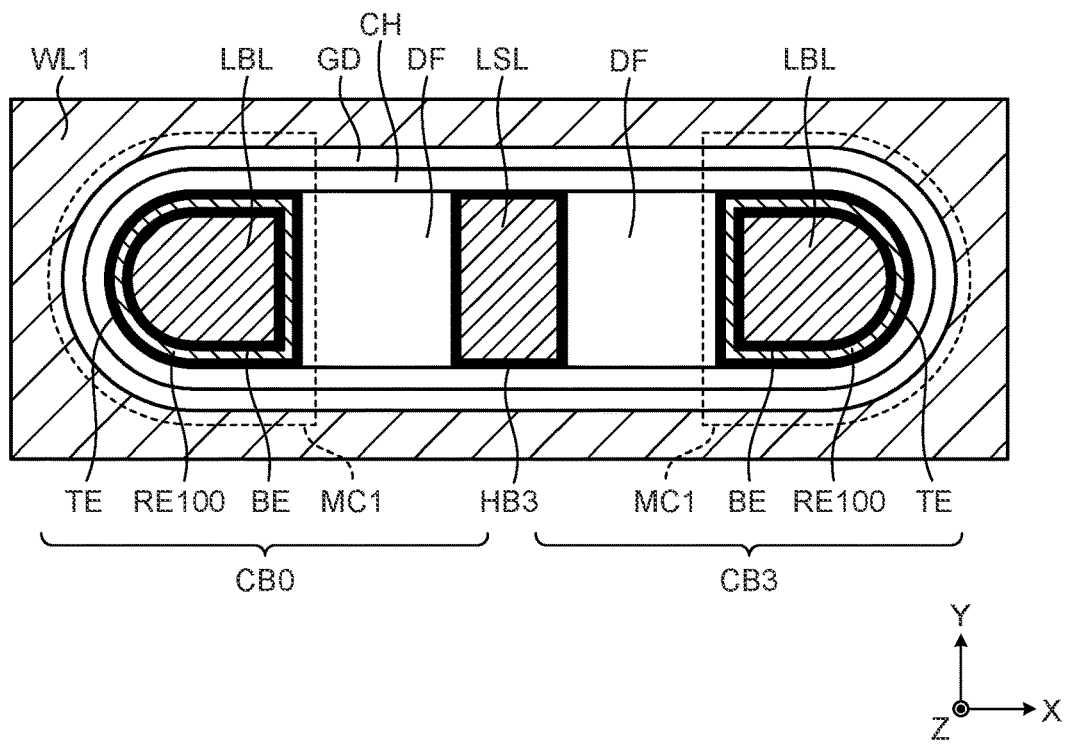
FIGS. 40A and 40B are planar cross-sectional views illustrating a configuration of a cell block in a 14th embodiment.

Alternatively, in each cell block CB, the material of the resistance change film may be a magnetic material as illustrated in FIG. 40A instead of the phase change material. FIG. 40A is a planar cross-sectional view illustrating a configuration of the cell block CB, and corresponds to an XY cross section taken along line G-G' in FIG. 27. For example, in the configuration of each cell block CB illustrated in FIG. 28, by replacing the resistance change film RE, the thermal barrier film HB1, and the thermal barrier film HB2 with a tunnel film RE100, a free layer TE, and a PIN layer BE, respectively, a structure in which the tunnel film RE100 is sandwiched between the free layer TE and the PIN layer BE can be realized as illustrated in FIG. 40A. The tunnel film RE100 is configured in a manner that a charge tunnel is possible between the free layer TE and the PIN layer BE at the time of magnetization, and is formed of, for example, MgO. Each of the free layer TE and the PIN layer BE is configured such that the magnetization direction is the Z direction, and is formed of, for example, CoFe. As a result, each memory cell MC can be configured as an MRAM memory cell. In addition, when information is recorded in each memory cell MC, generation of a diamagnetic field in the XY planar direction can be suppressed, and specific deterioration of the MRAM memory cell can be suppressed.

Figure 40B:
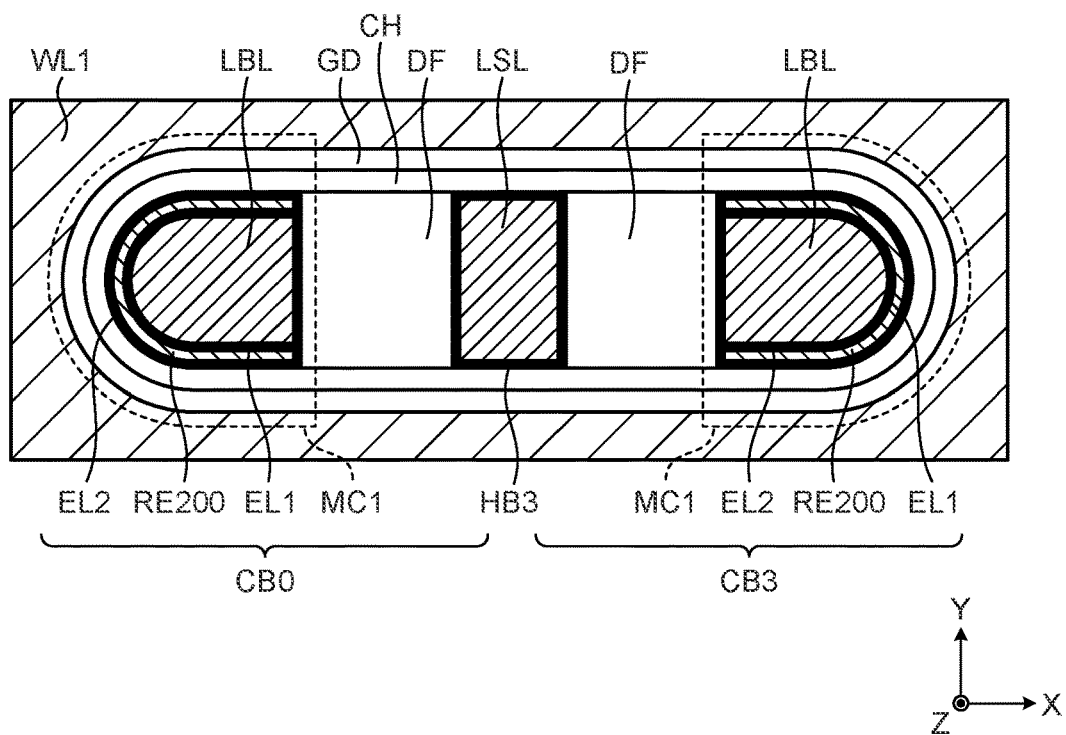

Alternatively, in each cell block CB, the resistance change film may be formed of a resistance change material (that is, a material of which resistance can be changed by an electric field) as illustrated in FIG. 40B instead of the phase change material (that is, a material of which resistance can be changed by crystallinity). FIG. 40B is a planar cross-sectional view illustrating a configuration of the cell block CB, and corresponds to an XY cross section taken along line H-H' in FIG. 29. For example, in the configuration of each cell block CB illustrated in FIG. 30, by replacing the resistance change film RE, the thermal barrier film HB1, and the thermal barrier film HB2 with a resistance change film RE200, an electrode layer EL1, and an electrode layer EL2, respectively, a structure in which the resistance change film is sandwiched between two electrode layers can be realized. The resistance change film RE200 is configured to enable transition of a resistance state according to the electric field between the electrode layer EL1 and the electrode layer EL2, and is formed of, for example, a metal oxide such as NiOx, WOx, TaOx, TiOx, HfOx, ZnOx, TiON, Ag—GeSe, Cu—GeSe, FeOx, GeOx, and STO. Each of the electrode layer EL1 and the electrode layer EL2 may be formed of a material containing TiN or TaN as a main component, or may be formed of a material containing $TiO_2$ doped with Pt, W, WN, or Nb as a main component. As a result, each memory cell MC1 can be configured as a ReRAM memory cell.

As described above, in the 14th embodiment, in the cell array 5 of the nonvolatile semiconductor memory device 1, since the switching is performed in the film forming direction of the resistance change film RE in each memory cell MC of each cell block CB, it is possible to form a film by overlapping the electrode of the moving atom source (Ag, Cu, W, etc.) of the switching in the film forming direction of the resistance change film RE, and it is possible to form a PIN layer or a free layer in the film forming direction of the tunnel film like the magnetic material memory. As described above, the range of materials that can be applied as the material of the resistance change film is greatly expanded.

15th Embodiment

Next, the nonvolatile semiconductor memory device 1 according to a 15th embodiment will be described. Hereinafter, portions different from those of the first embodiment and the 14th embodiment will be mainly described.

In the eighth, ninth, 12th, and 13th embodiments, a configuration in which the thermal barrier film HB1 is interposed between the resistance change film RE and the local bit line column LBL is exemplified, but in the 15th embodiment, a configuration in which the local bit line column LBL itself functions as the thermal barrier film is exemplified.

Figure 41:
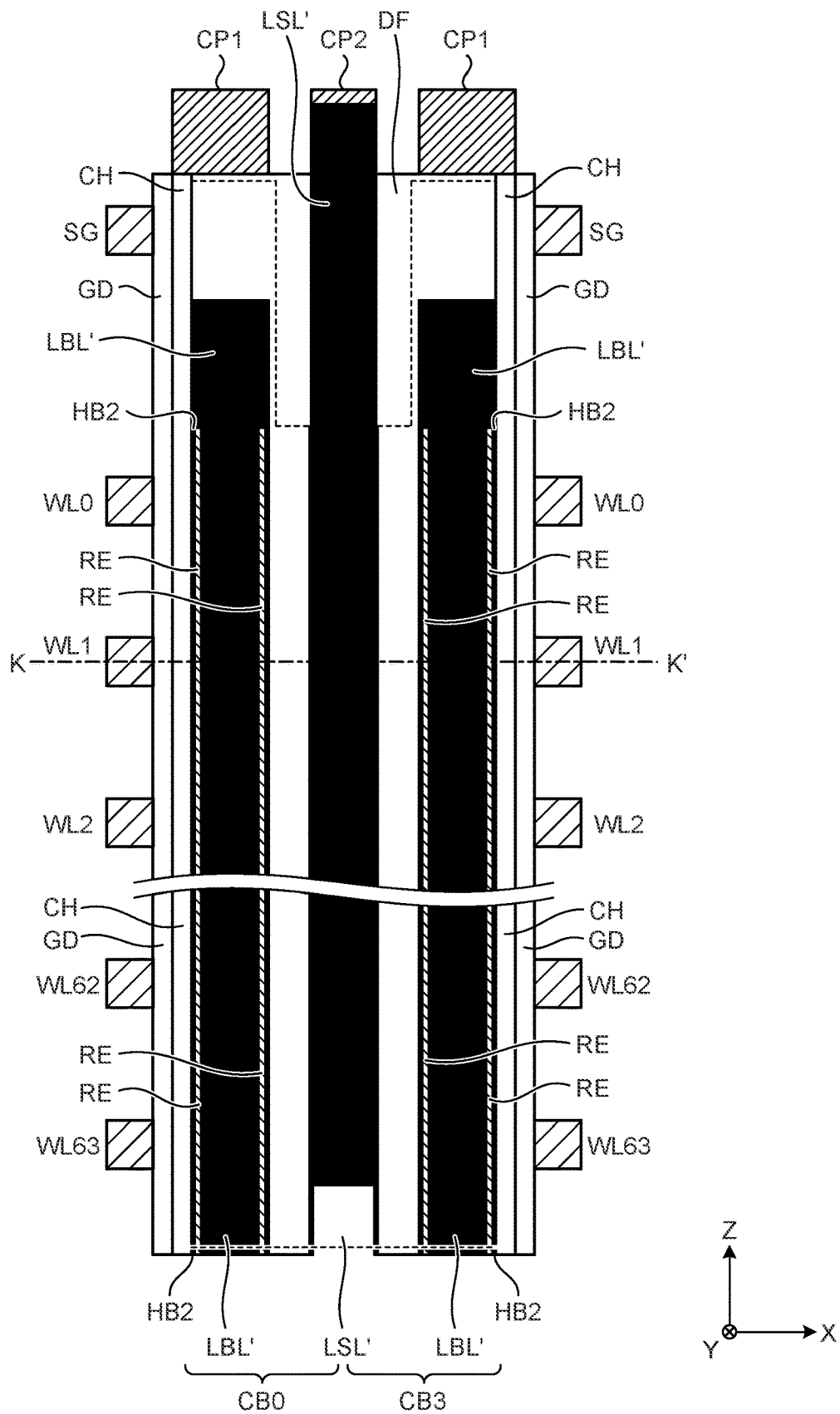
FIG. 41 is a vertical cross-sectional view illustrating a configuration of a cell block in a 15th embodiment.
Figure 42:
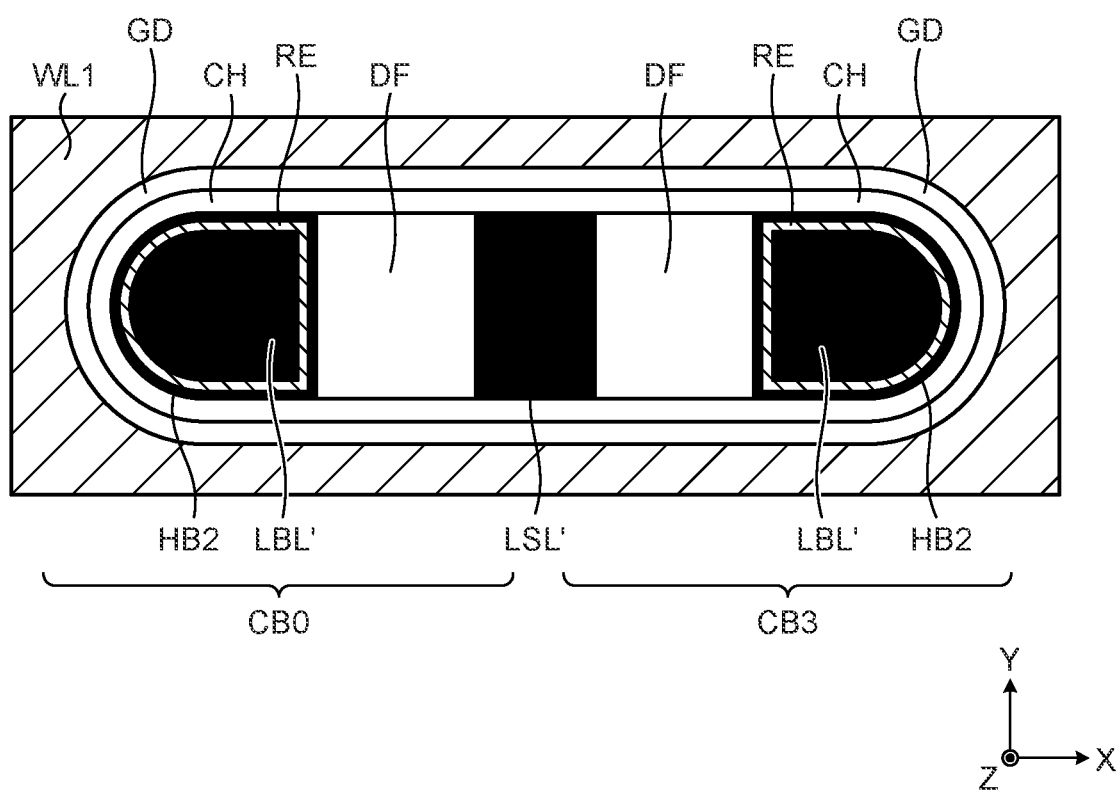
FIG. 42 is a planar cross-sectional view illustrating a configuration of the cell block in the 15th embodiment.

The cell block CB may be configured as illustrated in FIGS. 41 to 42. FIG. 41 is a vertical cross-sectional view illustrating a configuration of the cell block CB, and illustrates an XZ cross section passing through the central axis of each of the cell blocks CB0 and CB3. In FIG. 41, illustration of an insulating layer between the word line WL and the word line WL is omitted for simplification. FIG. 42 is a planar cross-sectional view illustrating a configuration of the cell block CB. FIG. 42 illustrates an XY cross section taken along line G-G' in FIG. 41.

In each cell block CB, the local bit line column LBL and the thermal barrier film HB1 (see FIG. 28) are replaced with a local bit line column LBL'. The local bit line column LBL' is formed of a conductive material having high thermal resistance, and is formed of, for example, a conductive material such as TiN, TaN, TiOx, C, or CN. The local bit line column LBL' functions as a thermal barrier film between the resistance change film RE and the bit line BL, and can suppress heat leakage from the resistance change film RE while allowing a current to pass between the resistance change film RE and the bit line BL.

In each cell block CB, the local source line column LSL and the thermal barrier film HB3 (see FIG. 28) are replaced with a local source line column LSL'. The local source line column LSL' is formed of a conductive material having high thermal resistance, and is formed of, for example, a conductive material such as TiN, TaN, TiOx, C, or CN. The local source line column LSL' functions as a thermal barrier film between the resistance change film RE and the semiconductor film CH, and can suppress heat leakage from the resistance change film RE while allowing a current to pass between the resistance change film RE and the semiconductor film CH.

Note that the point that the thermal barrier film HB2 is interposed between the resistance change film RE and the semiconductor film CH is the same as in the eighth, ninth, 12th, and 13th embodiments.

With the configuration illustrated in FIGS. 41 to 42, since the thermal resistances of the local bit line column LBL' and the local source line column LSL' increase, it is possible to suppress transmission of the heat generated in the resistance change film RE of the select memory cell MC to the resistance change film RE of the select memory cell MC→the semiconductor film CH→the local source line column LSL'→the resistance change film RE of an adjacent memory cell MC. In addition, it is possible to suppress transmission of the heat generated by the resistance change film RE of the select memory cell MC to the resistance change film RE of the select memory cell MC→the local bit line column LBL'→the resistance change film RE of the adjacent memory cell MC. As a result, it possible to suppress heat leakage from the select memory cell MC to the adjacent memory cell MC.

As described above, in the 15th embodiment, in each cell block CB, the local bit line column LBL' and the local source line column LSL' are each formed of a conductive material having high thermal resistance. As a result, leakage of heat from the select memory cell MC to the adjacent memory cell MC can be suppressed, in a manner that erroneous writing to the adjacent memory cell MC can be suppressed when information is written to the select memory cell MC.

16th Embodiment

Next, the nonvolatile semiconductor memory device 1 according to a 16th embodiment will be described. Hereinafter, portions different from those of the first embodiment and the 15th embodiment will be mainly described.

In the eighth, ninth, 12th, 13th, and 15th embodiments, the temperature rise of the variable resistance change element RE of the adjacent memory cell MC is suppressed by suppressing the leakage of heat from the resistance change element RE of the select memory cell MC.

On the other hand, in the 16th embodiment, the temperature rise of the variable resistance change element RE of the adjacent memory cell MC is suppressed by securing a heat dissipation path from the resistance change element RE of the select memory cell MC.

Figure 43:
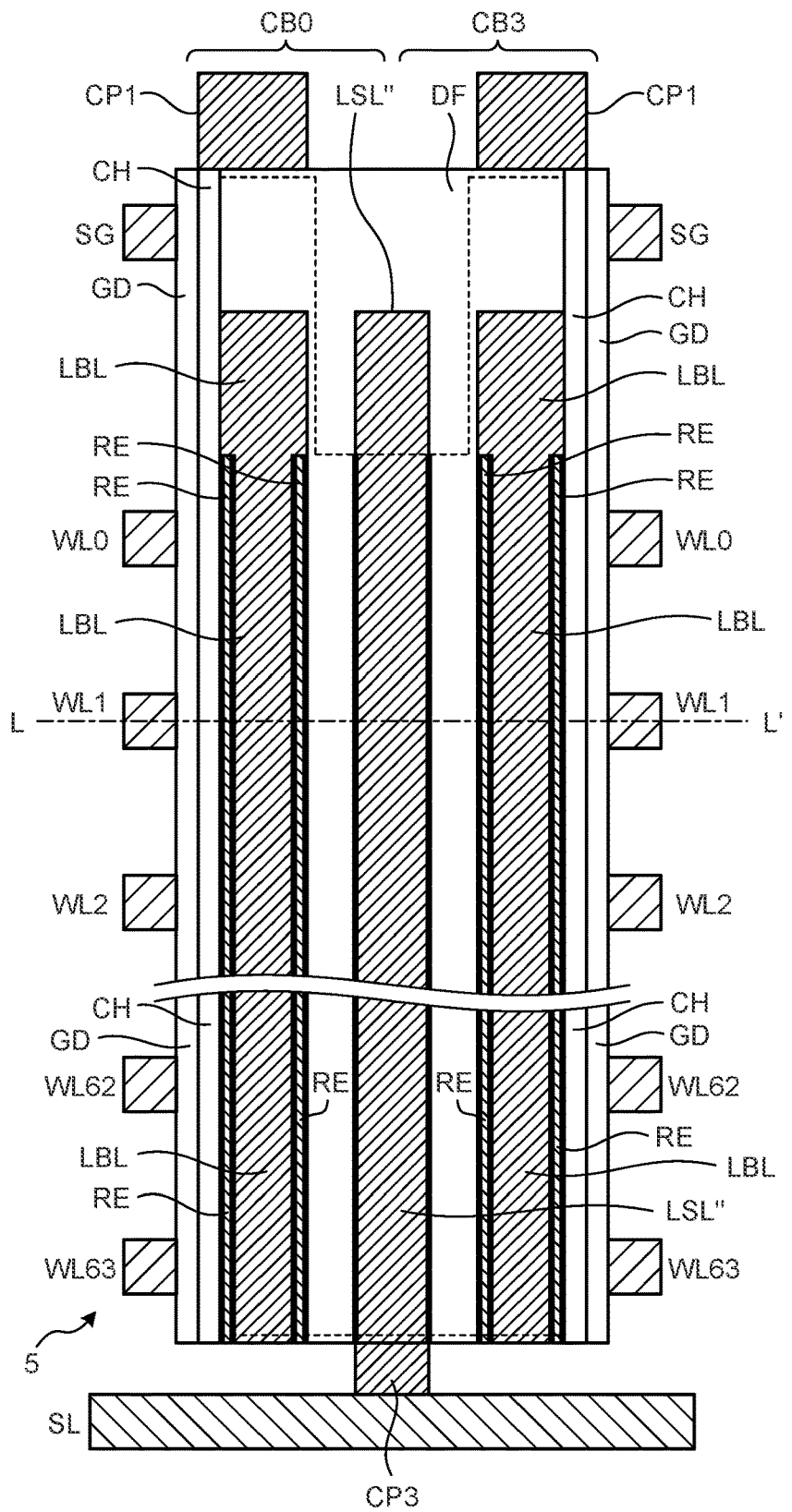
FIG. 43 is a vertical cross-sectional view illustrating a schematic configuration of a cell array in a 16th embodiment.

Specifically, the cell array 5 may be configured as illustrated in FIG. 43. FIG. 43 is a vertical cross-sectional view illustrating a schematic configuration of the cell array 5, and illustrates an XZ cross section passing through the central axis of each of the cell blocks CB0 and CB3. In FIG. 43, illustration of an insulating layer between the word line WL and the word line WL is omitted for simplification.

In the cell array 5 illustrated in FIG. 43, the source line SL is disposed on the −Z side instead of the +Z side (see FIG. 3) with respect to the columnar structures of the cell block CB0 and the cell block CB3. The source line SL may be formed of a conductive film extending in a plate shape in the XY direction. The source line SL is common to a set of the cell blocks CB0 and CB3, but may be further common to a set of a plurality of other cell blocks.

In each cell block CB, the local source line column LSL (see FIG. 5) is replaced with a local source line column LSL". The local source line column LSL" is formed of a conductive material (for example, a metal such as tungsten) having high thermal conductivity. The +Z side end of the local source line column LSL" may be located at the Z position between the cell block select line SG and the word line WL0 closest to the +Z side. The −Z side end of the local source line column LSL" is electrically connected to the source line SL via a contact plug CP3.

Each of the local source line column LSL", the contact plug CP3, and the source line SL may be formed of a conductive material (for example, a metal such as tungsten) having high thermal conductivity. The source line SL may have an XY area larger than that of the cell array 5 in order to secure a heat dissipation area.

Figure 44:
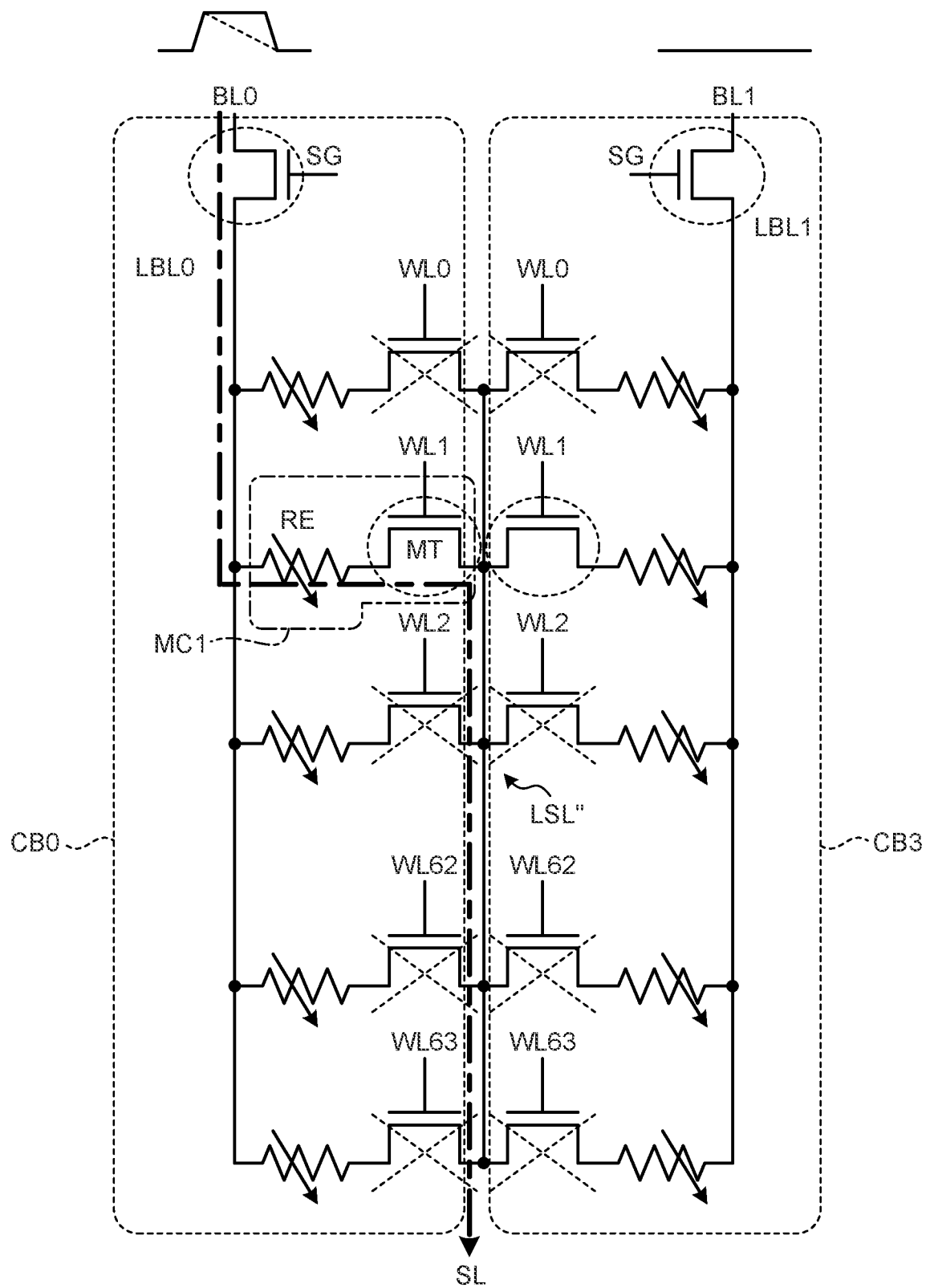
FIG. 44 is a circuit diagram illustrating an operation of the cell block in the 16th embodiment.

An equivalent circuit diagram of a set of the cell block CB0 and the cell block CB3 is as illustrated in FIG. 44. FIG. 44 is a circuit diagram illustrating a configuration of the cell block CB.

As illustrated in the equivalent circuit diagram of FIG. 44, when the memory cell MC1 of the cell block CB0 is selected, a cell current flows in a current path of the bit line BL0→the local bit line LBL0→the resistance change element RE of the memory cell MC1→the cell transistor MT of the memory cell MC1→the local source line LSL→the source line SL. At this time, the heat generated in the resistance change element (resistance change film) RE is dissipated through the heat dissipation path of the resistance change film RE→the local bit line column LBL→the semiconductor film CH and the insulating film DF→the contact plug CP1→the bit line BL, and the heat dissipation path of the resistance change film RE→the semiconductor film CH and the insulating film DF→the local source line column LSL"→the contact plug CP3→the source line SL. That is, since heat dissipation is performed on both the +Z side and the −Z side with respect to the arrangement of the plurality of cell blocks CB0 to CB (n−1), heat generated in the resistance change element RE of a select memory MC may be efficiently dissipated.

As described above, in the 16th embodiment, in the cell array 5 of the nonvolatile semiconductor memory device 1, the source line SL is disposed on the −Z side of each cell block CB, and the local source line column LSL" of each cell block CB is formed of a conductive material having high thermal conductivity. As a result, the heat dissipation path from the select memory cell MC can be secured on both the +Z side and the −Z side, and the heat of the select memory cell MC can be efficiently dissipated. As a result, since the temperature rise of the adjacent memory cell MC can be suppressed, in a manner that erroneous writing to the adjacent memory cell MC can be suppressed when information is written to the select memory cell MC.

17th Embodiment

Next, the nonvolatile semiconductor memory device 1 according to a 17th embodiment will be described. Hereinafter, portions different from those of the first embodiment and the 16th embodiment will be mainly described.

In the 16th embodiment, a configuration in which heat is dissipated on both the +Z side and the −Z side with respect to the arrangement of the plurality of cell blocks CB is exemplified, but in the 17th embodiment, a configuration in which heat is dissipated on both the +Y side and the −Y side with respect to the arrangement of the plurality of cell blocks CB is further exemplified.

Figure 45:
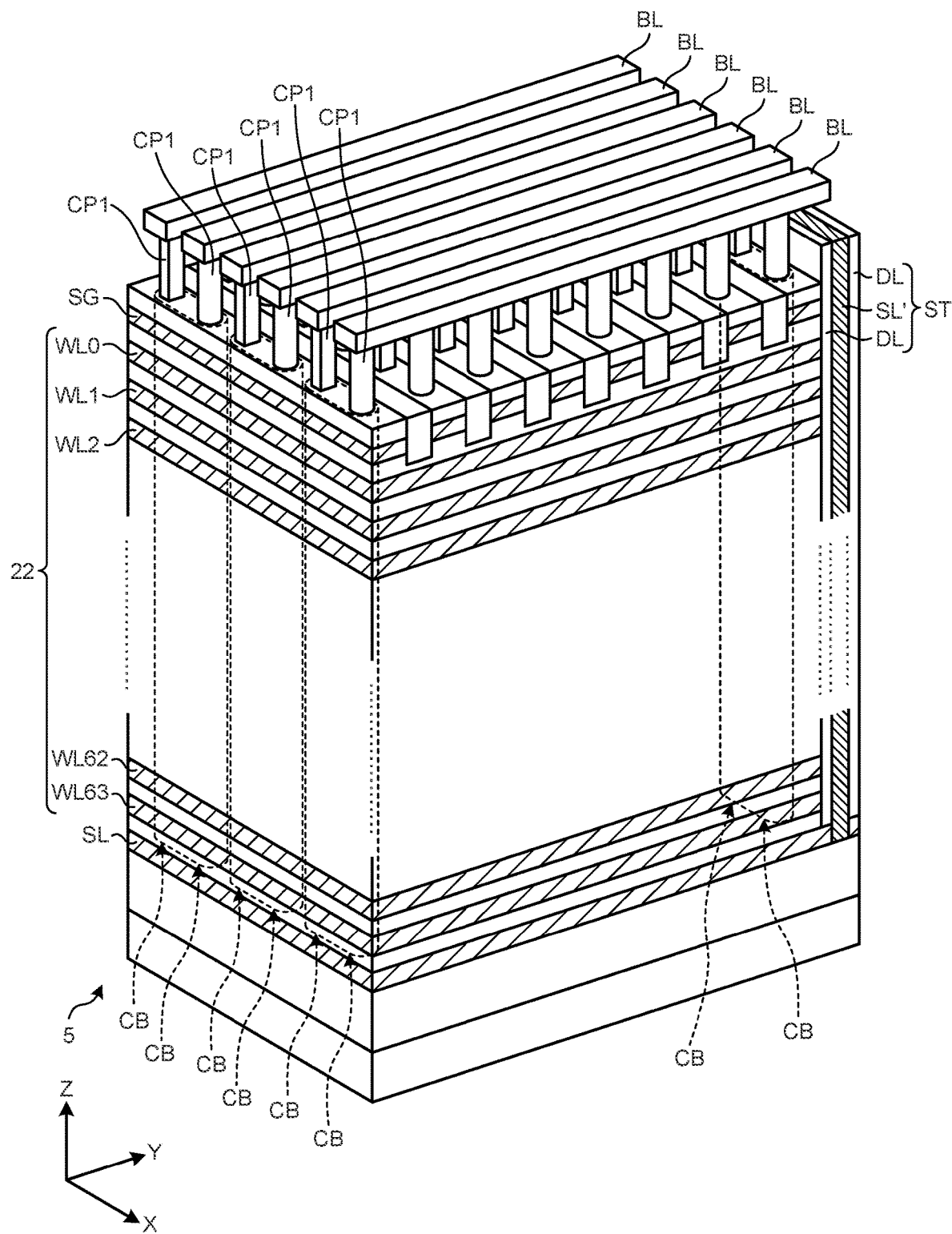
FIG. 45 is a perspective view illustrating a configuration of a cell array in a 17th embodiment.
Figure 46:
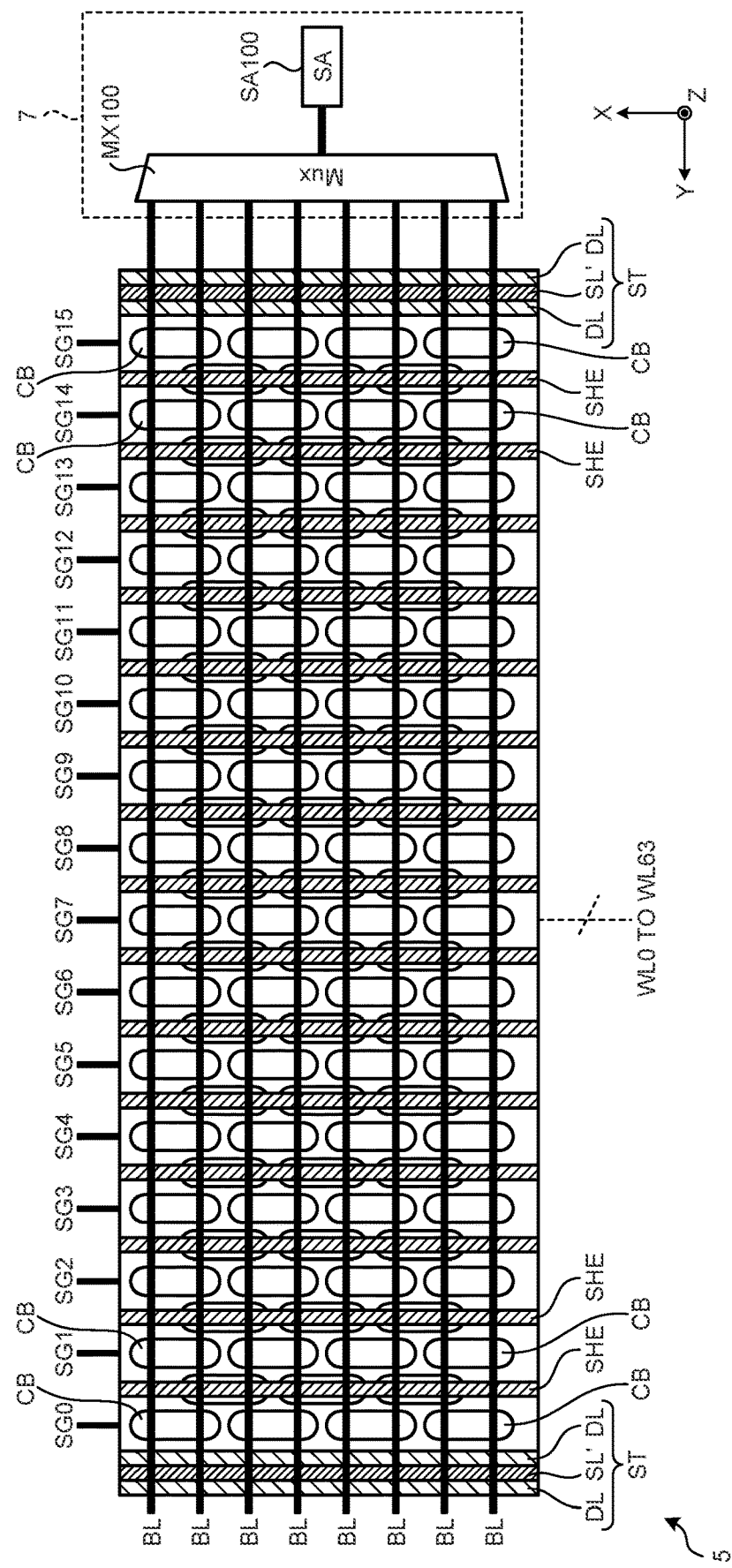
FIG. 46 is a plan view illustrating a configuration of the cell array in the 17th embodiment.

Specifically, the cell array 5 may be configured as illustrated in FIGS. 45 to 46. FIG. 45 is a perspective view illustrating a configuration of the cell array 5. FIG. 46 is a plan view illustrating a configuration of the cell array 5.

As illustrated in FIGS. 45 to 46, the separation portion ST includes two insulating portions DL having a flat plate shape in the XZ direction and an electrode portion SL' sandwiched between the two insulating portions DL and having a flat plate shape in the XZ direction. The electrode portion SL' is connected to the flat plate shape source line SL in the XY direction. The point that the −Z side end of the local source line column LSL" of each cell block CB is connected to the source line SL via the contact plug CP3 is the same as that in the 16th embodiment. In addition, the separation portion ST is similar to that of the first embodiment in that it electrically separates the stacked body 22 from other stacked bodies.

In the structure illustrated in FIGS. 45 to 46, when the cell current of the select memory cell MC flows, the heat generated in the resistance change element (resistance change film) RE of the select memory cell MC is dissipated through the heat dissipation path of the resistance change film RE→the local bit line column LBL→the semiconductor film CH and the insulating film DF→the contact plug CP1→the bit line BL, and the heat dissipation path of the resistance change film RE→the semiconductor film CH and the insulating film DF→the local source line column LSL"→the contact plug CP3→the source line SL→the electrode portion SL'. That is, since heat dissipation is performed on the +Z side, the −Z side, the +Y side, and the −Y side with respect to the arrangement of the plurality of cell blocks CB, heat generated in the resistance change element RE of the select memory MC may further be efficiently dissipated.

As described above, in the 17th embodiment, in the cell array 5 of the nonvolatile semiconductor memory device 1, heat is dissipated on the +Z side, the −Z side, the +Y side, and the −Y side with respect to the arrangement of the plurality of cell blocks CB, in a manner that heat generated in the resistance change element RE of the select memory MC may be dissipated more efficiently. As a result, since the temperature rise of the adjacent memory cell MC with respect to the select memory cell MC can further be suppressed, in a manner that erroneous writing to the adjacent memory cell MC can further be suppressed when information is written to the select memory cell MC.

18th Embodiment

Next, the nonvolatile semiconductor memory device 1 according to an 18th embodiment will be described. Hereinafter, portions different from those of the first embodiment and the 17th embodiments will be mainly described.

In the eighth, ninth, 12th, 13th, and 15th embodiments, heat generation efficiency in the select memory cell MC is improved by suppressing the leakage of heat from the resistance change element RE of the select memory cell MC. For example, in each cell block CB, in order to generate heat and perform switching only by the electric resistance of the resistance change film RE itself by the current flowing in the direction from the local bit line column LBL to the semiconductor film CH, that is, in the film forming direction of the resistance change film RE, there is a possibility that the selection range of the material of the resistance change film RE is limited to the high resistance material (for example, a chalcogenide-based material containing impurities).

On the other hand, in the 18th embodiment, an object is to improve the heat generation efficiency in the select memory cell MC while securing the selection range of the material of the resistance change film RE by adding a heat generation film to the select memory cell MC.

Figure 47:
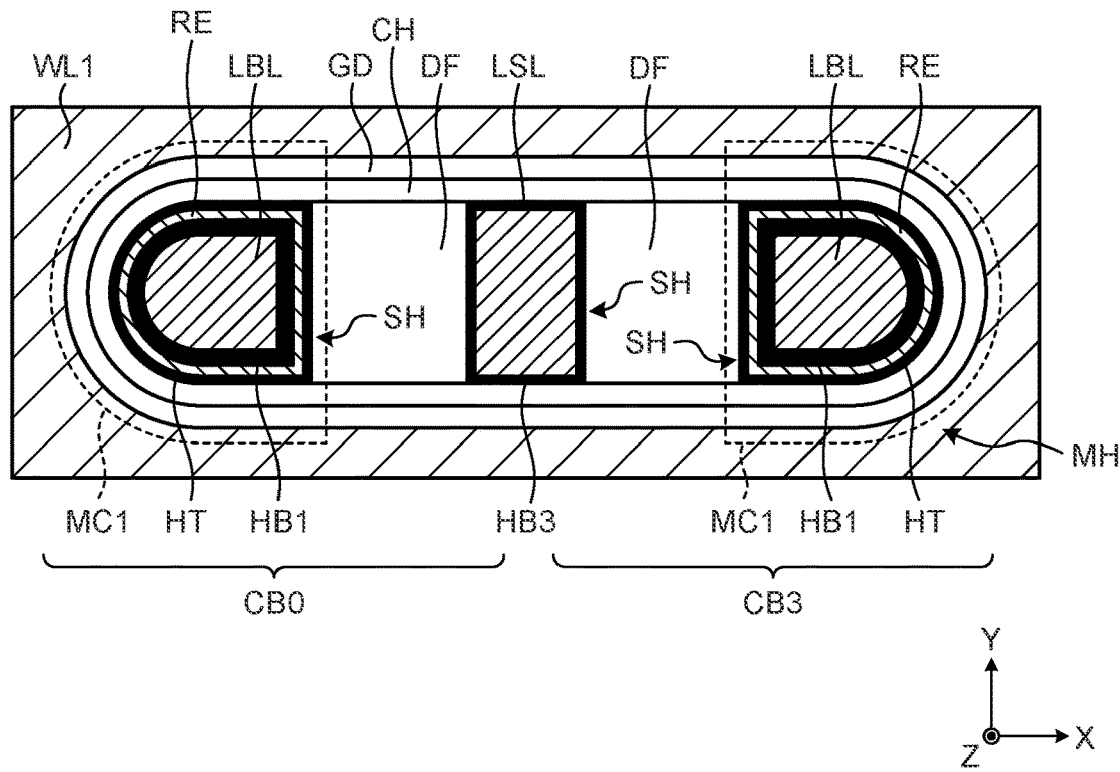
FIG. 47 is a planar cross-sectional view illustrating a configuration of a cell block in an 18th embodiment.

Specifically, the cell block CB may be configured as illustrated in FIG. 47. FIG. 47 is a planar cross-sectional view illustrating a configuration of the cell block CB. FIG. 47 illustrates an XY cross section taken along line G-G' in FIG. 27. For example, in the configuration of each cell block CB illustrated in FIG. 28, by replacing the thermal barrier film HB2 with a heat generation film HT, as illustrated in FIG. 47, the heat generation film HT is disposed between the resistance change film RE and the semiconductor film CH. The heat generation film HT is formed of a conductive material having a relatively high electric resistance, and may be formed of a semiconductor containing impurities. As a result, since the heat generation film HT functions as a heater in the vicinity of the resistance change film RE, heat generation of the resistance change film RE can be assisted, and the heat generation efficiency in the select memory cell MC can be improved.

Figure 48:
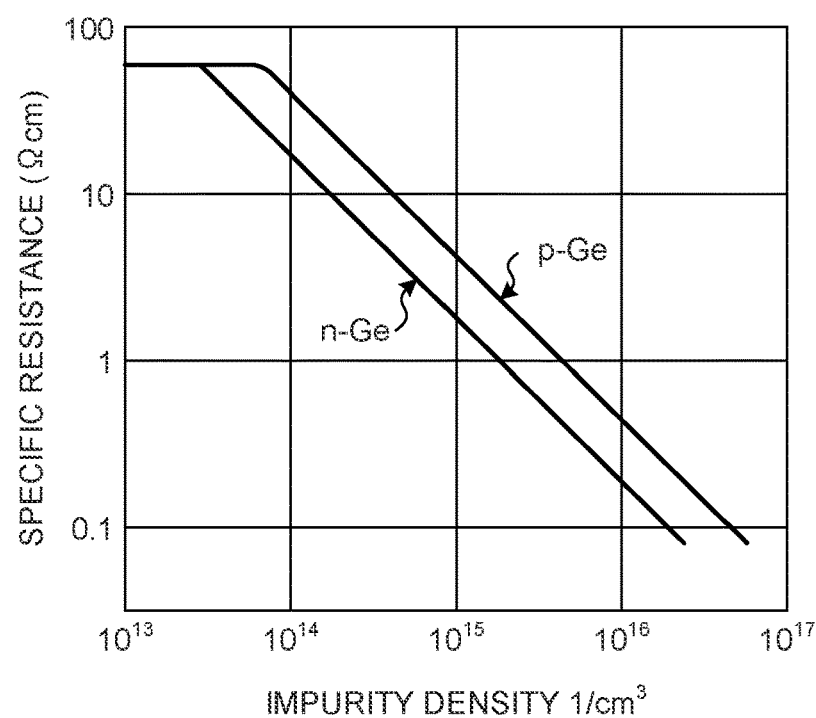
FIG. 48 is a diagram illustrating a relationship between impurity concentration of germanium and specific resistance in the 18th embodiment.

As a material of the heat generation film HT, germanium containing indium as an impurity may be used. As illustrated in FIG. 48, germanium containing indium can be easily increased in resistance by adjusting the concentration and conductivity type (p-type or n-type) of indium as an impurity. FIG. 48 is a diagram illustrating a relationship between impurity concentration of germanium and specific resistance. For example, the specific resistance of the heat generation film HT is desirably set to about 0.5 to 4 Ωcm by adjusting the impurity concentration of p-type indium to about $1\times10^{15}$ to $1\times10^{16}$ cm$^{-3}$. In addition, the material of the heat generation film HT may be tellurium containing indium as an impurity or a group III-V compound.

Note that, as the material of the thermal barrier film HB1, for example, a conductive material such as TiN, TaN, TiOx, C, and CN may be used, but by using a conductive material such as C—W and C—WN, the thermal resistance can be further increased, and the heat generation efficiency can be improved from the viewpoint of suppressing heat leakage to the side of the local bit line column LBL.

As described above, in the 18th embodiment, in each cell block CB, the thermal barrier film HB1 is interposed between the resistance change film RE and the local bit line column LBL, and the heat generation film HT is interposed between the resistance change film RE and the semiconductor film CH. As a result, the heat generation film HT can assist heat generation when the resistance change film RE generates heat. As a result, the heat generation efficiency in the select memory cell MC can be improved without increasing the resistance of the resistance change film RE. That is, the heat generation efficiency in the select memory cell MC can be improved while securing the selection range of the material of the resistance change film RE.

The heat generation film HT may be disposed between the resistance change film RE and the local bit line column LBL instead of between the resistance change film RE and the semiconductor film CH. For example, in the configuration of each cell block CB illustrated in FIG. 28, by replacing the thermal barrier film HB1 with the heat generation film HT, the heat generation film HT is disposed between the resistance change film RE and the local bit line column LBL. Also with this configuration, since the heat generation film HT functions as a heater in the vicinity of the resistance change film RE, heat generation of the resistance change film RE can be assisted, and the heat generation efficiency in the select memory cell MC can be improved.

19th Embodiment

Next, the nonvolatile semiconductor memory device 1 according to a 19th embodiment will be described. Hereinafter, portions different from those of the first embodiment and the 18th embodiment will be mainly described.

In the seventh and ninth embodiments, the resistance change film of each cell block CB is divided into a plurality of resistance change films to electrically separate the current paths between the memory cells adjacent in the Z direction. In this configuration, due to thermal interference or the like from the upper and lower memory cells MC of the select memory cell MC, a current (bypass leakage current) may flow from the set low resistance regions in the resistance change films of the upper and lower memory cells MC via the channel of the select cell transistor MT. When the bypass leakage current flows, there is a possibility that the resistance state of the resistance change element of the select memory cell is erroneously determined during the read operation.

On the other hand, in the 19th embodiment, the semiconductor film of each cell block CB is divided into a plurality of semiconductor films to electrically separate the current paths between the memory cells adjacent in the Z direction. That is, the channels in the regions equal to or larger than the reset region are prevented from being turned on.

Figure 49:
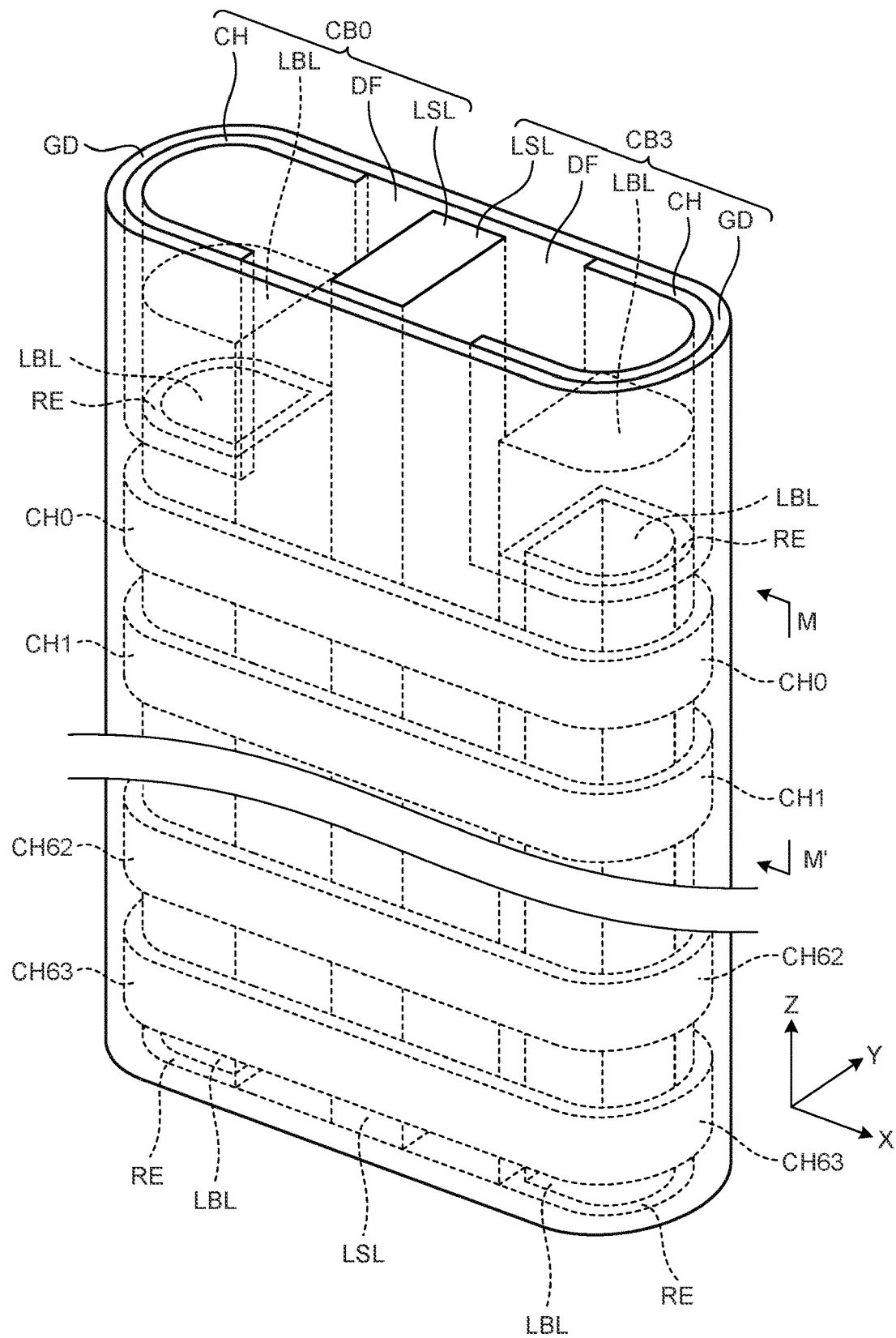
FIG. 49 is a perspective view illustrating a configuration of a cell block in a 20th embodiment.
Figure 50A:
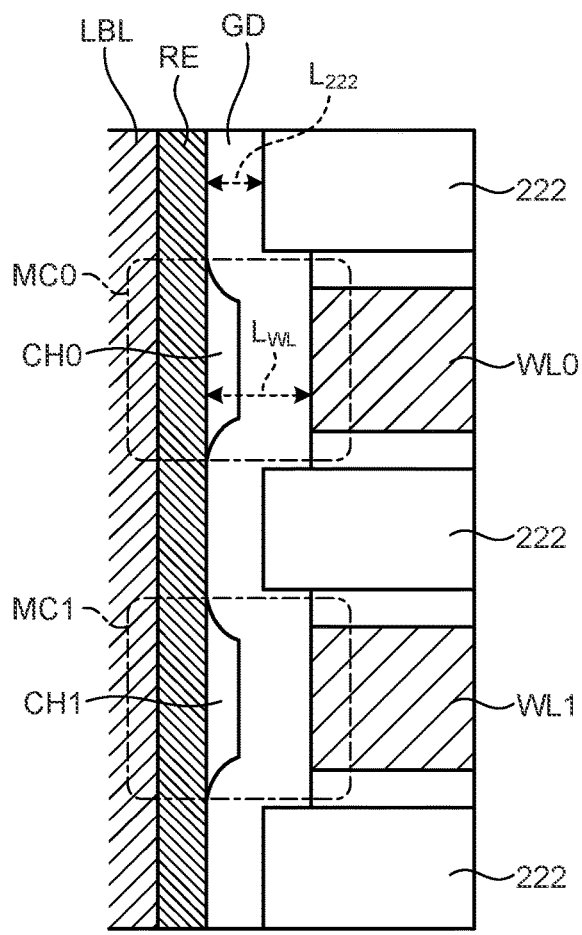
FIGS. 50A and 50B are enlarged planar cross-sectional views illustrating a configuration of the cell block in a 20th embodiment.
Figure 50B:
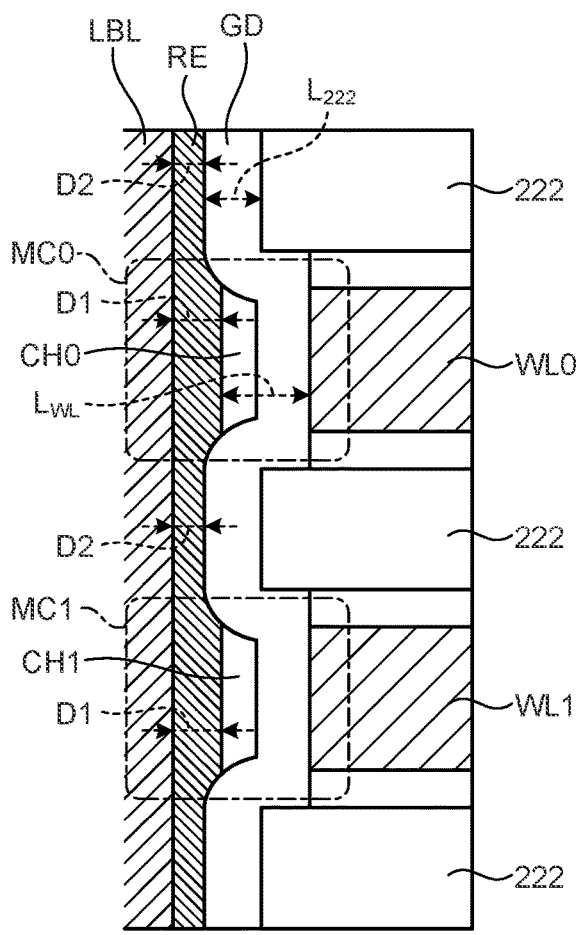

Specifically, the cell block CB may be configured as illustrated in FIGS. 49, 50A, and 50B. FIG. 49 is a perspective view illustrating a configuration of the cell block CB, and exemplifies a configuration of the cell blocks CB0 and CB3. Each of FIGS. 50A and 50B is an enlarged vertical cross-sectional view illustrating a configuration of the cell block CB, and illustrates an XZ cross section taken along line M-M' in FIG. 49.

In each cell block CB, the semiconductor film is divided into a plurality of semiconductor films CH0 to CH63 corresponding to the plurality of word lines WL0 to WL63. The plurality of semiconductor films CH0 to CH63 is stacked apart from each other in the Z direction. Each of the semiconductor films CH0 to CH63 has a lateral 0 shape with the X direction as a longitudinal direction in the XY plan view.

At this time, the resistance change film RE may be formed in a manner that the XY position of the outer surface is uniform along the Z direction as illustrated in FIG. 50A, or may be formed in a manner that the XY position of the outer surface selectively protrudes toward the side of the word line WL at the Z position between the word lines WL as illustrated in FIG. 50B.

In the configurations illustrated in FIGS. 50A and 50B, an XY direction distance $L_{WL}$ from the resistance change film RE of the end surface of each word line WL may be longer than an XY direction distance $L_{222}$ from the resistance change film RE of the end surface of the insulating layer 222. As a result, the plurality of semiconductor films CH0 to CH63 may be reliably divided in the Z direction. For example, the region for resetting the resistance change film RE is set to a region wider than the semiconductor film CH in the Z direction. As a result, bypass leakage via the semiconductor film CH can be suppressed. In addition, since the semiconductor film having a relatively high thermal conductivity is separated between the memory cells MC adjacent in the Z direction, thermal disturbance between the memory cells MC adjacent in the Z direction can be reduced.

In addition, in the configuration illustrated in FIG. 50B, in the resistance change film RE, a film thickness D2 at the Z position between the word lines WL may be thinner than a film thickness D1 at the Z position of the word line WL. As a result, a portion between the memory cells MC adjacent in the Z direction in the resistance change film RE can be increased in resistance, and bypass leakage through the resistance change film RE can be suppressed.

In the configuration illustrated in FIGS. 50A and 50B, the gate insulating film GD may be formed of a High-K insulator such as hafnium oxide in order to gain the on-current of the cell transistor MT of each memory cell MC.

As described above, in the 19th embodiment, in each cell block CB, the plurality of semiconductor films CH0 to CH63 is divided in the Z direction corresponding to the plurality of word lines WL0 to WL63. As a result, since the semiconductor films CH0 to CH63 of the memory cells MC may be electrically separated in the Z direction, it is possible to suppress the flow of the disturbance current between the memory cells MC adjacent in the Z direction, and it is possible to improve the writing budget and the reading budget for the resistance change element RE of the memory cells MC.

20th Embodiment

Next, the nonvolatile semiconductor memory device 1 according to a 20th embodiment will be described. Hereinafter, portions different from those of the first embodiment and the 19th embodiment will be mainly described.

Figure 51:
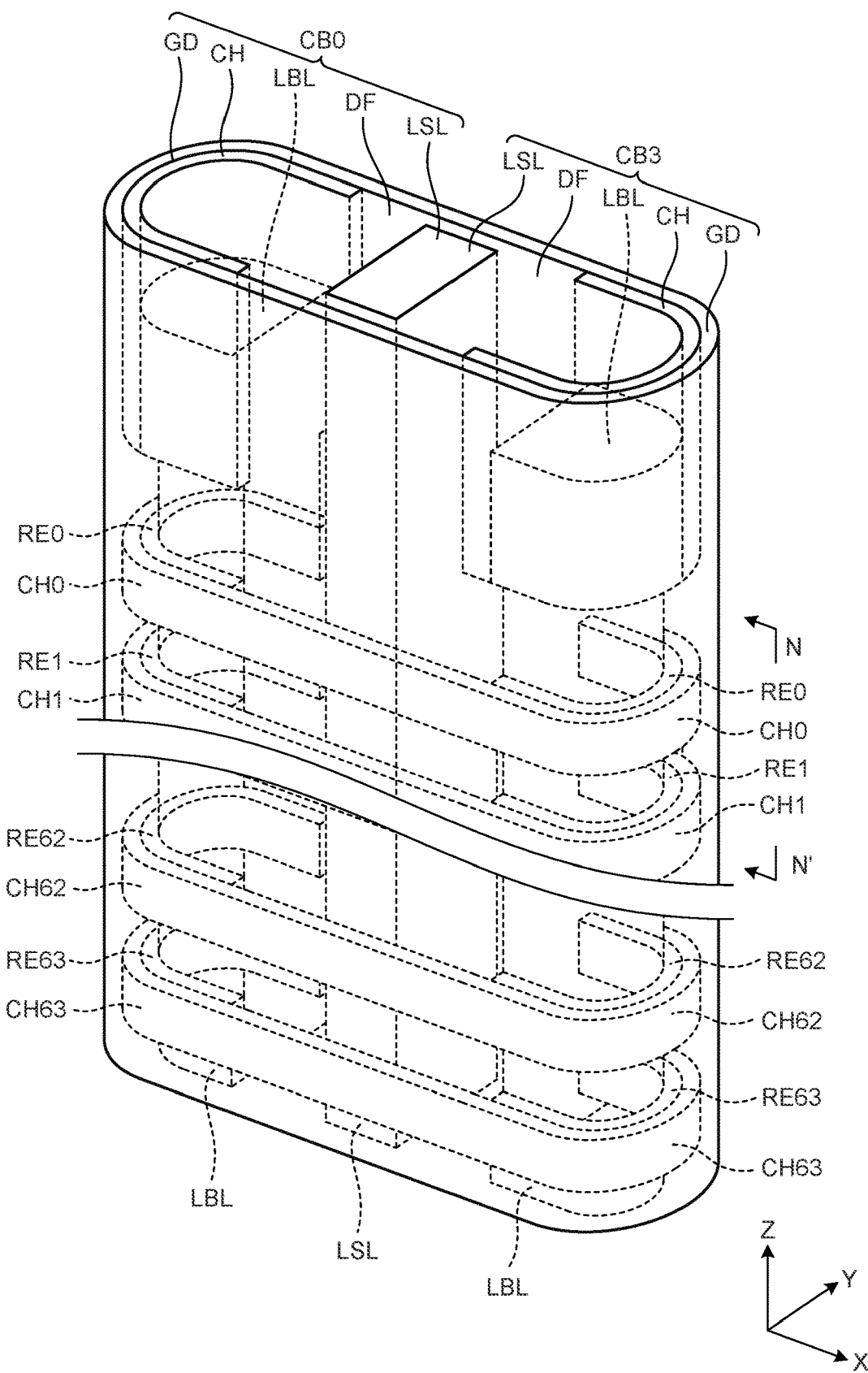
FIG. 51 is a perspective view illustrating a configuration of a cell block in a 21st embodiment.
Figure 52:
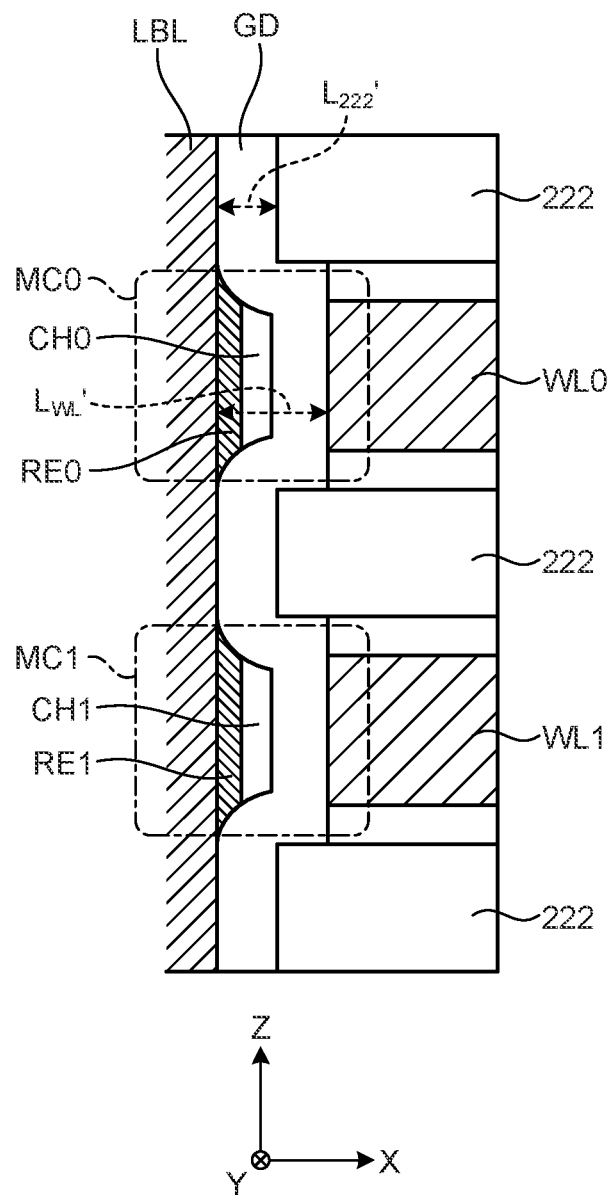
FIG. 52 is an enlarged planar cross-sectional view illustrating a configuration of the cell block in the 21st embodiment.

In a 20th embodiment, the seventh and ninth embodiments and the 19th embodiment are combined. In the 20th embodiment, the cell block CB may be configured as illustrated in FIGS. 51 and 52. FIG. 51 is a perspective view illustrating a configuration of the cell block CB, and exemplifies a configuration of the cell blocks CB0 and CB3. FIG. 52 is an enlarged vertical cross-sectional view illustrating a configuration of the cell block CB, and illustrates an XZ cross section taken along line N-N' in FIG. 51.

In each cell block CB, the semiconductor film is divided into a plurality of semiconductor films CH0 to CH63 corresponding to the plurality of word lines WL0 to WL63. The plurality of semiconductor films CH0 to CH63 is stacked apart from each other in the Z direction. Each of the semiconductor films CH0 to CH63 has a lateral 0 shape with the X direction as a longitudinal direction in the XY plan view.

At the same time, in each cell block CB, the resistance change film is divided into the plurality of resistance change films RE0 to RE63 corresponding to the plurality of word lines WL0 to WL63. The plurality of resistance change films RE0 to RE63 is stacked apart from each other in the Z direction. Each of the resistance change films RE0 to RE63 has a lateral U-shape in which a side facing the local source line column LSL is opened in the XY plan view.

In the configurations illustrated in FIGS. 51 and 52, an XY direction distance $L_{WL}'$ from the local bit line column LBL of the end surface of each word line WL may be longer than an XY direction distance $L_{222}'$ from the local bit line column LBL of the end surface of the insulating layer 222. As a result, the plurality of semiconductor films CH0 to CH63 may be reliably divided in the Z direction. For example, the region for resetting the resistance change film RE is set to a region wider than the semiconductor film CH in the Z direction. As a result, current paths between memory cells adjacent in the Z direction can be electrically separated, in a manner that bypass leakage via the semiconductor film CH can be suppressed. In addition, since the semiconductor film having a relatively high thermal conductivity is separated between the memory cells MC adjacent in the Z direction, thermal disturbance between the memory cells MC adjacent in the Z direction can be reduced.

In the configuration illustrated in FIGS. 51 and 52, the plurality of resistance change films RE0 to RE63 is divided in the Z direction. As a result, current paths between memory cells adjacent in the Z direction can be electrically separated, in a manner that bypass leakage via the resistance change film can be suppressed. In addition, since the resistance change film is separated between the memory cells MC adjacent in the Z direction, thermal disturbance between the memory cells MC adjacent in the Z direction can further be reduced.

In the configuration illustrated in FIG. 52, the gate insulating film GD may be formed of a High-K insulator such as hafnium oxide in order to gain the on-current of the cell transistor MT of each memory cell MC.

As described above, in the 20th embodiment, in each cell block CB, the plurality of semiconductor films CH0 to CH63 is divided in the Z direction corresponding to the plurality of word lines WL0 to WL63. As a result, since the semiconductor films CH0 to CH63 of the memory cells MC may be electrically separated in the Z direction, it is possible to suppress the flow of the disturbance current between the memory cells MC adjacent in the Z direction, and it is possible to improve the writing budget and the reading budget for the resistance change element RE of the memory cells MC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
 a plurality of word lines, each word line extending in a first direction and a second direction, the word lines being stacked in a third direction, and the first to third directions crossing one another;
 a bit line extending in the first direction;
 a source line extending in the first direction;
 a cell array including a plurality of cell blocks arranged in the first direction, each cell block being connected to the bit line and the source line,
 wherein:
 each cell block includes:
  a select transistor;
  a local bit line connected to the bit line via the select transistor, the local bit line extending in the third direction;
  a local source line connected to the source line and extending in the third direction; and
  a plurality of memory cells connected in parallel between the local source line and the local bit line, and
 each of the memory cells includes:
  a cell transistor having a gate connected to a corresponding one of the word lines and one end connected to one of the local bit line or the local source line; and
  a resistance change element connected between the other end of the cell transistor and the other one of the local bit line or the local source line.

2. The nonvolatile semiconductor memory device according to claim 1, wherein each cell block includes:
 a gate insulating film extending in the third direction and penetrating the word lines;
 a semiconductor film extending in the third direction, the semiconductor film being arranged on an inner side of the gate insulating film;
 the local bit line extending in the third direction, the local bit line being arranged on an inner side of the semiconductor film;
 the local source line extending in the third direction, the local source line being arranged on the inner side of the semiconductor film, and
 a resistance change film penetrating the word lines, the resistance change film being arranged on the inner side of the semiconductor film and on an outer side of the other one of the local bit line or the local source line.

3. The nonvolatile semiconductor memory device according to claim 1, wherein each cell block includes:
 a gate insulating film extending in the third direction and penetrating the word lines;
 a plurality of semiconductor films stacked apart in the third direction to face the word lines, respectively;
 the local bit line extending in the third direction, the local bit line being arranged on an inner side of the semiconductor films;
 the local source line extending in the third direction, the local source line being arranged on the inner side of the semiconductor films; and
 a resistance change film penetrating the word lines, the resistance change film being arranged on the inner side of the semiconductor films and on an outer side of the other one of the local bit line or the local source line.

4. The nonvolatile semiconductor memory device according to claim 1, wherein each cell block includes:
 a gate insulating film extending in the third direction and penetrating the word lines;
 a semiconductor film extending in the third direction;
 the local bit line extending in the third direction, the local bit line being arranged on an inner side of the semiconductor film;
 the local source line extending in the third direction, the local source line being arranged on the inner side of the semiconductor film; and
 a plurality of resistance change films stacked apart in the third direction to face the word lines, respectively, the resistance change films being arranged on the inner side of the semiconductor film and on an outer side of the other one of the local bit line or the local source line.

5. The nonvolatile semiconductor memory device according to claim 1, wherein each cell block includes:
 a gate insulating film extending in the third direction and penetrating the word lines;
 a plurality of semiconductor films stacked apart in the third direction to face the word lines, respectively;
 the local bit line extending in the third direction, the local bit line being arranged on an inner side of the semiconductor films;

the local source line extending in the third direction, the local source line being arranged on the inner side of the semiconductor films; and a plurality of resistance change films stacked apart in the third direction to face the word lines, respectively, the resistance change films being arranged on the inner side of the semiconductor films and on an outer side of the other one of the local bit line or the local source line.

6. The nonvolatile semiconductor memory device according to claim 2, wherein each cell block includes a plurality of the local bit lines.

7. The nonvolatile semiconductor memory device according to claim 2, wherein each cell block includes a plurality of the local bit lines and a plurality of the local source lines.

8. The nonvolatile semiconductor memory device according to claim 1, wherein each cell block further includes a second select transistor connected between the local source line and the source line.

9. The nonvolatile semiconductor memory device according to claim 1, wherein the resistance change element has one end connected to the local bit line and the other end connected to a drain of the cell transistor.

10. The nonvolatile semiconductor memory device according to claim 9, wherein each of the memory cells further includes a second resistance change element having one end connected to a source of the cell transistor and the other end connected to the local source line.

11. The nonvolatile semiconductor memory device according to claim 2, wherein each cell block includes a plurality of the resistance change films separated from each other in the third direction at positions corresponding to the word lines and functioning as resistance change elements of the memory cells, respectively.

12. The nonvolatile semiconductor memory device according to claim 2, wherein the resistance change film is formed of a phase change material, a superlattice film material, a magnetic material, or a resistance change material.

13. The nonvolatile semiconductor memory device according to claim 12, wherein:

the phase change material includes a chalcogenide-based material, the superlattice film material includes a stacked structure of GeTe and SbTe, the magnetic material is configured by sandwiching a tunnel film between a free layer and a PIN layer, and the resistance change material includes at least one selected from the group consisting of NiOx, WOx, TaOx, TiOx, HfOx, ZnOx, TION, Ag—GeSe, Cu—GeSe, FeOx, GeOx, and STO.

14. The nonvolatile semiconductor memory device according to claim 2, wherein each cell block further includes a thermal barrier film penetrating the word lines on the inner side of the semiconductor film and on an outer side of the local bit line.

15. The nonvolatile semiconductor memory device according to claim 4, wherein each cell block further includes a thermal barrier film penetrating the word lines, the thermal barrier film being arranged on the inner side of the semiconductor film and on an outer side of the local bit line.

16. The nonvolatile semiconductor memory device according to claim 14, wherein the thermal barrier film is interposed between the resistance change film and the local bit line.

17. The nonvolatile semiconductor memory device according to claim 14, wherein the thermal barrier film is interposed between the resistance change film and the semiconductor film.

18. The nonvolatile semiconductor memory device according to claim 14, wherein each cell block further includes a second thermal barrier film penetrating the word lines, the second thermal barrier film being arranged on the inner side of the semiconductor film and on an outer side of the local source line.

19. The nonvolatile semiconductor memory device according to claim 14, wherein the thermal barrier film includes at least one selected from the group consisting of TIN, TaN, TiOx, C, and CN.

20. The nonvolatile semiconductor memory device according to claim 2, wherein the local bit line includes at least one selected from the group consisting of TIN, TaN, TiOx, C, and CN.

* * * * *